US012740062B2

(12) United States Patent
Yoo et al.

(10) Patent No.: US 12,740,062 B2
(45) Date of Patent: Sep. 15, 2026

(54) NONVOLATILE MEMORY DEVICE AND ELECTRONIC SYSTEM INCLUDING THE SAME

(71) Applicant: Samsung Electronics Co., Ltd., Suwon-si (KR)

(72) Inventors: Byungik Yoo, Suwon-si (KR); Seungbeom Ko, Suwon-si (KR); Taemok Gwon, Suwon-si (KR); Changjin Son, Suwon-si (KR); Chadong Yeo, Suwon-si (KR); Seulji Lee, Suwon-si (KR); Seungmin Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 363 days.

(21) Appl. No.: 18/581,174

(22) Filed: Feb. 19, 2024

(65) Prior Publication Data

US 2024/0324206 A1 Sep. 26, 2024

(30) Foreign Application Priority Data

Mar. 24, 2023 (KR) ........................ 10-2023-0039156
May 2, 2023 (KR) ........................ 10-2023-0057288

(51) Int. Cl.

| | |
|---|---|
| ***H10B 43/27*** | (2023.01) |
| ***H10B 41/27*** | (2023.01) |
| ***H10B 41/41*** | (2023.01) |
| ***H10B 43/40*** | (2023.01) |

(52) U.S. Cl.

CPC ............ *H10B 43/27* (2023.02); *H10B 41/27* (2023.02); *H10B 41/41* (2023.02); *H10B 43/40* (2023.02)

(58) Field of Classification Search

None

See application file for complete search history.

(56) References Cited

U.S. PATENT DOCUMENTS

| | | | | |
|---|---|---|---|---|
| 10,978,475 | B2 * | 4/2021 | Baek | H10B 41/50 |
| 11,387,184 | B2 | 7/2022 | Kim et al. | |
| 11,527,544 | B2 | 12/2022 | Sung et al. | |
| 2022/0045045 | A1 * | 2/2022 | Lee | H10W 90/00 |
| 2022/0208696 | A1 * | 6/2022 | Lee | H10B 43/50 |

(Continued)

FOREIGN PATENT DOCUMENTS

KR 10-2023-0083767 A 6/2023

*Primary Examiner* — Bilkis Jahan

(74) *Attorney, Agent, or Firm* — Harness, Dickey & Pierce, P.L.C.

(57) ABSTRACT

A nonvolatile memory device includes a substrate including a memory cell region and a connection region; a mold structure including a plurality of gate electrodes and a plurality of mold insulating layers alternately stacked; a channel structure passing through the mold structure in the memory cell region; a first cell contact passing through the mold structure in the connection region, connected to a first gate electrode and electrically disconnected from a second gate electrode; a plurality of support structures surrounding the first cell contact planarly in the connection region and extending through the mold structure; and a dam structure located between the first cell contact and the second gate electrode in the connection region and apart from the first cell contact with an insulating ring therebetween.

20 Claims, 46 Drawing Sheets

(56) References Cited

U.S. PATENT DOCUMENTS

| | | | | |
|---|---|---|---|---|
| 2022/0310639 | A1* | 9/2022 | Chung | H10B 41/35 |
| 2022/0384477 | A1* | 12/2022 | Kwon | H10B 43/27 |
| 2022/0399365 | A1* | 12/2022 | Choi | H10B 43/10 |
| 2023/0180476 | A1 | 6/2023 | Lee et al. | |

* cited by examiner

134
120
110
92
80
62
50
A'
110H
SPAD
90
60TR
PRC
AC
CON
S130P
S130P2 S130P1
132
S130
132
S130
132
110
PS
74
70
72
60G
52
A
Z
Y
X 200
220
210
280
234
236
294
293
290
291
292
92
80
62
50
PAD
60TR
PRC
AC
60TR
CON
AC
A'
A
201
220
232
230
CS
260
270
230
232
230
232
90
PS
74
72
70
60G
52
Z
Y
X 2500
2210
2400
2100
II'
2130
2003
2300
2200
II
2003a
2003b
2003
2005
2001
2002
2000
2004
2006

NONVOLATILE MEMORY DEVICE AND ELECTRONIC SYSTEM INCLUDING THE SAME

CROSS-REFERENCE TO RELATED APPLICATION

This application is based on and claims priority under 35 USC § 119 to Korean Patent Application No. 10-2023-0039156, filed on Mar. 24, 2023 and Korean Patent Application No. 10-2023-0057288, filed on May 2, 2023, in the Korean Intellectual Property Office, the disclosures of which are hereby incorporated by reference in their entireties.

BACKGROUND

The present disclosure relates to nonvolatile memory devices and electronic systems including the same, and more particularly to nonvolatile memory devices having a vertical channel and electronic systems including the same.

In order to meet the high performance and low price required by consumers, it is necessary to increase the degree of integration of nonvolatile memory devices. In the case of nonvolatile memory devices, the degree of integration is an important factor in determining the price of products, and an increased degree of integration is particularly required.

In the case of two-dimensional (2D) or planar nonvolatile memory devices, the degree of integration is mainly determined by the area occupied by a unit memory cell, and thus, the 2D or planar nonvolatile memory devices are significantly affected by the level of fine pattern formation technology. However, ultra-expensive equipment is required for miniaturization of patterns, so pattern miniaturization is still limited although the degree of integration of 2D nonvolatile memory devices has increased. Accordingly, three-dimensional (3D) nonvolatile memory devices including memory cells arranged three dimensionally have been proposed.

SUMMARY

Embodiments of the inventive concept provide a nonvolatile memory device capable of improving device performance and reliability.

Embodiments of the inventive concept provide an electronic system capable of improving device performance and reliability.

The technical problems to be solved by the inventive concept are not limited to the problems mentioned above or described hereinafter, and other problems not mentioned will be clearly understood by those skilled in the art from the description below.

Embodiments of the inventive concepts provide a nonvolatile memory device. The nonvolatile memory device includes a substrate including a memory cell region and a connection region; a mold structure including a plurality of gate electrodes sequentially stacked in the memory cell region and stacked stepwise in the connection region, and a plurality of mold insulating layers alternately stacked with the plurality of gate electrodes; a channel structure passing through the mold structure in the memory cell region and through the plurality of gate electrodes; a first cell contact passing through the mold structure in the connection region, connected to a first gate electrode among the plurality of gate electrodes and electrically disconnected from a second gate electrode among the plurality of gate electrodes; a plurality of support structures surrounding the first cell contact planarly in the connection region and respectively in a plurality of first holes passing through the mold structure; and a dam structure between the first cell contact and the second gate electrode in the connection region and apart from the first cell contact with an insulating ring therebetween. The dam structure is in a plurality of second holes each having a diameter larger than a diameter of each of the plurality of first holes, and the plurality of first holes respectively pass through the plurality of second holes.

Embodiments of the inventive concept further provide a nonvolatile memory device. The nonvolatile memory device including a substrate including a memory cell region and a connection region; a peripheral circuit element on the substrate; a mold structure including a plurality of gate electrodes sequentially stacked in the memory cell region and stacked stepwise in the connection region, and a plurality of mold insulating layers alternately stacked with the plurality of gate electrodes; a channel structure passing through the mold structure in the memory cell region and through the plurality of gate electrodes; a first cell contact passing through the mold structure in the connection region, connected to a first gate electrode among the plurality of gate electrodes and electrically disconnected from a second gate electrode among the plurality of gate electrodes; a plurality of support structures surrounding the first cell contact planarly in the connection region and respectively in a plurality of first holes passing through the mold structure; and a dam structure between the first cell contact and the second gate electrode in the connection region and apart from the first cell contact with an insulating ring therebetween. The dam structure is in a plurality of second holes each having diameters larger than diameters of each of the plurality of first holes, and each penetrated by respective ones of the plurality of first holes.

Embodiments of the inventive concepts still further provide an electronic system. The electronic system includes a main substrate; a nonvolatile memory device on the main substrate; and a controller electrically connected to the nonvolatile memory device on the main substrate. The nonvolatile memory device includes a substrate including a memory cell region and a connection region; a mold structure including a plurality of gate electrodes sequentially stacked in the memory cell region and stacked stepwise in the connection region, and a plurality of mold insulating layers alternately stacked with the plurality of gate electrodes; a channel structure passing through the mold structure in the memory cell region and through the plurality of gate electrodes; a first cell contact passing through the mold structure in the connection region, connected to a first gate electrode among the plurality of gate electrodes and electrically disconnected from a second gate electrode among the plurality of gate electrodes; a plurality of support structures surrounding the first cell contact planarly in the connection region and respectively in a plurality of first holes passing through the mold structure; and a first dam structure between the first cell contact and the second gate electrode in the connection region and apart from the first cell contact with an insulating ring therebetween. The first dam structure is in a plurality of second holes each having diameters larger than diameters of each of the plurality of first holes and respectively penetrated by the plurality of first holes.

BRIEF DESCRIPTION OF THE DRAWINGS

Embodiments will be more clearly understood from the following detailed description taken in conjunction with the accompanying drawings in which:

FIG. 4 is a plan view illustrating the nonvolatile memory device of FIG. 3;

FIGS. 13, 14, 15 and 16 are cross-sectional views illustrating a method of manufacturing a nonvolatile memory device, according to example embodiments;

DETAILED DESCRIPTION

Hereinafter, example embodiments are described in detail with reference to the accompanying drawings.

Figure 1:
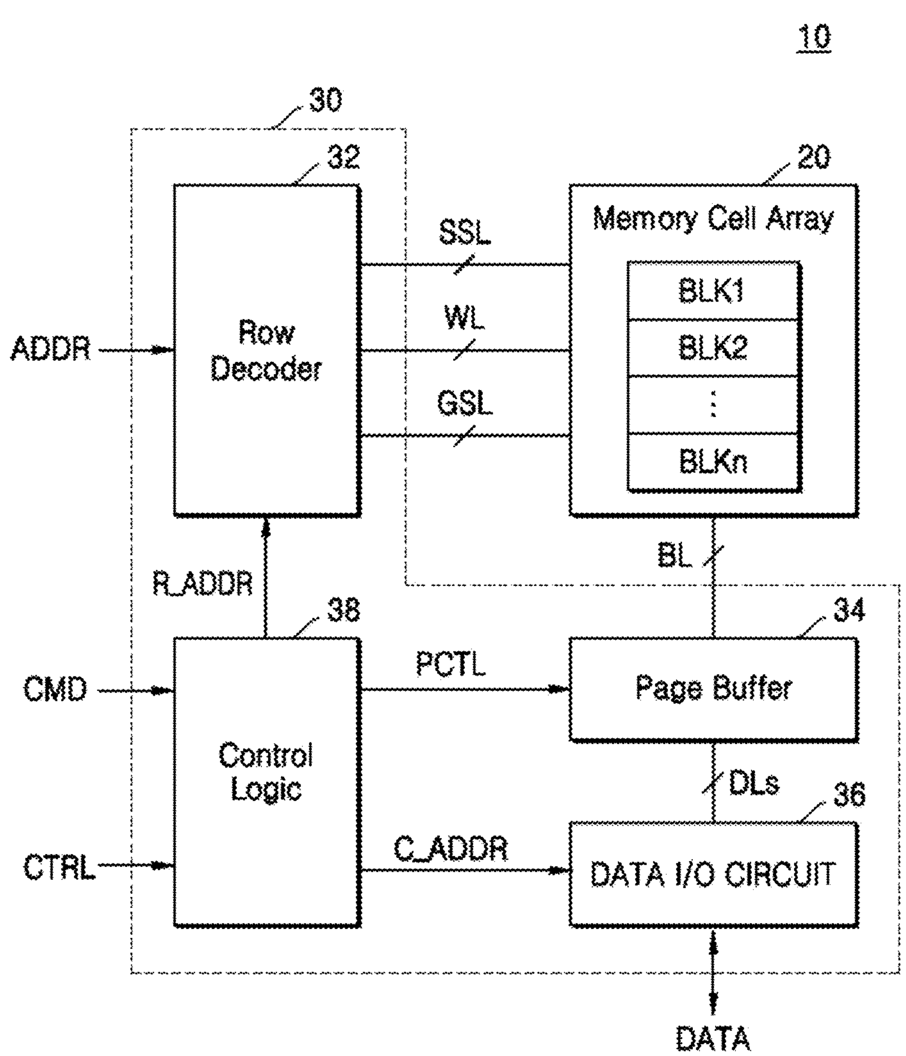
FIG. 1 is a block diagram of a nonvolatile memory device according to example embodiments.

FIG. 1 is a block diagram of a nonvolatile memory device 10 according to example embodiments.

Referring to FIG. 1, the nonvolatile memory device 10 may include a memory cell array 20 and a peripheral circuit 30. The memory cell array 20 includes a plurality of memory cell blocks BLK1, BLK2, . . . , BLKn. Each of the plurality of memory cell blocks BLK1, BLK2, . . . , BLKn may include a plurality of memory cells. The memory cell blocks BLK1, BLK2, . . . , BLKn may be connected to the peripheral circuit 30 through bit line BLs, word line WLs, string select line SSLs, and ground select line GSLs.

The peripheral circuit 30 may include a row decoder 32, a page buffer 34, a data input/output (I/O) circuit 36, and a control logic (e.g., a control logic circuit) 38. Although not shown in FIG. 1, the peripheral circuit 30 may further include for example an I/O interface, a column logic, a voltage generating unit, a pre-decoder, a temperature sensor, a command decoder, an address decoder, an amplifier circuit, and the like.

The memory cell array 20 may be connected to a page buffer 34 through the bit lines BL and may be connected to a row decoder 32 through the word lines WL, the string select lines SSL, and the ground select lines GSL. In the memory cell array 20, each of the memory cells included in the memory cell blocks BLK1, BLK2, . . . , BLKn may be flash memory cells. The memory cell array 20 may include a 3D memory cell array. The 3D memory cell array may include a plurality of NAND strings, and each of the NAND strings may include a plurality of memory cells connected to a plurality of word lines WL vertically stacked on a substrate.

The peripheral circuit 30 may receive an address ADDR, a command CMD, and a control signal CTRL from the outside of the nonvolatile memory device 10 and may transmit and receive data DATA to and from a device outside the nonvolatile memory device 10.

In response to the address ADDR from the outside, the row decoder 32 may select at least one of the memory cell blocks BLK1, BLK2, . . . , BLKn and may select a word line WL, a string select line SSL, and a ground select line GSL of the selected memory cell block. The row decoder 32 may transmit a voltage for performing a memory operation to the word line WL of the selected memory cell block.

The page buffer 34 may be connected to the memory cell array 20 through bit lines BL. During a program operation, the page buffer 34 may operate as a write driver to apply a voltage according to the data DATA to be stored in the memory cell array 20 to the bit lines BL, and during a read operation, the page buffer 34 may operate as a sense amplifier to sense the data DATA stored in the memory cell array 20. The page buffer 34 may operate according to a control signal PCTL provided from the control logic 38.

The data I/O circuit 36 may be connected to the page buffer 34 through data lines DLs. During a program operation, the data I/O circuit 36 may receive the data DATA from a memory controller and provide program data DATA to the page buffer 34 based on the column address C_ADDR provided from the control logic 38. During a read operation, the data I/O circuit 36 transfers the read data DATA stored in the page buffer 34 to the memory controller based on the column address C_ADDR provided from the control logic 38.

Although not shown, the data I/O circuit 36 may transfer an input address or command to the control logic 38 or the row decoder 32. The peripheral circuit 30 may for example further include an electrostatic discharge (ESD) circuit and a pull-up/pull-down driver (not shown).

The control logic 38 may receive the command CMD and the control signal CTRL from the memory controller. The control logic 38 may provide the row address R_ADDR to the row decoder 32 and the column address C_ADDR to the data I/O circuit 36. The control logic 38 may generate various internal control signals used in the nonvolatile memory device 10 in response to the control signal CTRL. For example, the control logic 38 may adjust a voltage level provided to the word line WL and the bit line BL when a memory operation, such as a program operation or an erase operation, is performed.

Figure 2:
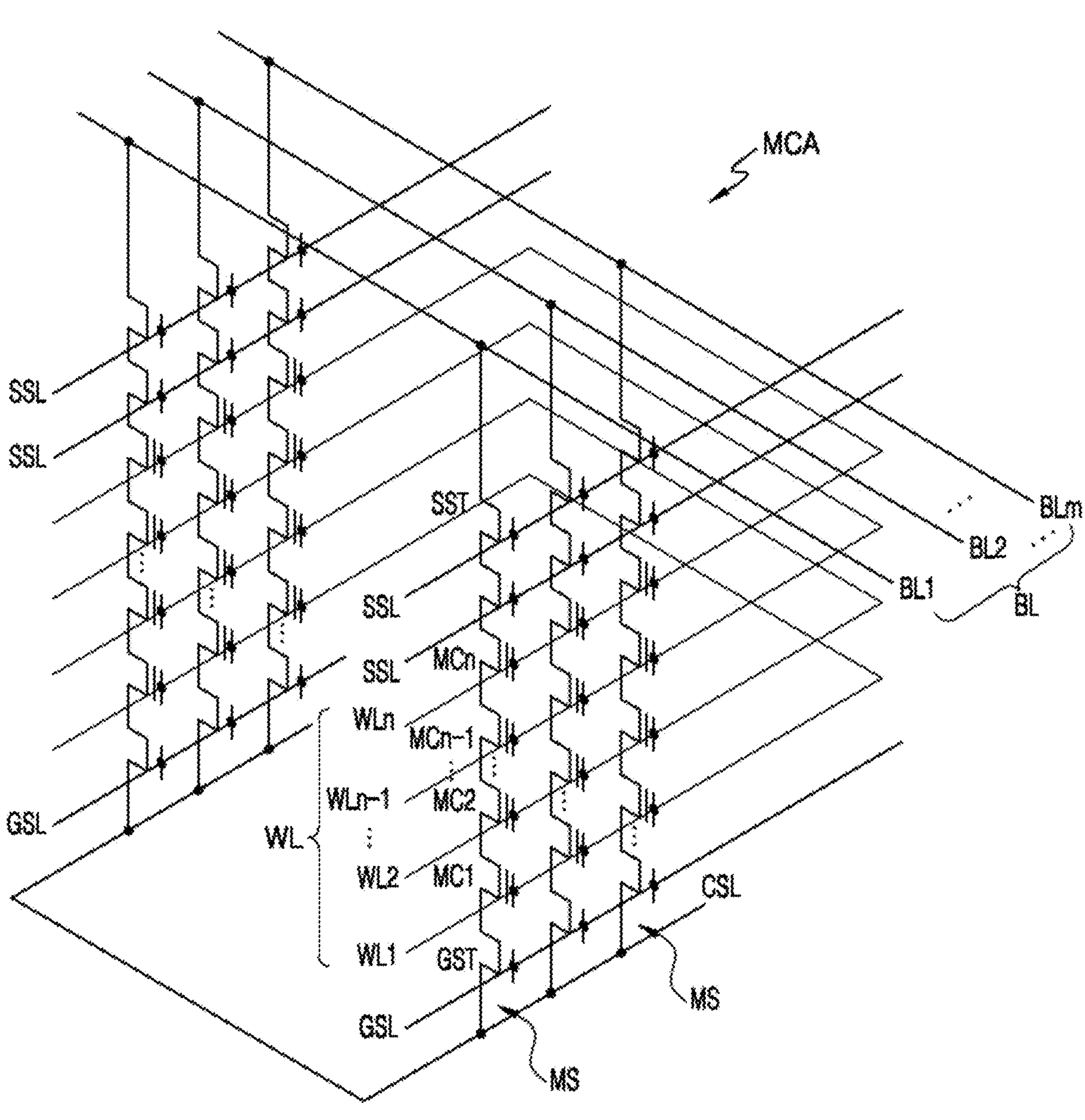
FIG. 2 is an equivalent circuit diagram of a memory cell array of a nonvolatile memory device according to example embodiments.

FIG. 2 is an equivalent circuit diagram of a memory cell array MCA of the nonvolatile memory device 10 according to example embodiments.

Referring to FIG. 2, the memory cell array MCA may include a plurality of memory cell strings MS. The memory cell array MCA may include a plurality of bit lines BL: BL1, BL2, . . . , BLm, a plurality of word lines WL: WL1, WL2, . . . , WLn−1, WLn, at least one string select line SSL, at least one ground select line GSL, and a common source line CSL. The memory cell strings MS may be formed between the bit lines BL: BL1, BL2, . . . , BLm and the common source line CSL. Although FIG. 2 illustrates a case in which each of the memory cell strings MS includes two string select lines SSL, the inventive concepts are not limited thereto. For example, each of the memory cell strings MS may include one string select line SSL.

Each of the memory cell strings MS may include a string select transistor SST, a ground select transistor GST, and a plurality of memory cell transistors MC1, MC2, . . . , MCn−1, MCn. A drain region of the string select transistor SST may be connected to the bit line BL: BL1, BL2, . . . , BLm, and a source region of the ground select transistor GST may be connected to the common source line CSL. The common source line CSL may be a region to which source regions of the ground select transistors GST are connected in common.

The string select transistor SST may be connected to the string select line SSL, and the ground select transistor GST may be connected to the ground select line GSL. The memory cell transistors MC1, MC2, . . . , MCn−1, MCn may be connected to a plurality of word lines WL: WL1, WL2, . . . , WLn−1, WLn, respectively.

Figure 3:
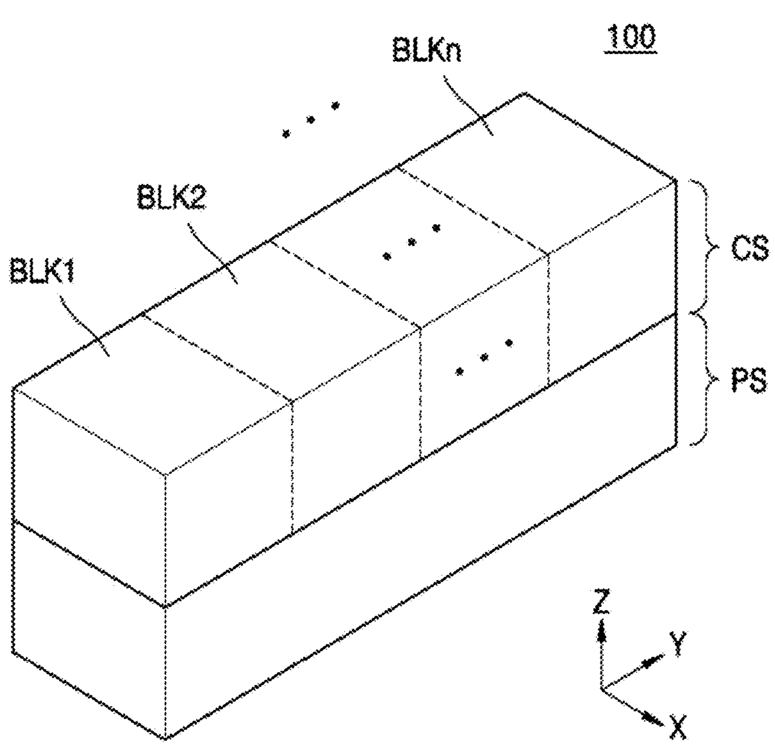
FIG. 3 is a perspective view illustrating a representative configuration of a nonvolatile memory device according to example embodiments.
Figure 4:
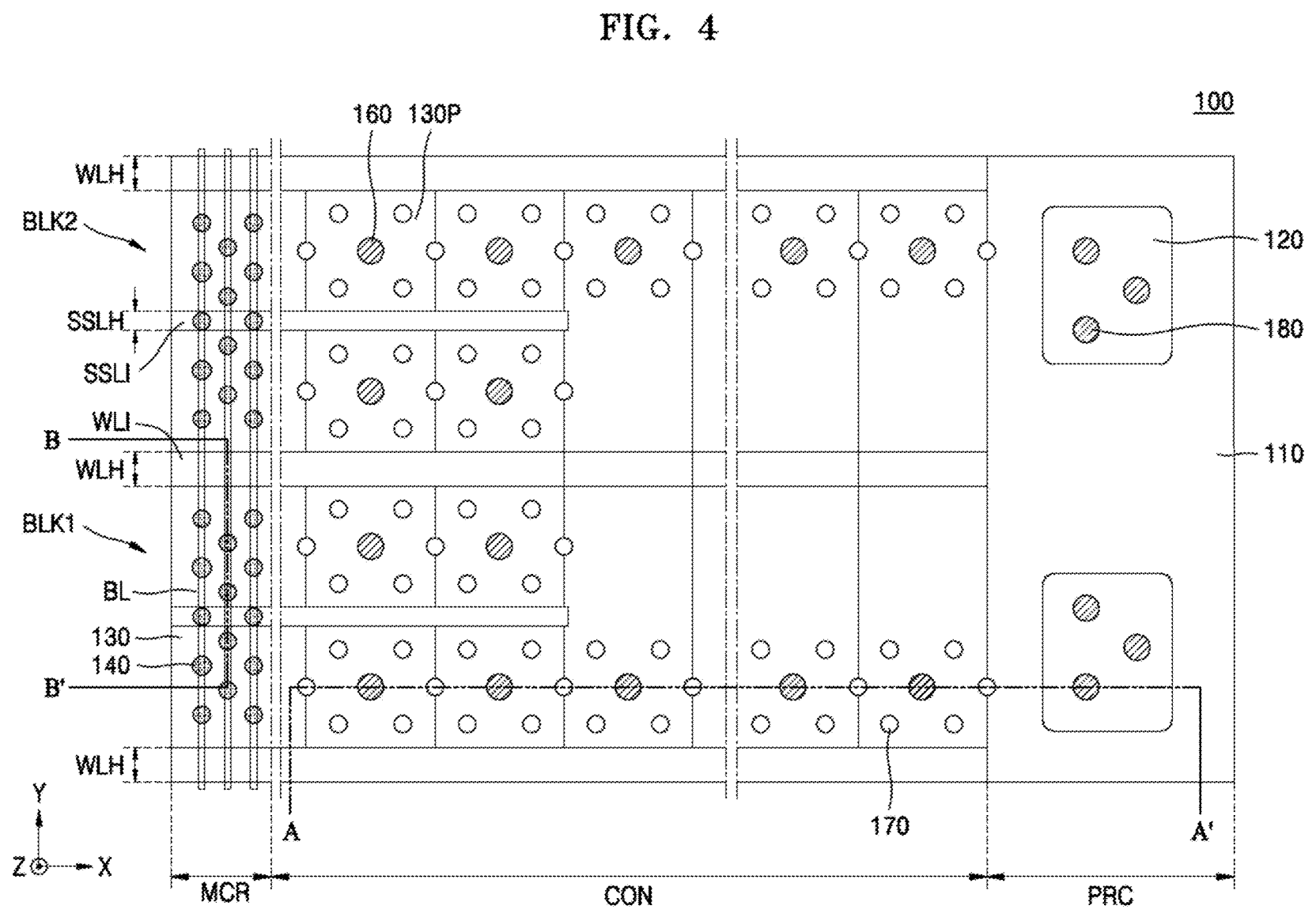
Figure 5:
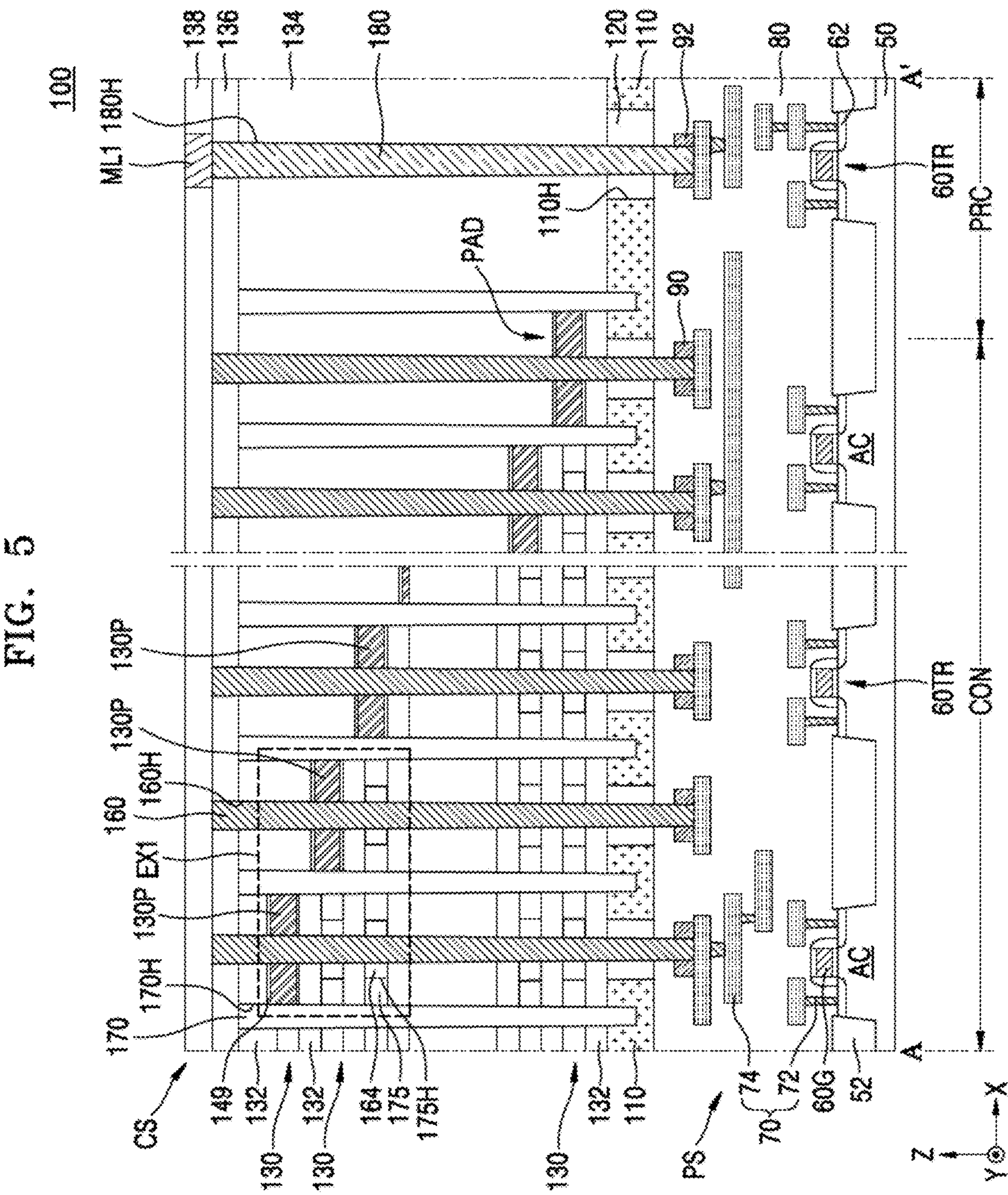
FIG. 5 is a cross-sectional view taken along line A-A' of FIG. 4.
Figure 6:
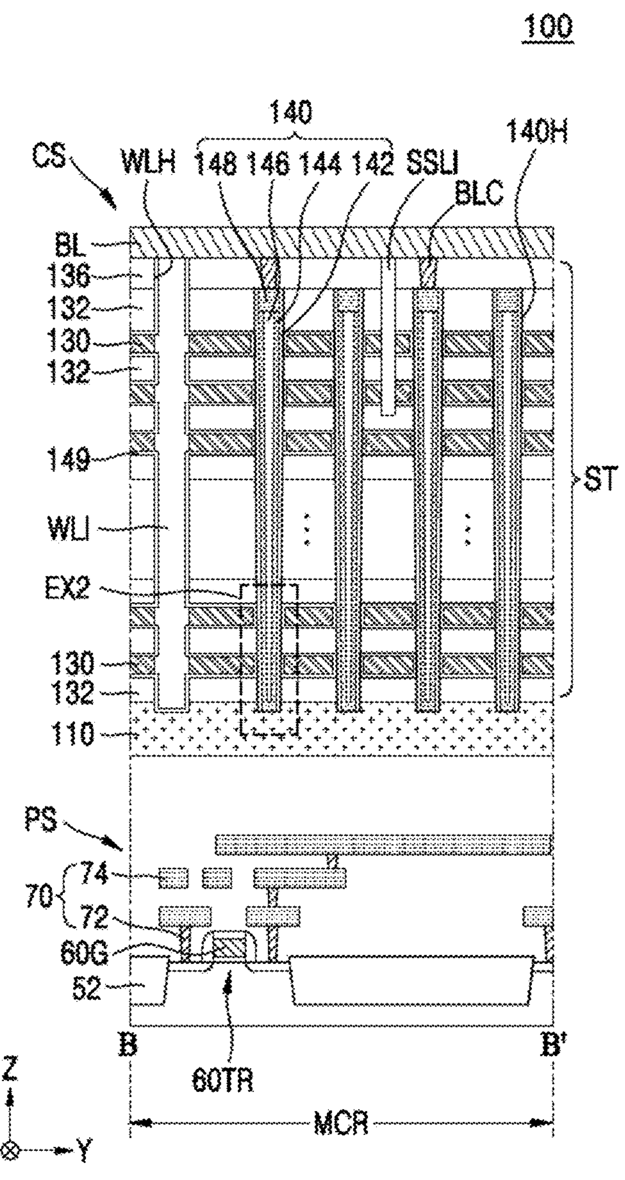
FIG. 6 is a cross-sectional view taken along line B-B' of FIG. 4.
Figure 7:
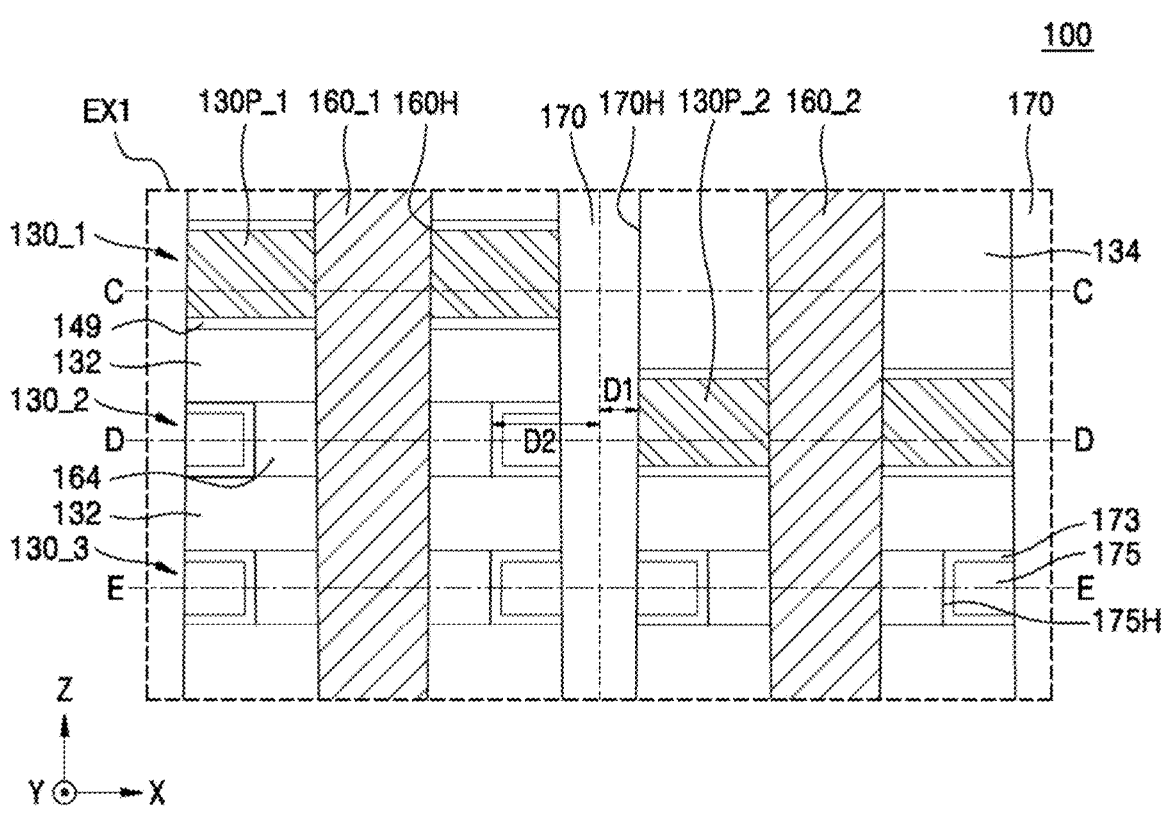
FIG. 7 is an enlarged view of region EX1 of FIG. 5.
Figure 8A:
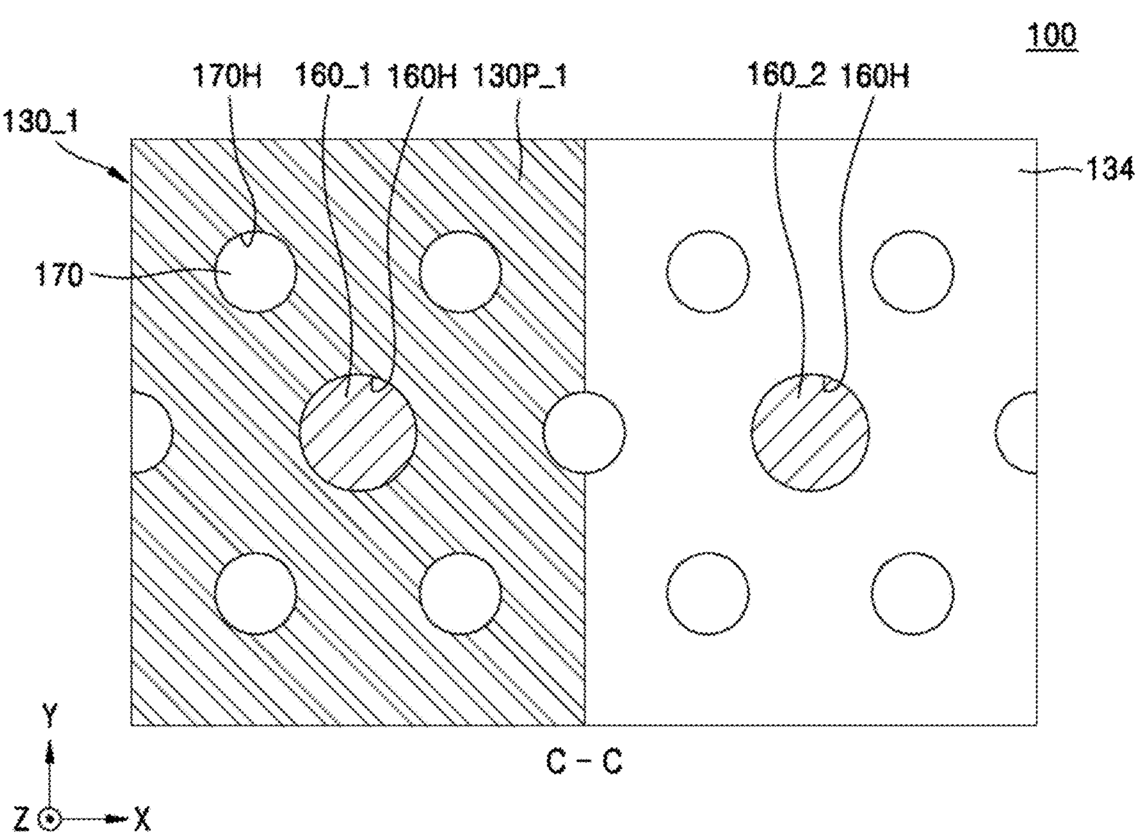
FIGS. 8A, 8B, and 8C are plan views at vertical levels taken along lines C-C, D-D, and E-E of FIG. 7, respectively.
Figure 8B:
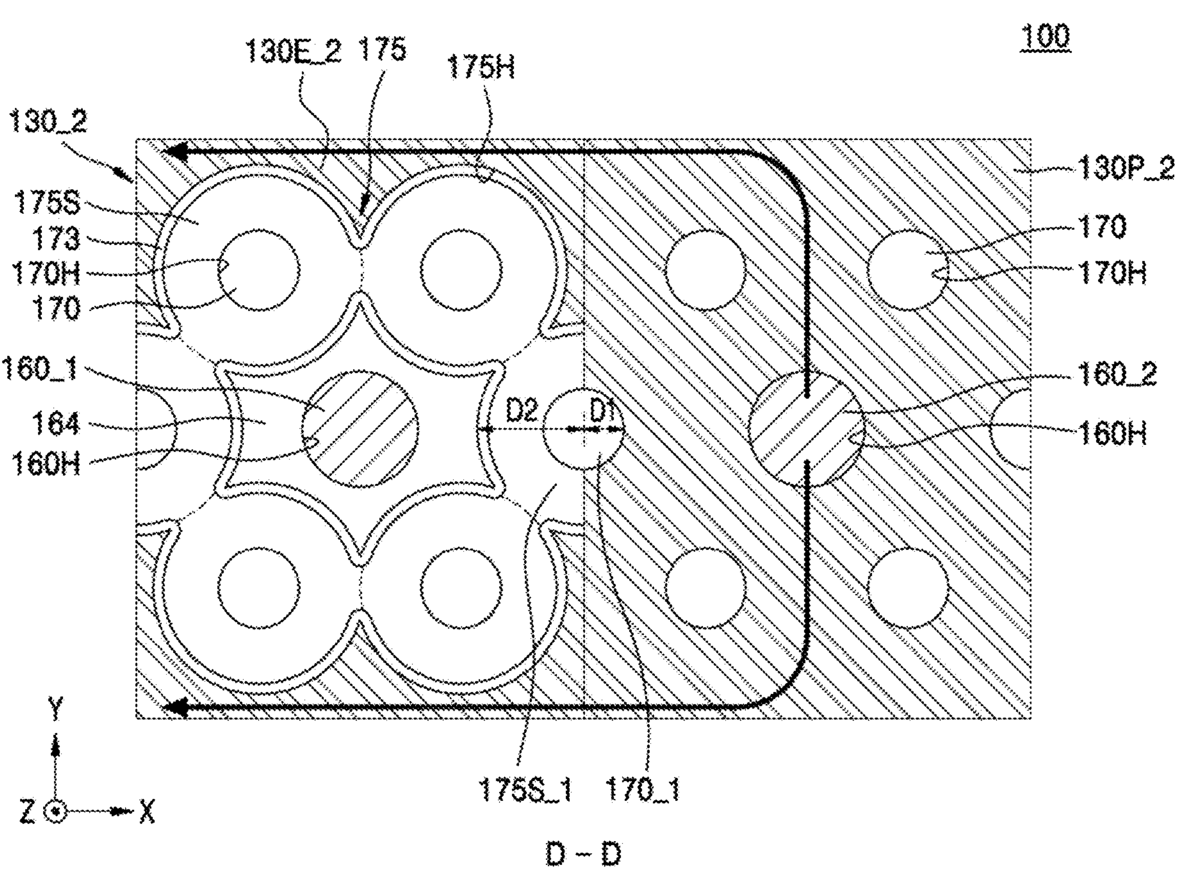
Figure 8C:
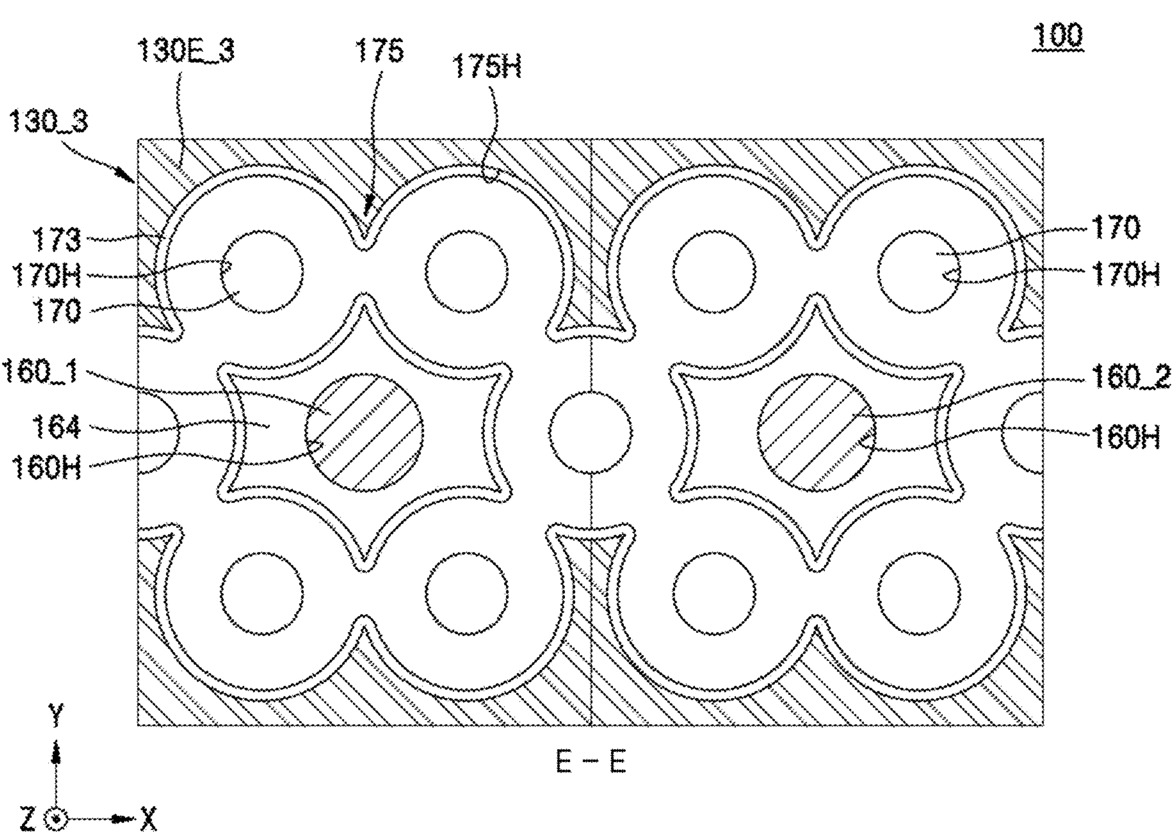
Figure 9:
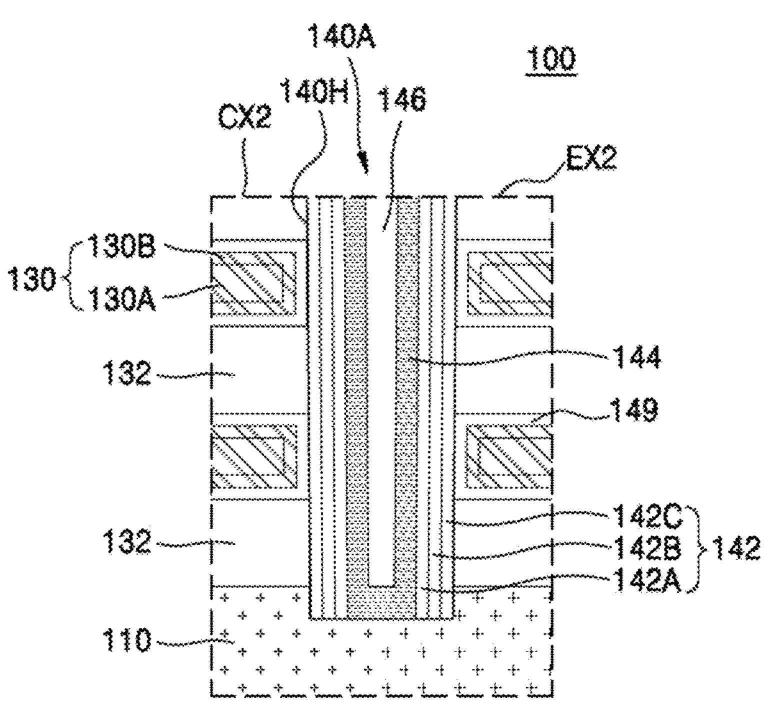
FIG. 9 is an enlarged view of region EX2 of FIG. 6.

FIGS. 3 to 9 are diagrams illustrating a nonvolatile memory device 100 according to example embodiments. In detail, FIG. 3 is a perspective view illustrating a representative configuration of the nonvolatile memory device 100 according to example embodiments, and FIG. 4 is a plan view illustrating the nonvolatile memory device 100 of FIG. 3. FIG. 5 is a cross-sectional view taken along line A-A' of FIG. 4, and FIG. 6 is a cross-sectional view taken along line B-B' of FIG. 4. FIG. 7 is an enlarged view of region EX1 of FIG. 5. FIGS. 8A, 8B, and 8C are plan views at vertical levels taken along lines C-C, D-D, and E-E of FIG. 7, respectively. FIG. 9 is an enlarged view of region EX2 of FIG. 6.

Referring to FIGS. 3 to 6, the nonvolatile memory device 100 may include a cell array structure CS and a peripheral circuit structure PS that overlap each other in the vertical direction (a Z direction). The cell array structure CS may include the memory cell array 20 described above with reference to FIG. 1, and the peripheral circuit structure PS may include the peripheral circuit 30 described above with reference to FIG. 1.

The cell array structure CS may include a plurality of memory cell blocks BLK1, BLK2, . . . , BLKn. Each of the memory cell blocks BLK1, BLK2, . . . , BLKn may include three-dimensionally arranged memory cells.

The peripheral circuit structure PS may include a peripheral circuit transistor 60TR and a peripheral circuit interconnection structure 70 disposed on a substrate 50. The substrate 50 may include a memory cell region MCR, a connection region CON, and a peripheral circuit connection region PRC that are horizontally arranged. An active region AC may be defined on the substrate 50 by a device isolation layer 52, and a plurality of peripheral circuit transistors 60TR may be formed on the active region AC. The peripheral circuit transistors 60TR may include a peripheral circuit gate 60G and source/drain regions 62 located in portions of the substrate 50 on both sides of the peripheral circuit gate 60G.

The substrate 50 may include a semiconductor material, for example, a group IV semiconductor, a group III-V compound semiconductor, or a group II-VI oxide semiconductor. For example, the group IV semiconductor may include silicon (Si), germanium (Ge), or silicon-germanium. The substrate 50 may be provided as a bulk wafer or an epitaxial layer. In example embodiments, the substrate 50 may include a silicon-on-insulator (SOI) substrate or a germanium-on-insulator (GeOI) substrate.

The peripheral circuit interconnection structure 70 includes a plurality of peripheral circuit contacts 72 and a plurality of peripheral circuit interconnection layers 74. An interlayer insulating layer 80 covering the peripheral circuit transistor 60TR and the peripheral circuit interconnection structure 70 may be disposed on the substrate 50. The peripheral circuit interconnection layers 74 may have a multilayer structure including a plurality of metal layers located at different vertical levels.

A common source plate 110 may be disposed on the interlayer insulating layer 80. In some embodiments, the common source plate 110 may function as a source region supplying current to vertical memory cells formed in the cell array structure CS. The common source plate 110 may be disposed in the memory cell region MCR, the connection region CON, and the peripheral circuit connection region PRC of the substrate 50.

In example embodiments, the common source plate 110 may include at least one of silicon (Si), germanium (Ge), silicon germanium (SiGe), gallium arsenide (GaAs), indium gallium arsenide (InGaAs), aluminum gallium arsenide (AlGaAs), or mixtures thereof. Also, the common source plate 110 may include a semiconductor doped with n-type impurities. Also, the common source plate 110 may have a crystal structure including at least one selected from single crystal, amorphous, and polycrystalline. In example embodiments, the common source plate 110 may include polysilicon doped with n-type impurities.

The common source plate 110 may include an opening 110H located in the connection region CON and the peripheral circuit connection region PRC of the substrate 50, and an insulating plug 120 may fill the inside of the opening 110H. The insulating plug 120 may have an upper surface located at the same level as that of the upper surface of the common source plate 110.

A mold structure ST in which a plurality of gate electrodes 130 and a plurality of mold insulating layers 132 are alternately arranged in the vertical direction (the Z direction) may be located on the common source plate 110 in the memory cell region MCR and the connection region CON.

Referring to FIG. 9 together with FIGS. 3-6, the gate electrode 130 may include a buried conductive layer 130A and a conductive barrier layer 130B surrounding top, bottom, and side surfaces of the buried conductive layer 130A. For example, the buried conductive layer 130A may include a metal such as tungsten, nickel, cobalt, tantalum, a metal silicide such as tungsten silicide, nickel silicide, cobalt silicide, tantalum silicide, doped polysilicon, or combinations thereof. In example embodiments, the conductive barrier layer 130B may include titanium nitride, tantalum nitride, tungsten nitride, or combinations thereof.

In example embodiments, the gate electrodes 130 may correspond to at least one ground select line GSL, word lines WL: WL1, WL2, . . . , WLn−1, WLn and at least one string select line SSL. For example, the lowermost gate electrode 130 may function as a ground select line GSL, two uppermost gate electrodes 130 may function as string select lines SSL, and the other gate electrodes 130 may function as word lines WL. Accordingly, a memory cell string MS including the ground selection transistor GST, the string selection transistor SST, and the memory cell transistors MC1, MC2, . . . , MCn−1, MCn connected in series therebetween may be provided. In example embodiments, at least one of the gate electrodes 130 may function as a dummy word line but is not limited thereto.

As shown in FIG. 6, on the common source plate 110, a plurality of gate stack isolation openings WLH may extend in a first horizontal direction (an X direction) parallel or substantially parallel to the upper surface of the common source plate 110. The gate electrodes 130 located between a pair of gate stack isolation openings WLH may constitute one block. For example, a first block BLK1 and a second block BLK2 are illustrated in FIG. 3.

A gate stack isolation insulating layer WLI filling the inside of the gate stack isolation opening WLH may be disposed on the common source plate 110. The gate stack isolation insulating layer WLI may include a silicon oxide film, a silicon nitride film, SiON, SiOCN, SiCN, or combinations thereof.

The channel structures 140 may extend from the upper surface of the common source plate 110 in the vertical direction (the Z direction) through the gate electrodes 130 and the mold insulating layers 132 in the memory cell region MCR.

The channel structures 140 may be apart from each other at predetermined or alternatively, desired intervals in the first horizontal direction (the X direction), a second horizontal direction (a Y direction), and a third horizontal direction (e.g., a diagonal direction). The channel structures 140 may be arranged in a zigzag shape or staggered shape.

Each of the channel structures 140 may be located in a channel hole 140H in the memory cell region MCR. Each of the channel structures 140 may include a gate insulating layer 142, a channel layer 144, a buried insulating layer 146, and a conductive plug 148. The gate insulating layer 142 and the channel layer 144 may be sequentially disposed on sidewalls of the channel hole 140H. For example, the gate insulating layer 142 may be conformally disposed on the sidewall of the channel hole 140H, and the channel layer 144 may be conformally disposed on the sidewall and a bottom portion of the channel hole 140H. The buried insulating layer 146 filling a remaining space of the channel hole 140H may be disposed on the channel layer 144. The conductive plug 148 that contacts the channel layer 144 and blocks the entrance of the channel hole 140H may be disposed above the channel hole 140H. In example embodiments, the buried insulating layer 146 may be omitted, and the channel layer 144 may be formed to have a pillar shape to fill the other portion of the channel hole 140H.

In example embodiments, the channel layer 144 may be disposed to contact the upper surface of the common source plate 110 at the bottom portion of the channel hole 140H. In example embodiments, as shown in FIG. 9, the bottom surface of the channel layer 144 may be located at a vertical level lower than that of the upper surface of the common source plate 110 but is not limited thereto.

As shown in FIG. 9, the gate insulating layer 142 may have a structure including a tunneling dielectric layer 142A, a charge storage layer 142B, and a blocking dielectric layer 142C sequentially on the outer wall of the channel layer 144. Relative thicknesses of the tunneling dielectric layer 142A, the charge storage layer 142B, and the blocking dielectric layer 142C constituting the gate insulating layer 142 are not limited to those illustrated in FIG. 9 and may be variously modified.

The tunneling dielectric layer 142A may include silicon oxide, hafnium oxide, aluminum oxide, zirconium oxide, tantalum oxide, or the like. The charge storage layer 142B may be a region in which electrons passing through the tunneling dielectric layer 142A from the channel layer 144 may be stored and may include silicon nitride, boron nitride, silicon boron nitride, or polysilicon doped with impurities. The blocking dielectric layer 142C may include silicon oxide, silicon nitride, or metal oxide having a permittivity higher than that of silicon oxide. The metal oxide may include hafnium oxide, aluminum oxide, zirconium oxide, tantalum oxide, or combinations thereof.

In example embodiments, a dielectric liner 149 may be located between the channel structure 140 and the gate electrode 130. For example, the dielectric liner 149 may be located between the channel structure 140 and the gate electrode 130 and on top and bottom surfaces of the gate electrode 130. For example, the dielectric liner 149 may be located between the gate electrode 130 and the mold insulating layer 132. In example embodiments, the dielectric liner 149 may include silicon oxide, silicon nitride, or metal oxide having permittivity higher than that of silicon oxide. The metal oxide may include hafnium oxide, aluminum oxide, zirconium oxide, tantalum oxide, or combinations thereof.

The two uppermost gate electrodes 130 in one block BLK1 or BLK2 may be separated into two portions planarly by the string separation opening SSLH. A string isolation insulating layer SSLI may be located in the string isolation opening SSLH, and the two portions may be apart from each other in the second horizontal direction (the Y direction) with the string isolation insulating layer SSLI therebetween. The two portions may configure the string select line SSL described above with reference to FIG. 2.

The gate electrodes 130 in the connection region CON may form a pad structure PAD. In the connection region CON, the gate electrodes 130 may extend to have shorter lengths in the first horizontal direction (the X direction), in a direction away from the upper surface of the common source plate 110. The pad structure PAD may refer to portions of the gate electrodes 130 located in a step shape. The pad structure PAD may include a plurality of pad portions 130P extending respectively from the gate electrodes 130.

A cover insulating layer 134 may be disposed on the pad structure PAD, and a first upper insulating layer 136 may be disposed on the uppermost mold insulating layer 132 and the cover insulating layer 134.

A cell contact 160 passing through the first upper insulating layer 136, the cover insulating layer 134, the gate electrodes 130, and the mold insulating layers 132 is located in the connection region CON. The cell contact 160 may be located inside a cell contact hole 160H passing through the first upper insulating layer 136, the cover insulating layer 134, the gate electrodes 130, the mold insulating layers 132, and the insulating plug 120.

The cell contact 160 may include a metal such as tungsten, nickel, cobalt, or tantalum, a metal silicide such as tungsten silicide, nickel silicide, cobalt silicide, tantalum silicide, or the like, doped polysilicon, or combinations thereof.

The cell contact 160 may be electrically connected to a corresponding one gate electrode 130 and may be located to be apart from at least one gate electrode 130 located at a vertical level lower than the one gate electrode 130 among the gate electrodes 130. The cell contact 160 and the gate electrode 130 connected to or not connected to the cell contact 160 are described in detail with reference to FIGS. 7 and 8A to 8C.

A plurality of support structures 170 passing through the cover insulating layer 134, the gate electrodes 130, and the mold insulating layers 132 may be located in the connection region CON. The support structures 170 may be located in the first holes 170H passing through the cover insulating layer 134, the gate electrodes 130, and the mold insulating layers 132, respectively. In a plan view, the support structures 170 may be arranged to surround each cell contact 160. In example embodiments, the plurality of the support structures 170 may be arranged to surround one cell contact 160. Although FIG. 4 illustrates that six support structures 170 are arranged to surround one cell contact 160, the number and arrangement of the support structures 170 that surround one cell contact 160 are not limited to the illustrated one. The support structures 170 may include at least one selected from silicon oxide and silicon oxynitride. The support structures 170 may be formed to limit or prevent leaning or bending of the gate electrodes 130 and to secure structural stability during a manufacturing process of the nonvolatile memory device 100.

A bottom portion of the cell contact 160 may be surrounded by a first conductive landing via 90, and the first conductive landing via 90 may be covered by the interlayer insulating layer 80. The bottom surface of the first conductive landing via 90 may contact the upper surface of the peripheral circuit interconnection layer 74. The first conductive landing via 90 may include polysilicon doped with n-type impurities.

In the peripheral circuit connection region PRC, a through-hole 180H passing through the insulating plug 120, the cover insulating layer 134, and the first upper insulating layer 136 may be located, and a conductive through-via 180 may be located in the through-hole 180H. For example, the conductive through-via 180 may include tungsten, titanium, tantalum, copper, aluminum, titanium nitride, tantalum nitride, tungsten nitride, or combinations thereof.

The second conductive landing via 92 may surround a sidewall of a bottom portion of the conductive through-via 180 and may be covered by the interlayer insulating layer 80. The bottom surface of the second conductive landing via 92 may contact the upper surface of the peripheral circuit interconnection layer 74. The second conductive landing via 92 may include polysilicon doped with n-type impurities.

FIG. 5 shows that the second conductive landing via 92 surrounds the sidewall of the conductive through-via 180 and the bottom surface of the conductive through-via 180 contacts the upper surface of the peripheral circuit interconnection layer 74. However, alternatively, the bottom surface of the conductive through-via 180 may contact the upper surface of the second conductive landing via 92, and the bottom surface of the second conductive landing via 92 may contact the upper surface of the peripheral circuit interconnection layer 74.

The cell contact 160 may be configured to be connected to the peripheral circuit transistor 60TR through the first conductive landing via 90 and the peripheral circuit interconnection layer 74, and the conductive through-via 180 may be configured to be connected to the peripheral circuit transistor 60TR through the second conductive landing via 92 and the peripheral circuit interconnection layer 74.

In the memory cell region MCR, the bit line contact BLC may pass through the first upper insulating layer 136 to contact the conductive plug 148 of the channel structure 140, and the bit line BL may be located on the bit line contact BLC. A second upper insulating layer 138 covering sidewalls of the bit line BL may be disposed on the first upper insulating layer 136. An interconnection line ML1 may be disposed on the conductive through-via 180 in the peripheral circuit connection region PRC.

Hereinafter, a connection relationship between cell contacts 160_1 and 160_2 and first to third gate electrodes 130_1, 130_2, and 130_3 is described with reference to FIGS. 7 and 8A to 8C.

Referring to FIGS. 7 and 8A to 8C, in example embodiments, the gate electrode 130 (refer to FIG. 5) may include the first gate electrode 130_1, the second gate electrode 130_2, and the third gate electrode 130_3 having different vertical levels. In some embodiments, based on the upper surface of the common source plate 110, the first gate electrode 130_1 may be located at the highest vertical level, the second gate electrode 130_2 may be located at the next higher vertical level, and the third gate electrode 1303 may be located at the third higher vertical level. That is, the first gate electrode 130_1 may have the shortest length in the first horizontal direction (the X direction), and the second gate electrode 130_2 and the third gate electrode 1303 may have shorter lengths in this order. For example, the second gate electrode 1302 may be shorter than the third gate electrode 130_3. In example embodiments, the first gate electrode 1301 may include a first pad portion 130P_1 electrically connected to the first cell contact 160_1. The second gate electrode 130_2 may include a second pad portion 130P_2 electrically connected to the second cell contact 160_2.

In example embodiments, the cell contact 160 (refer to FIG. 5) may include a first cell contact 160_1 and a second cell contact 1602 arranged in the first horizontal direction (the X direction). The first cell contact 1601 may pass through the first gate electrode 130_1, the second gate electrode 1302, and the third gate electrode 130_3. The second cell contact 1602 may pass through the second gate electrode 130_2 and the third gate electrode 130_3.

In example embodiments, the first cell contact 160_1 may be electrically connected to the first gate electrode 130_1 and may not be electrically connected to the second gate electrode 130_2 and the third gate electrode 130_3 that are located at a vertical level lower than that of the first gate electrode 130_1. In example embodiments, the first cell contact 160_1 may be apart from the second gate electrode 130_2 and the third gate electrode 130_3.

In example embodiments, the second cell contact 160_2 may be electrically connected to the second gate electrode 130_2 and may not be electrically connected to the third gate electrode 130_3 located at a vertical level lower than that of the second gate electrode 130_2. In example embodiments, the second cell contact 160_2 may be apart from the third gate electrode 130_3.

In example embodiments, the support structures 170 may pass through the first gate electrode 130_1, the second gate electrode 1302, and the third gate electrode 130_3. In example embodiments, each of the support structures 170 may pass through the pad portion 130P.

In example embodiments, as illustrated in FIGS. 8A to 8C, the support structures 170 may be arranged to surround each of the first cell contact 160_1 and the second cell contact 160_2 planarly. The support structures 170 may include a first support structure 170_1 located between the first cell contact 160_1 and the second cell contact 160_2. The first support structure 170_1 may overlap the first cell contact 160_1 and the second cell contact 160_2 in the first horizontal direction (the X direction). The first support structure 170_1 may pass through two pad portions 130P having different vertical levels and not overlapping each other in the vertical direction (the Z direction).

As illustrated in FIG. 8A, the first cell contact 160_1 may pass through the first gate electrode 130_1. In detail, the first cell contact 160_1 may pass through the first pad portion 130P_1 and may be electrically connected to the first gate electrode 130_1 through the first pad portion 130P_1. For example, the first cell contact 160_1 may contact the first gate electrode 130_1. For example, the first cell contact 160_1 may contact the first pad portion 130P_1. The second cell contact 160_2 may pass through the cover insulating layer 134 at the same vertical level as that of the first gate electrode 130_1.

In example embodiments, the support structures 170 may be located in the first hole 170H and may be arranged to surround the first cell contact 160_1 and the second cell contact 160_2. In detail, the support structures 170 passing through the first gate electrode 1301 may be located to surround the first cell contact 160_1. In detail, the support structures 170 passing through the cover insulating layer 134 may be located to surround the second cell contact 160_2.

In example embodiments, a portion of the first support structure 170_1 located between the first cell contact 160_1 and the second cell contact 160_2 may pass through the first gate electrode 130_1, and the other portion thereof may pass through the cover insulating layer 134. In particular, a portion of the first support structure 1701 may pass through the first pad portion 130P_1. In example embodiments, a portion of the first support structure 1701 may be surrounded by the first gate electrode 130_1 and the other portion thereof may be surrounded by the cover insulating layer 134, at the same vertical level as that of the first gate electrode 130_1. For example, at the same vertical level as that of the first gate electrode 130_1, a portion of the first support structure 170_1 may contact the first gate electrode 130_1 and the other portion thereof may contact the cover insulating layer 134.

As shown in FIG. 8B, the first cell contact 160_1 may pass through the second gate electrode 130_2. The first cell contact 1601 may pass through the second extension portion 130E_2 and may not be electrically connected to the second gate electrode 130_2. In example embodiments, the first cell contact 160_1 may be apart from the second gate electrode 130_2 with the dam structure 175 therebetween.

The second cell contact 1602 may pass through the second gate electrode 130_2. In detail, the second cell contact 160_2 may pass through the second pad portion 130P_2 and may be electrically connected to the second gate electrode 1302 through the second pad portion 130P_2. For example, the second cell contact 160_2 may contact the second gate electrode 130_2. For example, the second cell contact 1602 may contact the second pad portion 130P_2.

In example embodiments, as described above with reference to FIG. 8A, the support structures 170 may be located in the first hole 170H and surround the first cell contact 160_1 and the second cell contact 160_2.

In example embodiments, the dam structure 175 may surround the first cell contact 160_1 planarly and may be located between the first cell contact 160_1 and the second gate electrode 130_2. In some embodiments, the dam structure 175 may be located in the second holes 175H passing through the second gate electrode 130_2. In example embodiments, the dam structure 175 is located in the second holes 175H passing through the second extension portion 130E_2 of the second gate electrode 1302, and the second holes 175H are not located in the pad portion 130P_2. The dam structure 175 may include one or more selected from silicon oxide and silicon oxynitride.

In example embodiments, the dam structure 175 may include a plurality of subdams 175S each having a donut-shape and having a shape each surrounding the support structure 170 in a plan view. Each of the subdams 175S may be located in the second hole 175H. (In FIG. 8B, the boundary between each of the subdams 175S and the second holes 175H is indicated by the dashed lines.) The second holes 175H may overlap each other to form an integral body. Similarly, the subdams 175S may contact each other to integrally form the dam structure 175. The dam structure 175 may contact the support structure 170.

In some embodiments, the first hole 170H in which the support structure 170 is located extends in the vertical direction (the Z direction) (refer to FIGS. 5 and 7), and has a radius D1 in the horizontal direction (the X direction and/or the Y direction). In some embodiments, the second hole 175H in which the dam structure 175 is located extends in the vertical direction (the Z direction) in the second gate electrode 130_2 (refer to FIG. 7) and has a radius D2 in the horizontal direction (the X direction and/or the Y direction). In some embodiments, the first hole 170H may pass through the second hole 175H. For example, the first hole 170H may penetrate the second hole 175H. In example embodiments, the second hole 175H may have a shape surrounding the first hole 170H. In some embodiments, the second hole 175H may be configured by forming a recess portion R2 (refer to FIGS. 21A and 21B) from the first hole 170H.

In some embodiments, the second hole 175H may overlap the first hole 170H. In some embodiments, the center of the first hole 170H may overlap the center of the second hole 175H. For example, the first hole 170H may be aligned with the second hole 175H in the vertical direction (the Z direction).

In some example embodiments, the center of the first hole 170H may be offset from the center of the second hole 175H.

In some embodiments, a portion of the first support structure 170_1 located between the first cell contact 160_1 and the second cell contact 1602 may pass through the second extension portion 130E_2, and the other portion thereof may pass through the second pad portion 130P_2. In example embodiments, at the same vertical level as that of the second gate electrode 130_2, a portion of the first support structure 170_1 may be surrounded by the second extension portion 130E_2, and the other portion thereof may be surrounded by the second pad portion 130P_2. For example, at the same vertical level as that of the second gate electrode 130_2, a portion of the first support structure 170_1 may be apart from the second extension portion 130E_2 with the dam structure 175 therebetween, and the other portion thereof may contact the second pad portion 130P_2. In some embodiments, the subdams 175S may include a first subdam 175S_1 having a donut shape cut in half, and the first subdam 175S_1 may surround a portion of the first support structure 170_1 at the same vertical level as that of the second gate electrode 130_2.

In some embodiments, the dam structure 175 may be apart from the first cell contact 160_1 with an insulating ring 164 therebetween. The insulation ring 164 may have a shape surrounding the first cell contact 1601 planarly. The insulating ring 164 may fill a gap between the first cell contact 160_1 and the dam structure 175 planarly. The insulating ring 164 may extend in the vertical direction (the Z direction) in the second gate electrode 1302 (refer to FIG. 7). The insulating ring 164 may include silicon nitride. In some embodiments, the dam structure 175 may have a shape surrounding the insulating ring 164 planarly.

Hereinafter, a transfer path of a voltage applied to the second cell contact 160_2 is described still with reference to FIG. 8B. In FIG. 8B, the transfer path of a voltage applied to the second cell contact 160_2 is schematically indicated by the arrows. Even when the dam structure 175 that surrounds the first cell contact 160_1 and insulates the first cell contact 160_1 from the second gate electrode 130_2 is located, the dam structure 175 may not completely cut the second gate electrode 130_2. In example embodiments, the dam structure 175 may not completely cut the second extension portion 130E_2 in the second horizontal direction (the Y direction). Therefore, even when the nonvolatile memory device 100 includes the dam structure 175, transfer of voltage in the first horizontal direction (the X direction) of the second gate electrode 130_2 is not cut off. That is, the voltage applied to the second cell contact 1602 may be transferred to the second gate electrode 130_2 through the second pad portion 130P_2 contacting the second cell contact 160_2, and for example, may be transferred along the second extension portion 130E_2 in the first horizontal direction (the X direction).

As illustrated in FIG. 8C, the first cell contact 160_1 and the second cell contact 160_2 may pass through the third gate electrode 130_3. The first cell contact 160_1 and the second cell contact 160_2 may pass through the third extension portion 130E_3 and may not be electrically connected to the third gate electrode 130_3. In example embodiments, the first cell contact 160_1 and the second cell contact 160_2 may be apart from the third gate electrode 130_3 and with the dam structure 175 therebetween.

In some embodiments, as described above with reference to FIG. 8A, each of the support structures 170 may be located in the first hole 170H and may surround the first cell contact 160_1 and the second cell contact 160_2.

In some embodiments, the dam structure 175 may have a shape surrounding each of the first cell contact 160_1 and the second cell contact 1602 planarly and may be located between the first cell contact 160_1 and the third gate electrode 130_3 and between the second cell contact 160_2 and the third gate electrode 130_3.

Similar to that described above with reference to FIG. 8B, the first hole 170H in which the support structure 170 is disposed may elongate in the vertical direction (the Z direction), while the second hole 175H in which the dam structure 175 is disposed may extend in the vertical direction (the Z direction) in the third gate electrode 1303, and the radius of the second hole 175H may be greater than that of the first hole 170H.

Similar to the description above with reference to FIG. 8B, the dam structure 175 located at the same vertical level as that of the third gate electrode 130_3 may be apart from the first cell contact 160_1 and the second cell contact 160_2 with the insulating ring 164 therebetween.

Referring back to FIG. 7 and FIGS. 8A to 8C, the thickness of the pad portion in the vertical direction (the Z direction) may be greater than the thickness of the extension portion in the vertical direction (the Z direction). For example, the thickness of the second pad portion 130P_2 in the vertical direction (the Z direction) may be greater than the thickness of the second extension portion 130E_2 in the vertical direction (the Z direction). That is, the vertical thickness of the dam structure 175 may be less than or equal to the vertical thickness of the second gate electrode 130_2. In some embodiments, the thickness of the pad portion in the vertical direction (the Z direction) may be greater than the thickness of the dam structure 175 in the vertical direction (the Z direction). In some embodiments, the thickness of the pad portion in the vertical direction (the Z direction) may be greater than the thickness of the insulating ring 164 in the vertical direction (the Z direction).

In some embodiments, the dam structure 175 (refer to FIG. 8B) located between the first cell contact 160_1 and the second gate electrode 130_2 may overlap the dam structure 175 (refer to FIG. 8C) located between the first cell contact 160_1 and the third gate electrode 130_3 in the vertical direction (the Z direction).

In some embodiments, an oxide liner 173 may be located between the dam structure 175 and the mold insulating layer 132, between the dam structure 175 and the gate electrodes 130_1, 130_2, and 130_3, and between the dam structure 175 and the insulating ring 164. The oxide liner 173 along with the dam structure 175 may insulate between the first cell contact 160_1 and the second gate electrode 130_2, between the first cell contact 160_1 and the third gate electrode 130_3, and between the second cell contact 160_2 and the third gate electrode 130_3.

In some embodiments, as the dam structure 175 is located between the first cell contact 160_1 and the second gate electrode 130_2 that is not electrically connected to the first cell contact 160_1, insulation performance between the first cell contact 160_1 and the second gate electrode 130_2 may be improved. Similarly, as the dam structure 175 is located between the first cell contact 160_1 and the third gate electrode 130_3 that is not electrically connected to the first cell contact 160_1, insulation performance between the first cell contact 160_1 and the third gate electrode 130_3 may be improved. Similarly, as the dam structure 175 is located between the second cell contact 160_2 and the third gate electrode 130_3 that is not electrically connected to the second cell contact 160_2, insulation performance between the second cell contact 160_2 and the third gate electrode 130_3 may be improved. That is, a nonvolatile memory device having improved performance and reliability may be provided. That is, an electronic system having improved performance and reliability may be provided.

Figure 10:
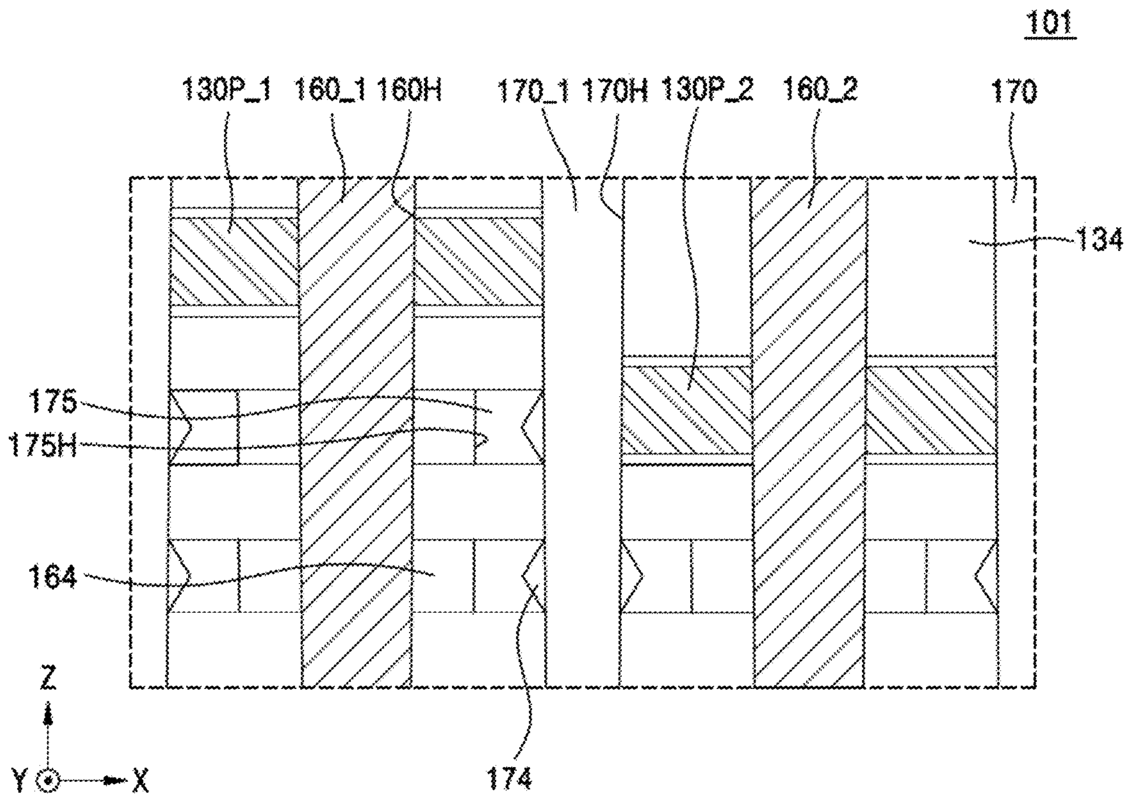
FIGS. 10, 11 and 12 are enlarged cross-sectional views illustrating a nonvolatile memory device according to example embodiments.
Figure 11:
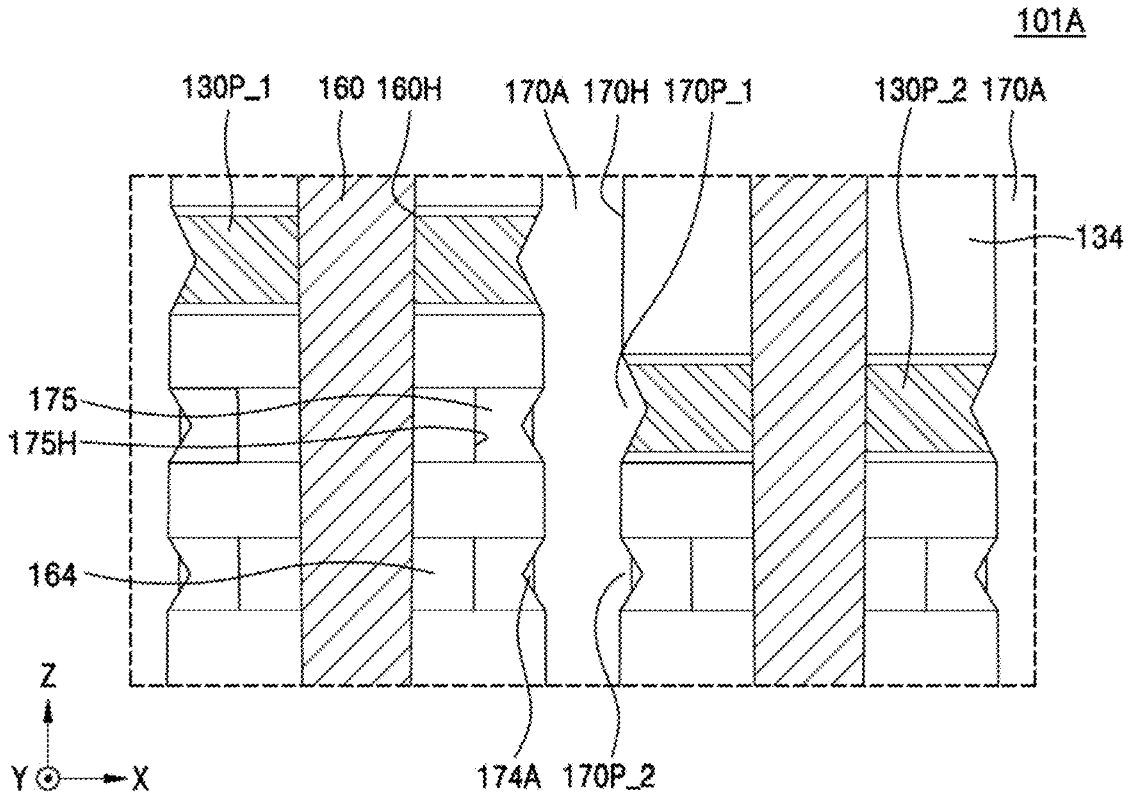
Figure 12:
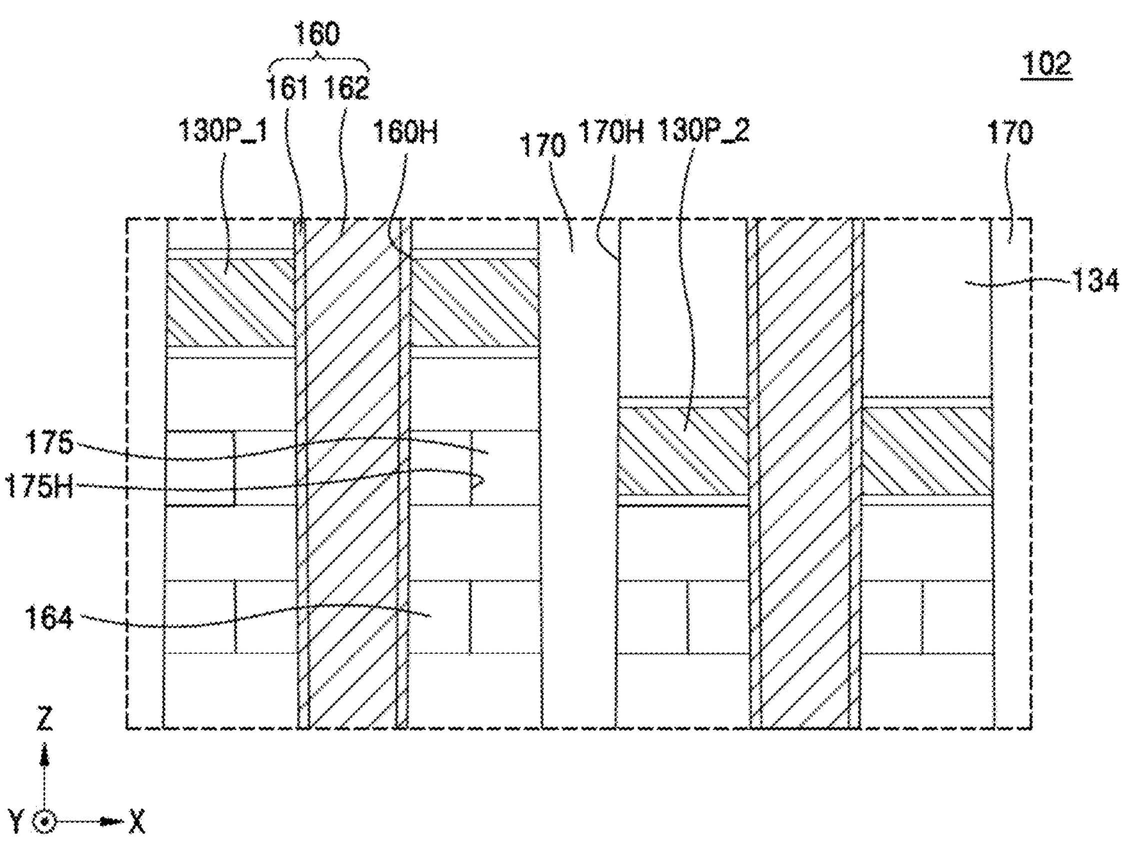

FIGS. 10 to 12 are enlarged cross-sectional views illustrating nonvolatile memory devices 101, 101A, and 102 according to example embodiments. In detail, FIGS. 10 to 12 are enlarged cross-sectional views illustrating other embodiments of the nonvolatile memory device 100 described above with reference to FIGS. 3 to 9. Hereinafter, the differences from the nonvolatile memory device 100 are mainly described.

Referring to FIG. 10, a nonvolatile memory device 101 may further include a subring 174 located between the dam structure 175 and the support structure 170. The subring 174 may have a ring shape surrounding at least a portion of the support structure 170. The subring 174 may include at least one selected from silicon nitride and silicon oxynitride.

For example, a first support structure 170_1 located between the first cell contact 160_1 and the second cell contact 160_2 may not be completely surrounded by the subring 174 at the same vertical level as that of the second gate electrode 130_2. At the same vertical level as that of the second gate electrode 130_2, a portion of the first support structure 170_1 is surrounded by the first subdam 175S_1 (refer to FIG. 8B), while the other portion is not surrounded by the dam structure 175. That is, only a portion of the first support structure 170_1 surrounded by the first subdam 175S_1 may be surrounded by the subring 174. The subring 174 surrounding a portion of the first support structure 170_1 may have a ring shape cut in half.

In some embodiments, the subring 174 is located between the dam structure 175 and the support structure 170 so that the dam structure 175 may be apart from the support structure 170, rather than being in contact therewith. In some other embodiments, even when the nonvolatile memory device 101 further includes the subring 174 located between the dam structure 175 and the support structure 170, if the subring 174 does not completely surround the support structure 170, the dam structure 175 may contact the support structure 170.

Referring to FIG. 11, a nonvolatile memory device 101A may include a support structure 170A having first and second protrusions 170P_1 and 170P_2. In example embodiments, the support structure 170A may include the first protrusion 170P_1 protruding into the pad portion 130P. For example, the protrusion 170P_1 may have a triangular cross-section and may surround a portion of the support structure 170A planarly. In example embodiments, the support structure 170A may include the second protrusion 170P_2 protruding into the dam structure 175. For example, the second protrusion 170P_2 may have a rectangular cross-section and may surround at least a portion of the support structure 170A planarly.

In some embodiments, when the support structure 170A of the nonvolatile memory device 101A includes the second protrusion 170P_2, the subring 174A may be located between the dam structure 175 and the second protrusion 170P_2.

Unlike those shown in some other embodiments, the second protrusion 170P_2 of the support structure 170A may have a triangular cross-section, and the subring 174A may not be located between the second protrusion 170P_2 and the dam structure 175.

Referring to FIG. 12, the cell contact 160 of the nonvolatile memory device 102 may include a buried conductive layer 162 passing through the gate electrodes 130 and extending in the vertical direction (the Z direction) and a conductive barrier layer 161 surrounding side and bottom surfaces of the buried conductive layer. For example, the buried conductive layer 162 may include a metal such as tungsten, nickel, cobalt, or tantalum, a metal silicide such as tungsten silicide, nickel silicide, cobalt silicide, or tantalum silicide, doped polysilicon, or combinations thereof. In some embodiments, the conductive barrier layer 161 may include titanium nitride, tantalum nitride, tungsten nitride, or combinations thereof.

Figure 16:
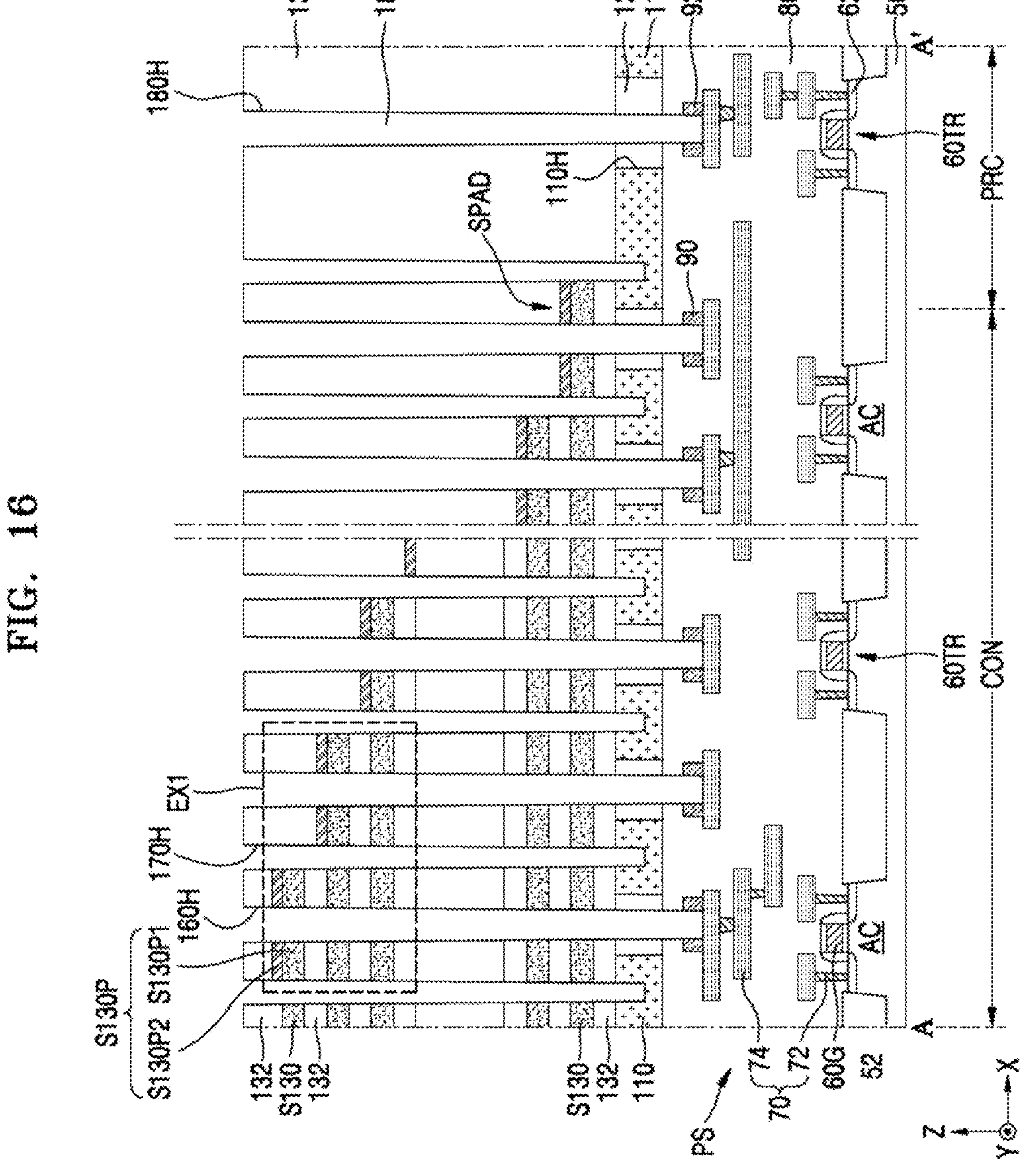
Figure 17A:
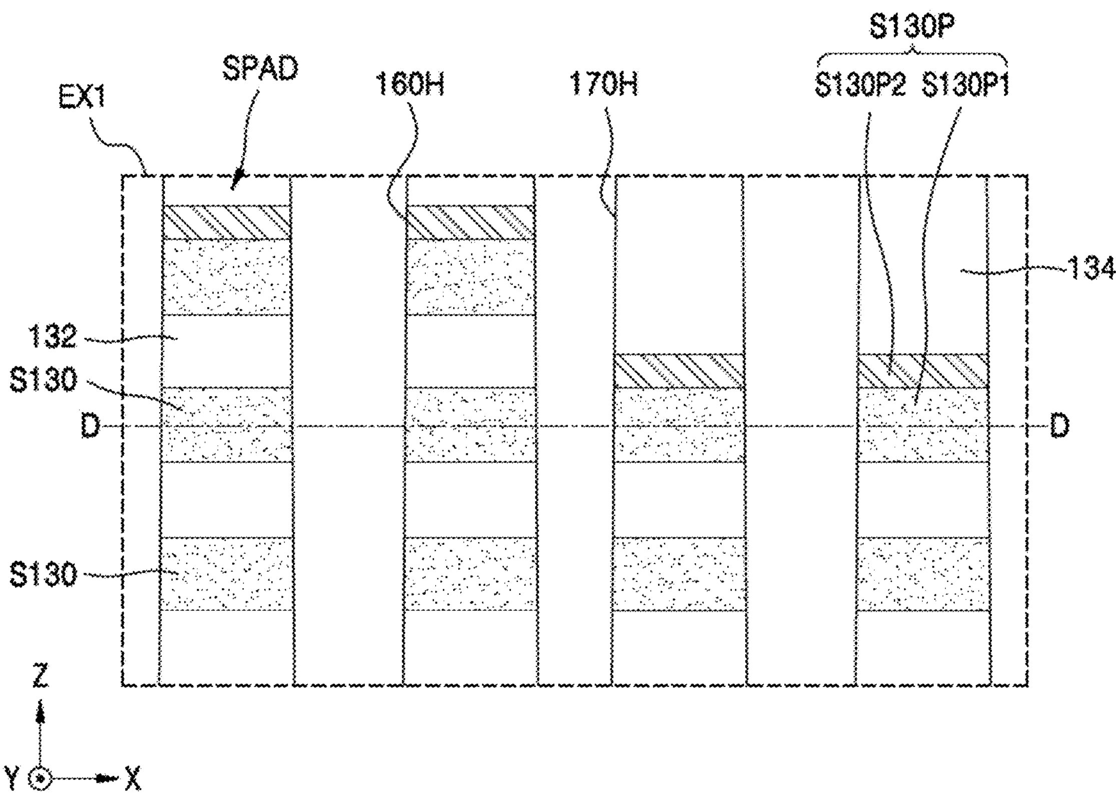
FIGS. 17A, 17B, 18A, 18B, 19A, 19B, 20A, 20B, 21A, 21B, 22A, 22B, 23A, 23B, 24A, 24B, 25A, 25B, 26A, 26B, 27A, 27B, 28A and 28B are cross-sectional views illustrating a method of manufacturing a nonvolatile memory device, according to example embodiments.
Figure 17B:
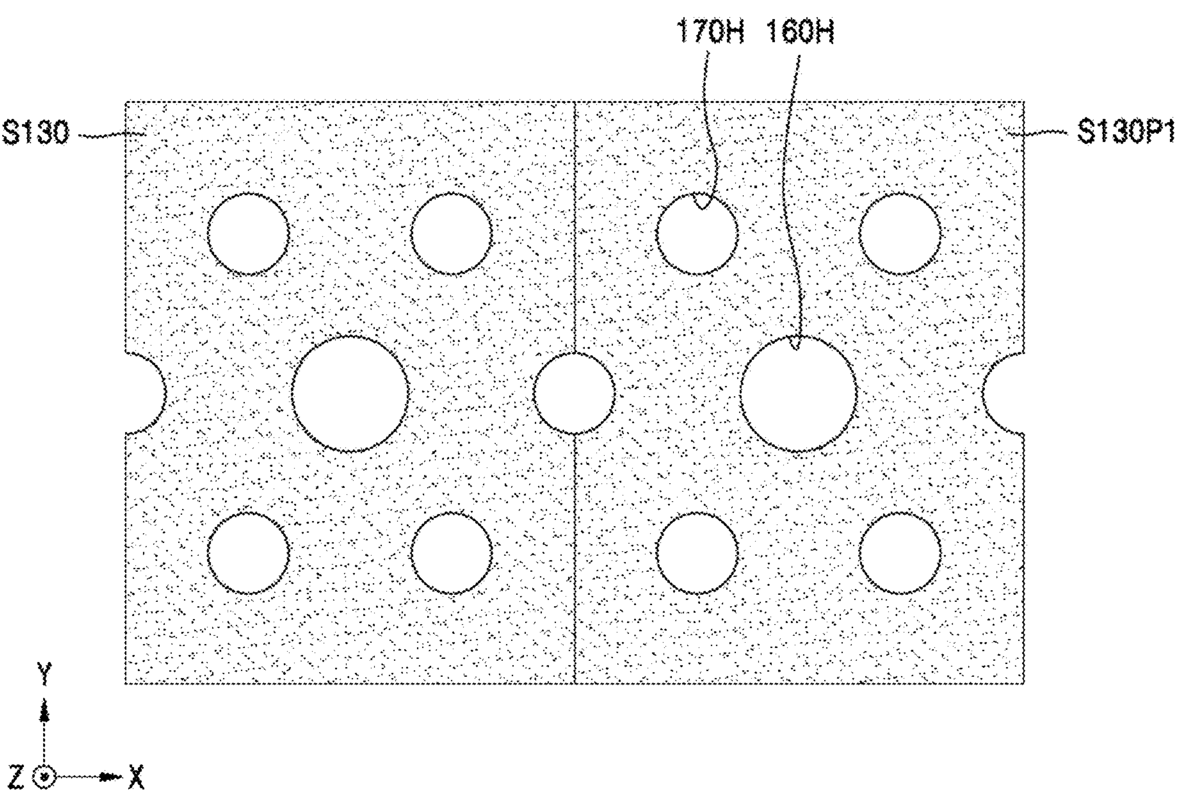

FIGS. 13 to 16 and FIGS. 17A to 28B are cross-sectional views illustrating a method of manufacturing the nonvolatile memory device 100 according to example embodiments. In detail, FIG. 17A is an enlarged cross-sectional view of region EX1 in FIG. 16, and FIG. 17B is a plan view at a vertical level taken along line D-D in FIG. 17A. FIGS. 18A, 19A, 20A, 21A, 22A, 23A, 24A, 25A, 26A, 27A, and 28A are cross-sectional views illustrating a method of manufacturing the nonvolatile memory device 100, subsequent to FIG. 17A, and are enlarged cross-sectional views corresponding to region EX1 of FIG. 16. In detail, FIGS. 18B, 19B, 20B, 21B, 22B, 23B, 24B, 25B, 26B, 27B, and 28B are plan views at the vertical level taken along line D-D of FIGS. 18A, 19A, 20A, 21A, 22A, 23A, 24A, 25A, 26A, 27A, and 28A.

Figure 13:
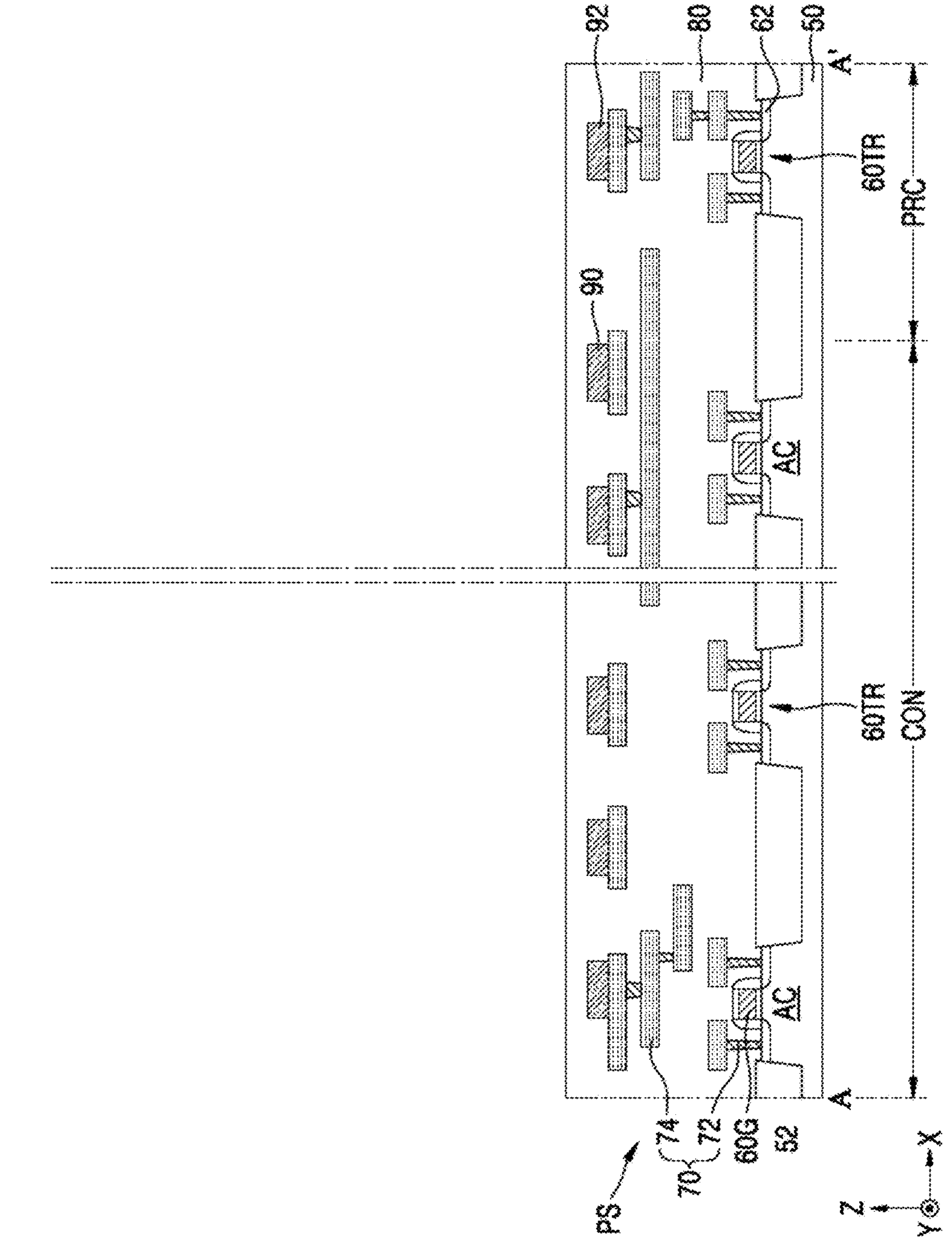

Referring to FIG. 13, a peripheral circuit structure PS may be formed on the substrate 50. In embodiments, the substrate 50 may be a monocrystalline silicon substrate. The peripheral circuit transistors 60TR may be formed on the substrate 50, and the peripheral circuit interconnection structure 70 and the interlayer insulating layer 80 electrically connected to the peripheral circuit transistors 60TR may be formed.

The first and second conductive landing vias 90 and 92 may be further formed on the uppermost peripheral circuit interconnection layer 74 in the peripheral circuit connection region PRC. For example, the first and second conductive landing vias 90 and 92 may be formed using polysilicon doped with n-type impurities. Upper surfaces of the first and second conductive landing vias 90 and 92 may be covered by the interlayer insulating layer 80.

Figure 14:
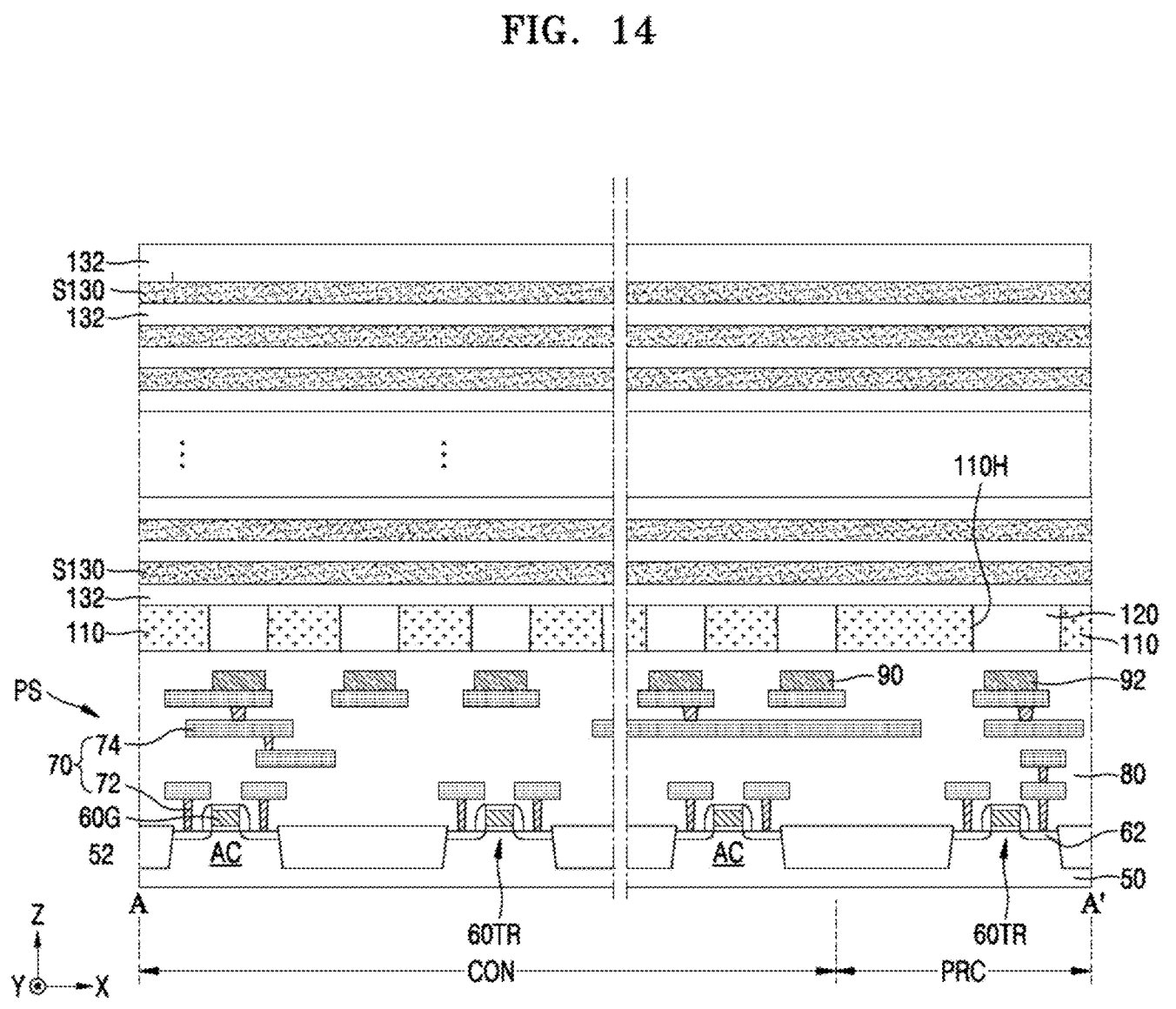

Referring to FIG. 14, the common source plate 110 may be formed on the interlayer insulating layer 80. In some embodiments, the common source plate 110 may be formed using a semiconductor doped with n-type impurities.

Thereafter, a mask pattern (not shown) may be formed on the common source plate 110 and a portion of the common source plate 110 may be removed using the mask pattern as an etch mask to form the opening 110H. The opening 110H may be formed in a region vertically overlapping at least a portion of the connection region CON and the peripheral circuit connection region PRC.

Thereafter, an insulating layer (not shown) is formed on the common source plate 110 to fill the opening 110H, and an upper portion of the insulating layer may be planarized so that the upper surface of the common source plate 110 is exposed, to form the insulating plug 120.

Thereafter, the mold insulating layers 132 and a plurality of sacrificial layers S130 may be alternately formed on the common source plate 110. In embodiments, the mold insulating layers 132 may include an insulating material, such as silicon oxide or silicon oxynitride, and the sacrificial layers S130 may include silicon nitride, silicon oxynitride, or polysilicon doped with impurities.

Figure 15:
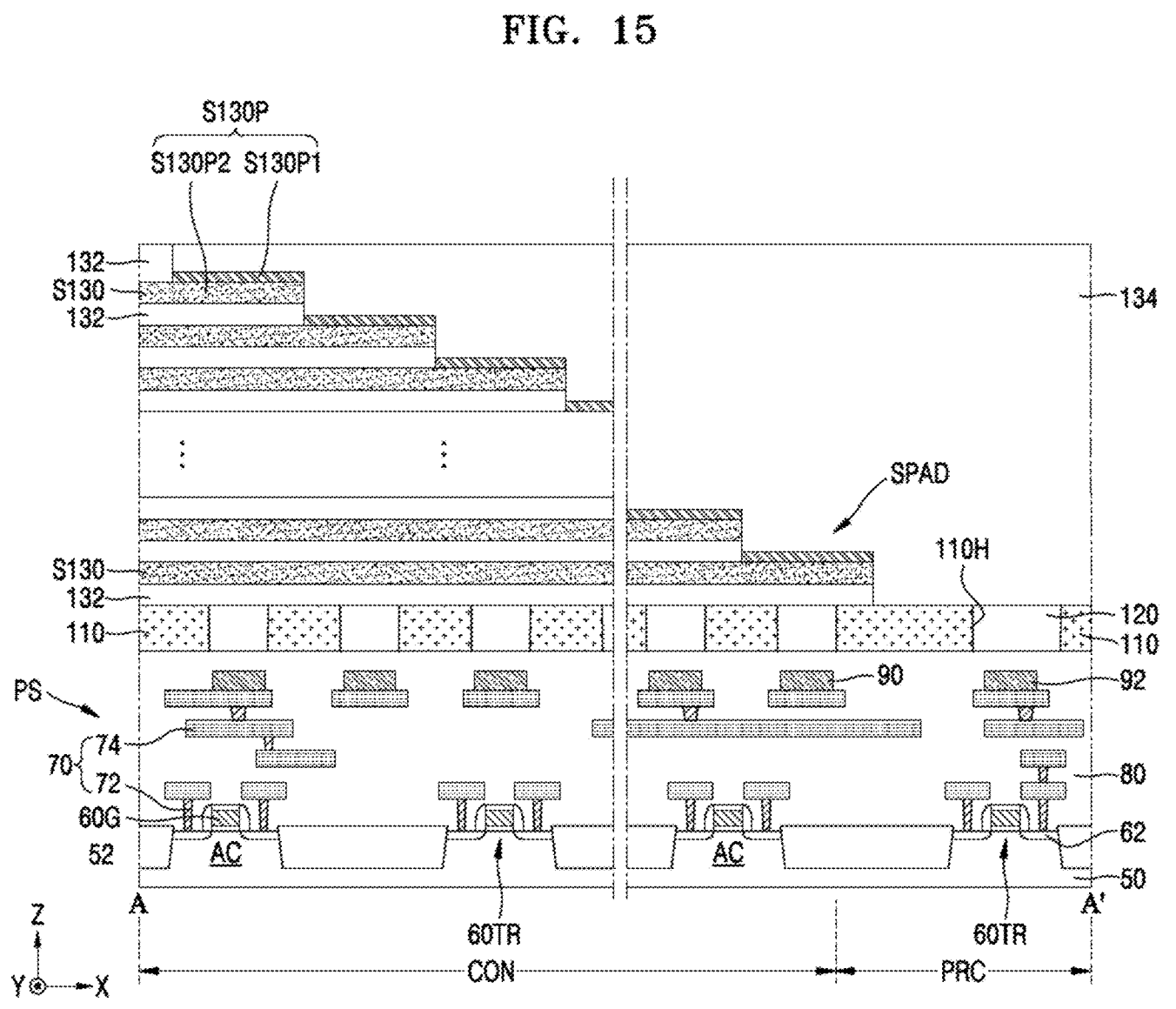

Referring to FIG. 15, the mold insulating layers 132 and the sacrificial layers S130 may be sequentially patterned to form a preliminary pad structure SPAD in the connection region CON.

In some embodiments, the preliminary pad structure SPAD may be formed to have a step shape having a difference in upper surface level in the first horizontal direction (the X direction) (refer to FIG. 4). For example, the preliminary pad structure SPAD may include a plurality of preliminary pad portions S130P, and each of the preliminary pad portions S130P may include a first preliminary pad layer S130P1 and a second preliminary pad layer (S130P2).

In some embodiments, the first preliminary pad layer S130P1 may indicate an end portion of the sacrificial layers S130, and accordingly, the first preliminary pad layer S130P1 may include the same first insulating material as that of the sacrificial layers S130. The second preliminary pad layer S130P2 may include a material having etch selectivity with respect to the first preliminary pad layer S130P1.

For example, the first preliminary pad layer S130P1 and the second preliminary pad layer S130P2 may include at least one of silicon nitride, silicon oxynitride, silicon oxide, silicon carbide, SiOC, spin-on hard mask (SOH), and polysilicon, but is not limited thereto. In some embodiments, the first preliminary pad layer S130P1 may include silicon nitride, and the second preliminary pad layer S130P2 may include silicon oxynitride.

Thereafter, the cover insulating layer 134 covering the preliminary pad structure SPAD may be formed. The cover insulating layer 134 may include an insulating material, such as silicon oxide or silicon oxynitride.

Referring to FIG. 16, the first holes 170H passing through the cover insulating layer 134, the sacrificial layers S130, and the mold insulating layers 132 may be formed in the connection region CON. The first hole 170H may pass through the preliminary pad structure SPAD.

In addition, a mask pattern (not shown) may be formed in the connection region CON, and the cell contact hole 160H passing through the preliminary pad structure SPAD and the insulating plug 120 may be formed using the mask pattern as an etch mask. Also, the through-hole 180H passing through the cover insulating layer 134 and the insulating plug 120 may be formed using the mask pattern as an etch mask in the peripheral circuit connection region PRC.

In some embodiments, the cell contact hole 160H may pass through the preliminary pad portion S130P and may pass through the sacrificial layers S130 and the mold insulating layers located at a vertical level lower than that of the preliminary pad portion S130P to extend in the vertical direction (the Z direction). The cell contact hole 160H may extend in the vertical direction (the Z direction) from the upper surface of the uppermost mold insulating layer 132 to the bottom surface of the insulating plug 120, and extend into the interlayer insulating layer 80 to expose the upper surface of the first conductive landing via 90.

Referring to FIGS. 17A and 17B together, the first holes 170H may be arranged to surround the cell contact hole 160H planarly. The first hole 170H may pass through the sacrificial layer S130 and the preliminary pad portion S130P.

Figure 18A:
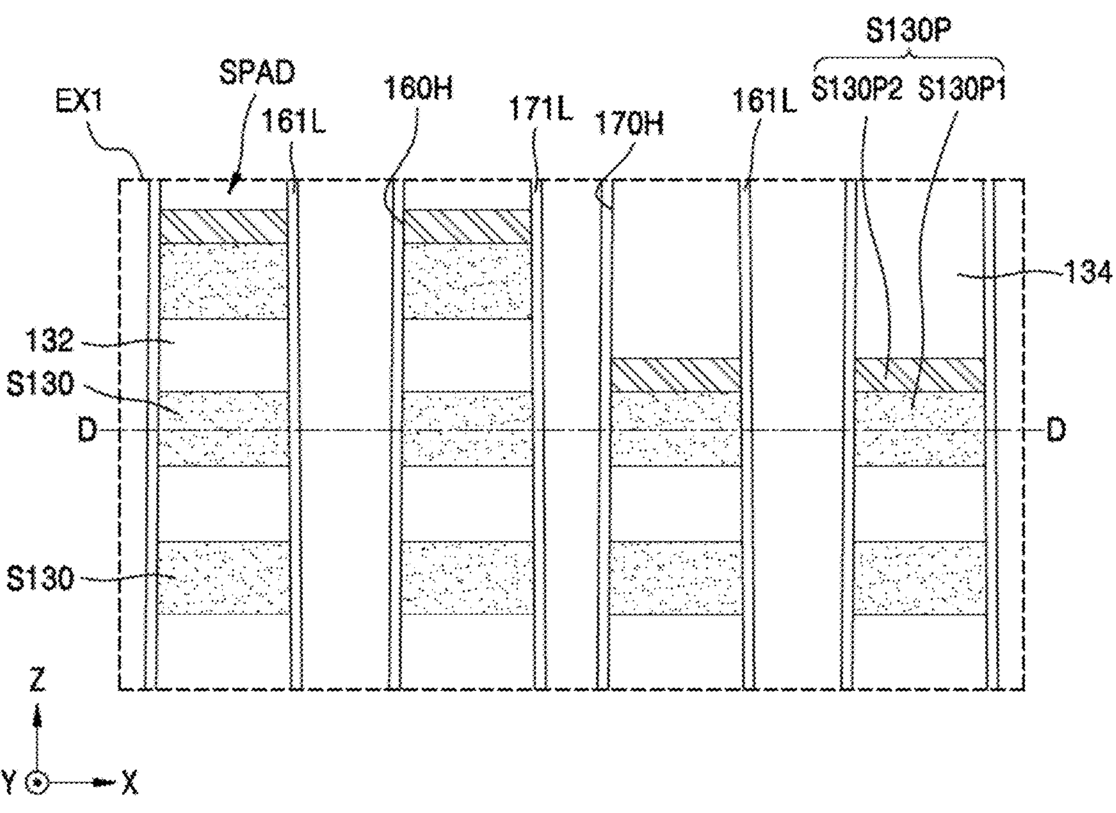
Figure 18B:
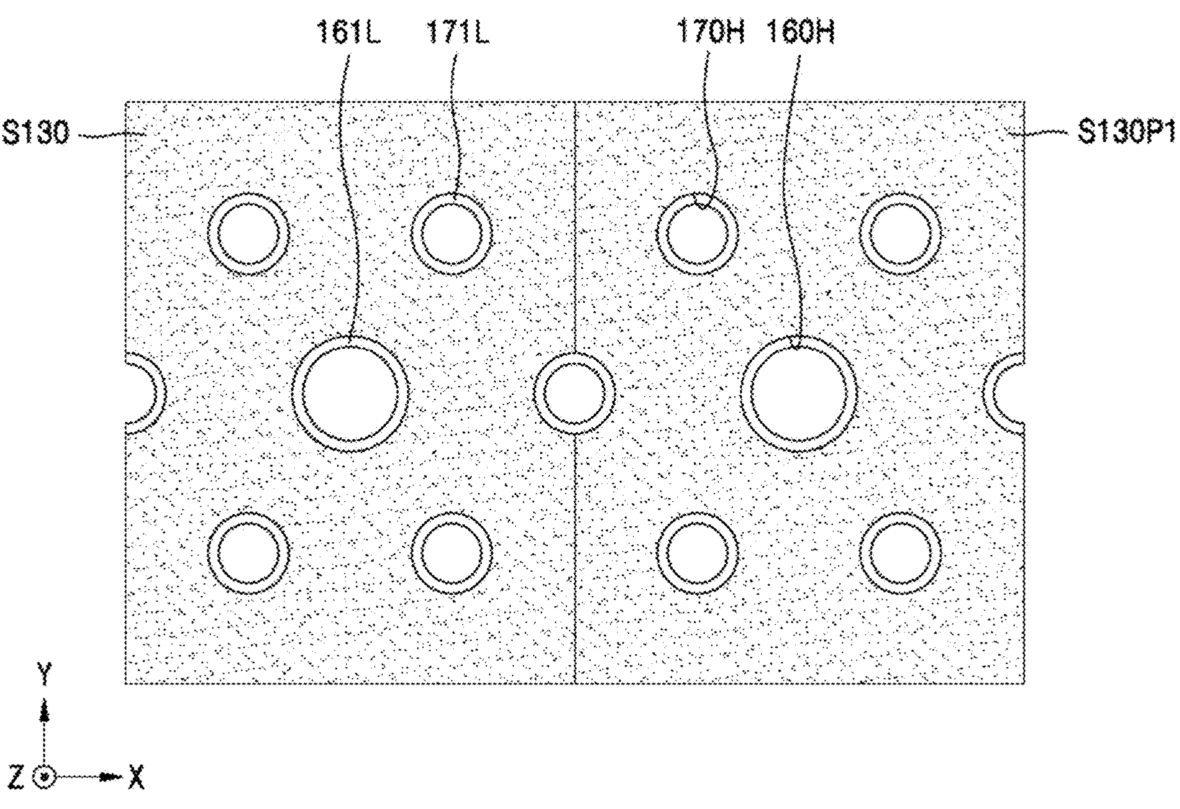

Referring to FIGS. 18A and 18B together, a first liner 161L may be formed on an inner wall of the cell contact hole 160H, and a second liner 171L may be formed on an inner wall of the first hole 170H. The first liner 161L and the second liner 171L may be formed through the same process. Each of the first liner 161L and the second liner 171L may include at least one selected from silicon oxide and silicon nitride. For example, the first liner 161L may include a first oxide liner (not shown) disposed on the inner wall of the cell contact hole 160H and a first nitride liner (not shown) disposed on the first oxide liner. For example, the second liner 171L may include a second oxide liner (not shown) disposed on the inner wall of the first hole 170H and a second nitride liner (not shown) disposed on the second oxide liner.

Figure 19A:
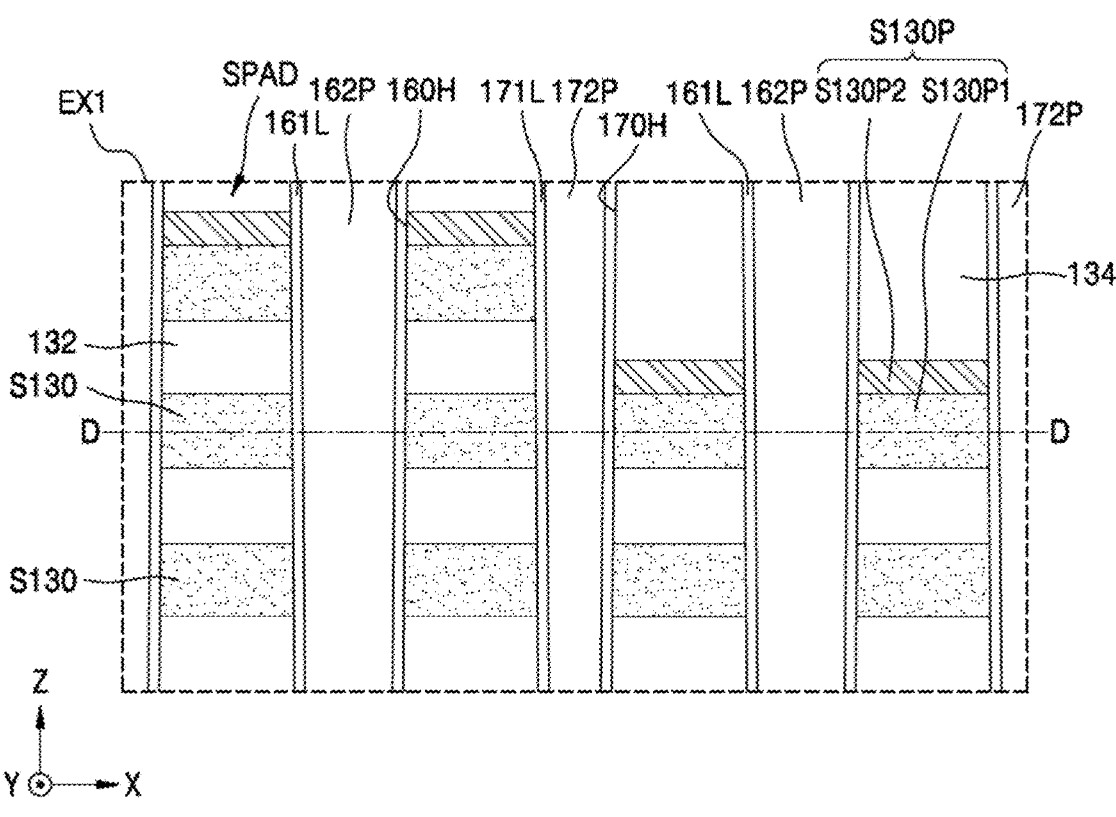
Figure 19B:
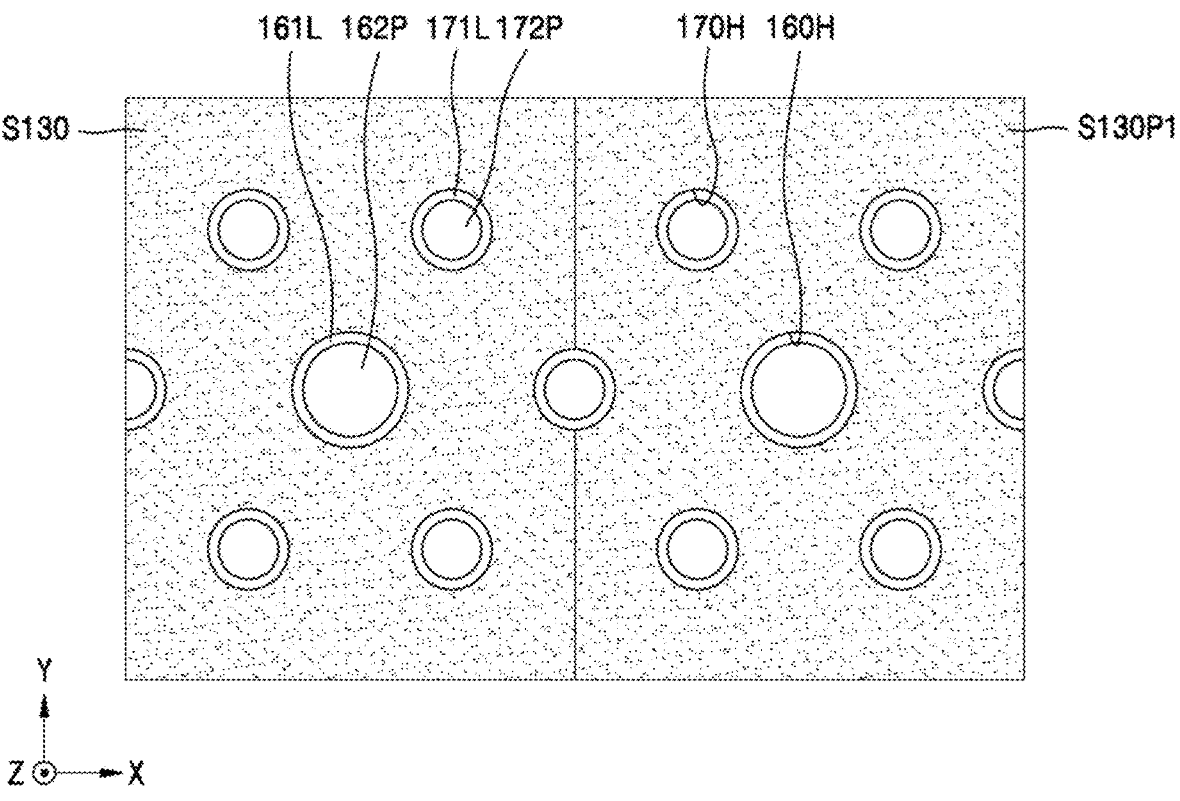

Referring to FIGS. 19A and 19B together, a first buried sacrificial layer 162P filling the cell contact hole 160H may be formed, and a second buried sacrificial layer 172P filling the first hole 170H may be formed. The first buried sacrificial layer 162P and the second buried sacrificial layer 172P may be formed through the same process. The first buried sacrificial layer 162P may be formed on the first liner 161L in the cell contact hole 160H. The second buried sacrificial layer 172P may be formed on the second liner 171L in the first hole 170H. The first buried sacrificial layer 162P and the second buried sacrificial layer 172P may include polysilicon.

Figure 20A:
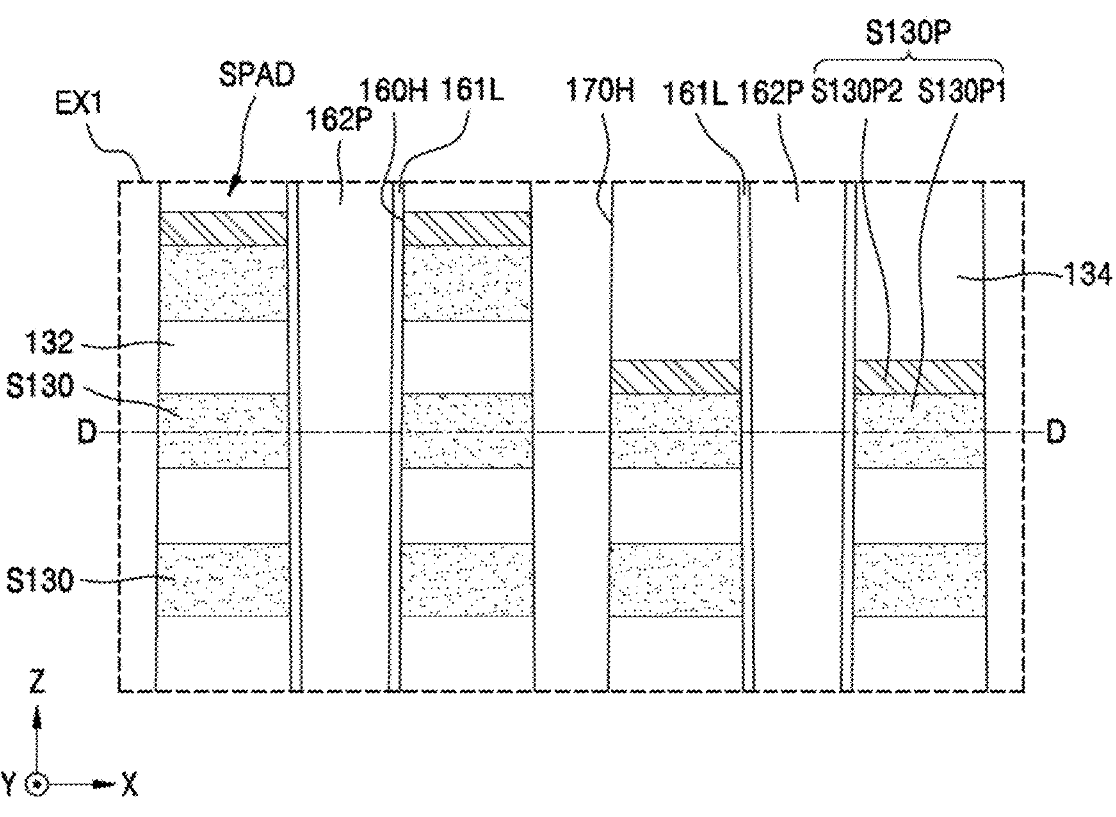
Figure 20B:
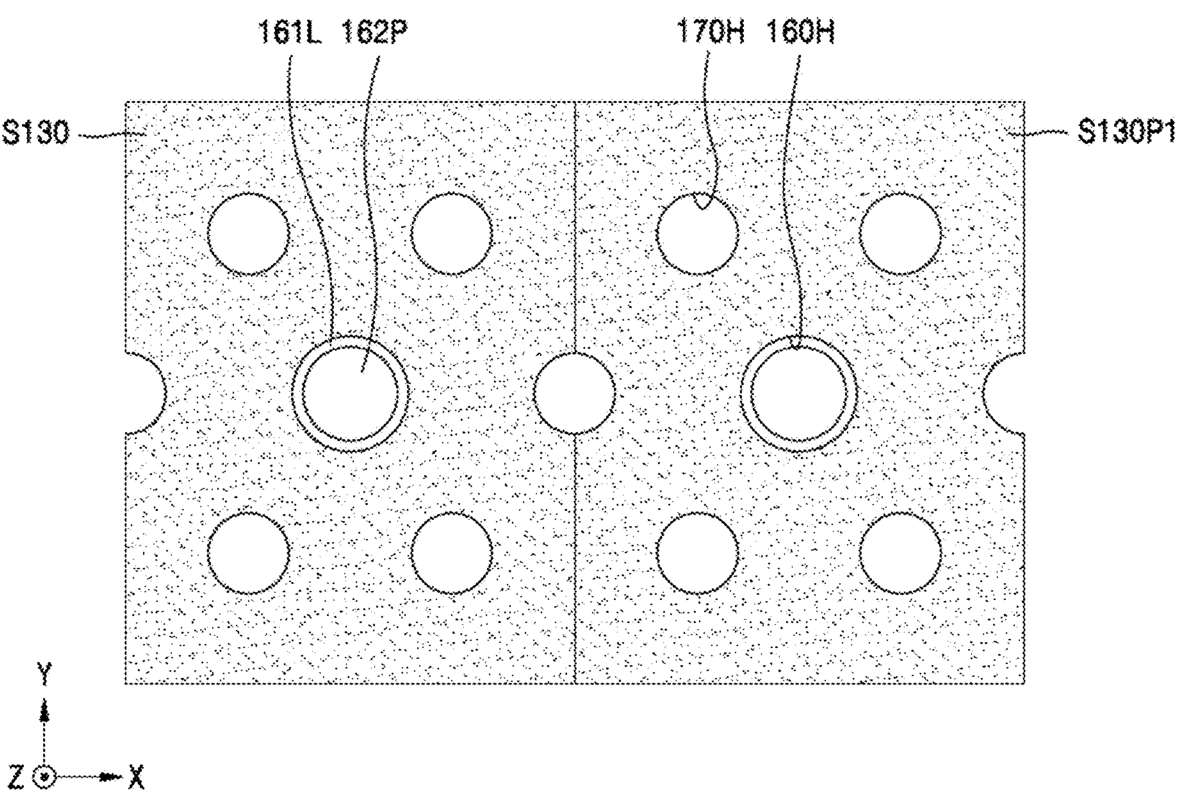

Referring to FIGS. 20A and 20B together, the second liner 171L and the second filling sacrificial layer 172P in the first hole 170H may be removed. For example, a mask pattern (not shown) exposing the first hole 170H may be formed, and the second buried sacrificial layer 172P and the second liner 171L may be sequentially removed. For example, when the second liner 171L includes the second oxide liner and the second nitride liner, the second oxide liner may be removed after the second nitride liner is removed. The process of removing the second buried sacrificial layer 172P and the second liner 171L may be performed through, for example, a wet etching process.

Figure 21A:
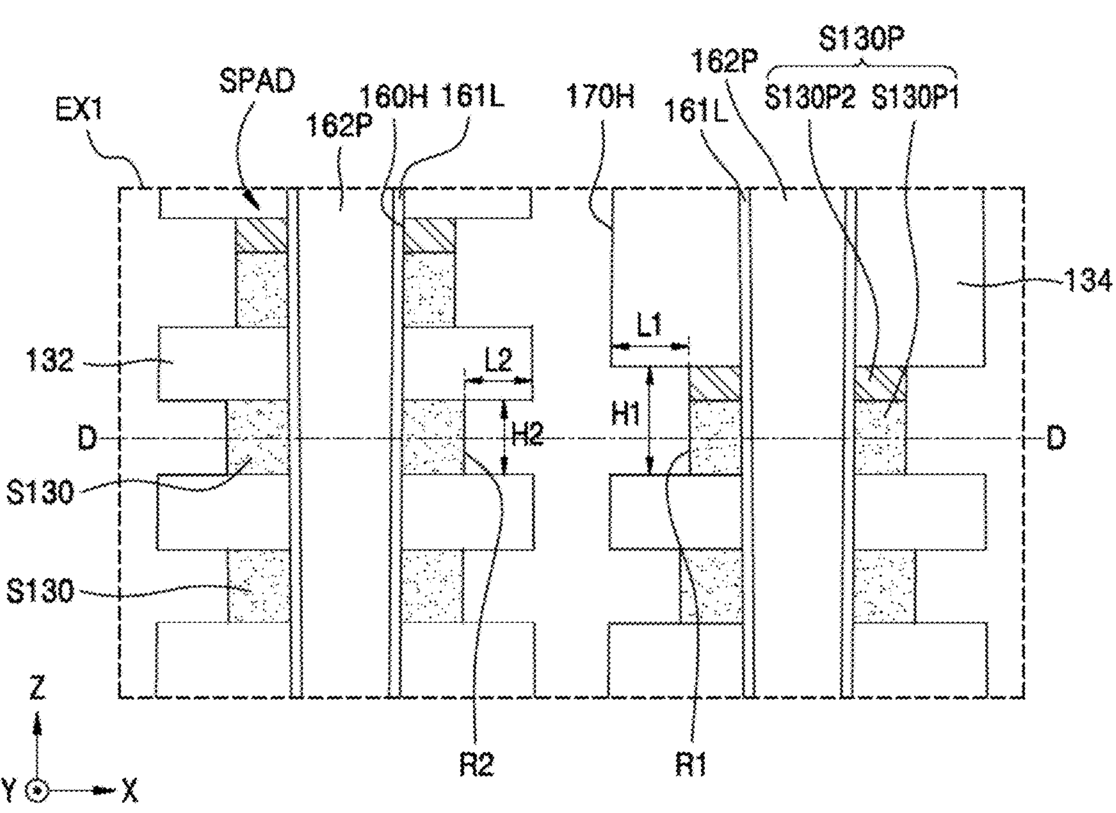
Figure 21B:
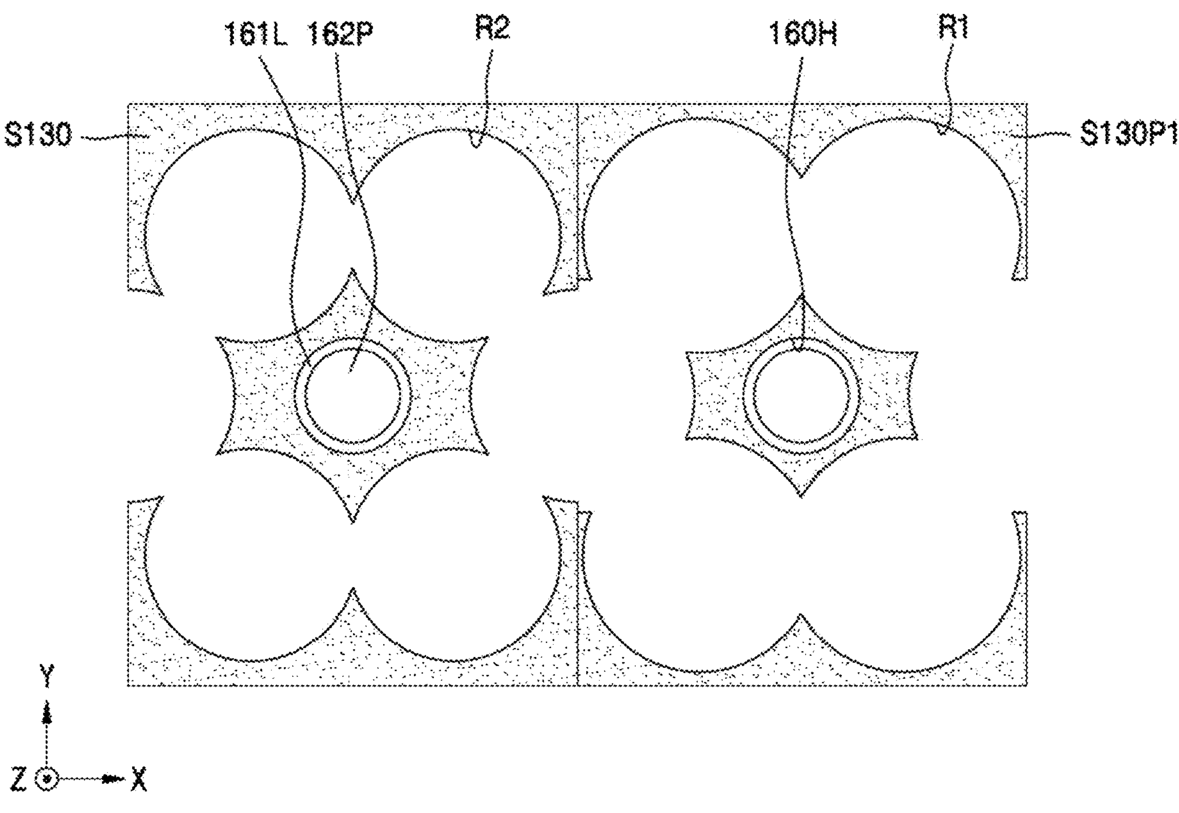

Referring to FIGS. 21A and 21B together, a portion of the preliminary pad portion S130P exposed from the inner wall of the first hole 170H may be removed to form a first recess portion R1, and a portion of the sacrificial layer S130 exposed from the inner wall of the first hole 170H may be removed to form a second recess portion R2.

In some embodiments, the process of forming the first recess portion R1 and the second recess portion R2 may be an etching process using an etchant including phosphoric acid ($HPO_3$). In some embodiments, the first recess portion R1 may be formed to have a width larger than that of the second recess portion R2. For example, a width L1 of the first recess portion R1 in the first horizontal direction (the X direction) may be larger than a width L2 of the second recess portion R2 in the first horizontal direction (the X direction). In some embodiments, a height H1 of the first recess portion R1 may be greater than a height H2 of the second recess portion R2.

Figure 22A:
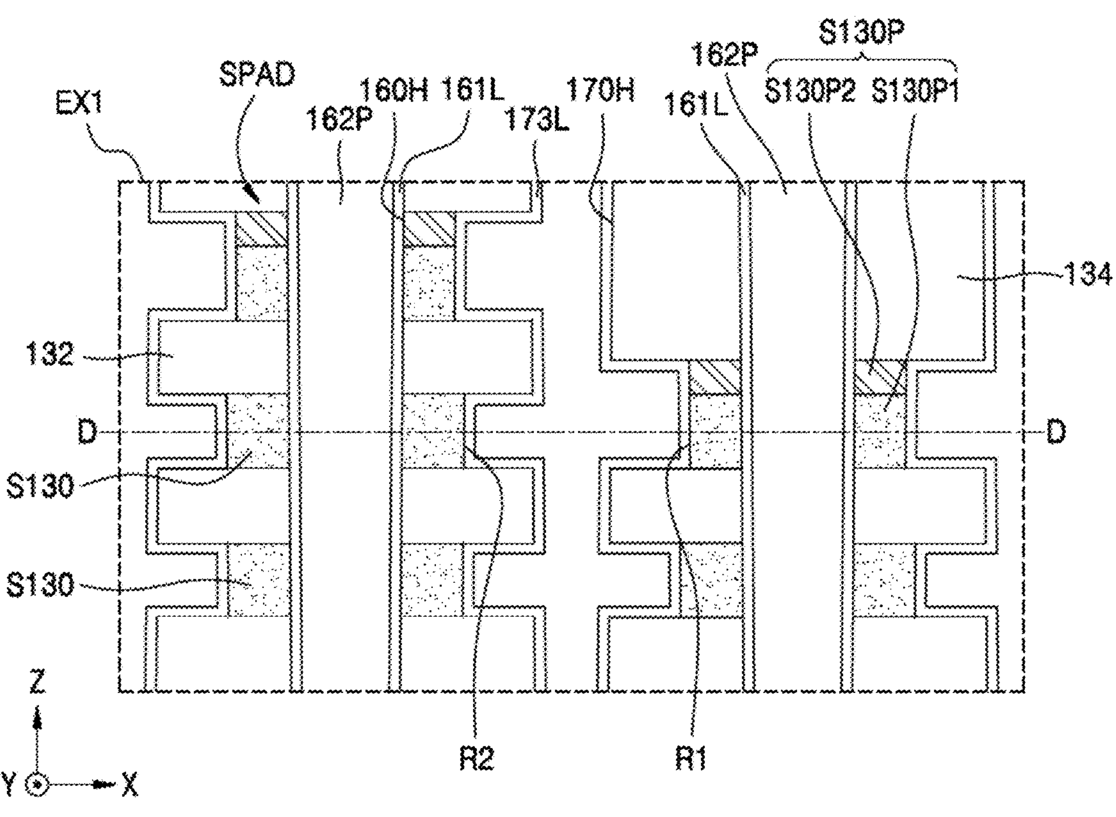
Figure 22B:
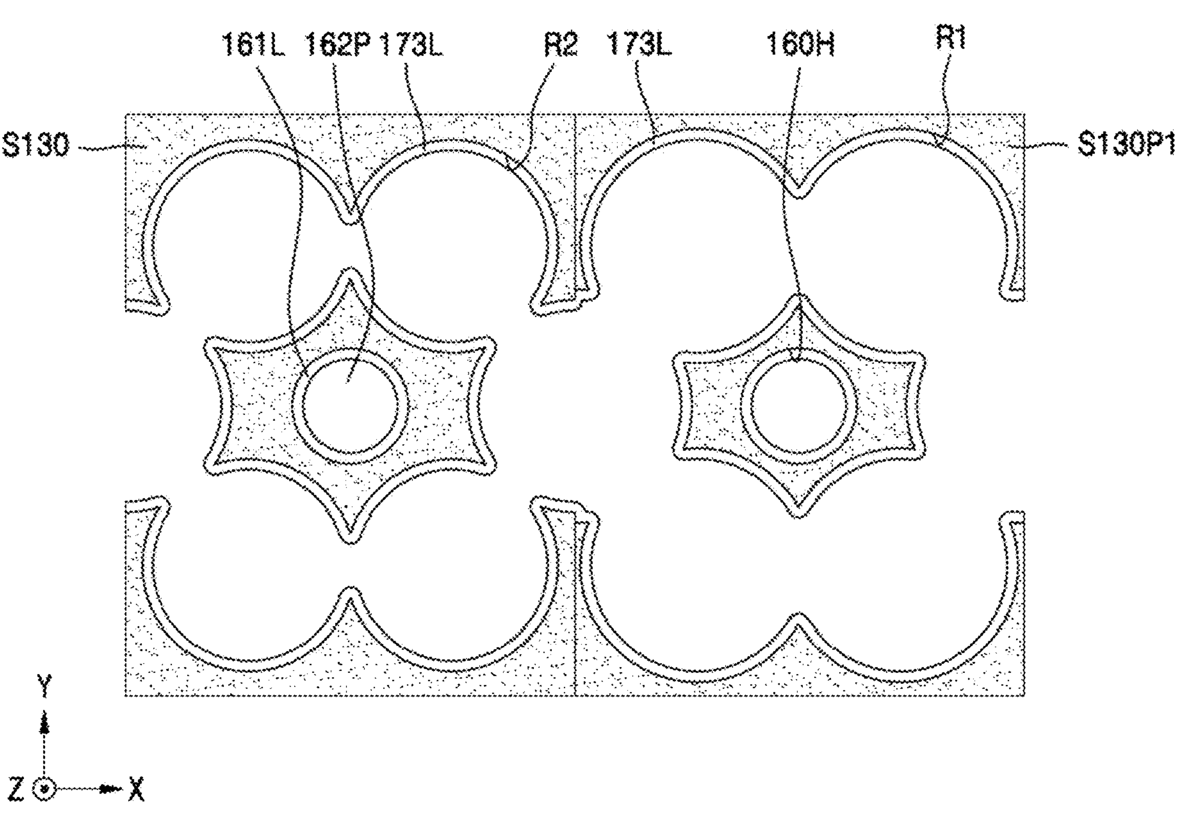

Referring to FIGS. 22A and 22B together, a third liner 173L may be formed on inner walls of the first hole 170H, the first recess portion R1, and the second recess portion R2. In some embodiments, the third liner 173L may be formed by conformally applying silicon oxynitride on the inner walls of the first hole 170H, the first recess portion R1, and the second recess portion R2 and subsequently performing an oxidation process thereon. For example, the third liner 173L may include silicon oxide. In some embodiments, the third liner 173L may not completely fill the first recess portion R1 and the second recess portion R2.

Figure 23A:
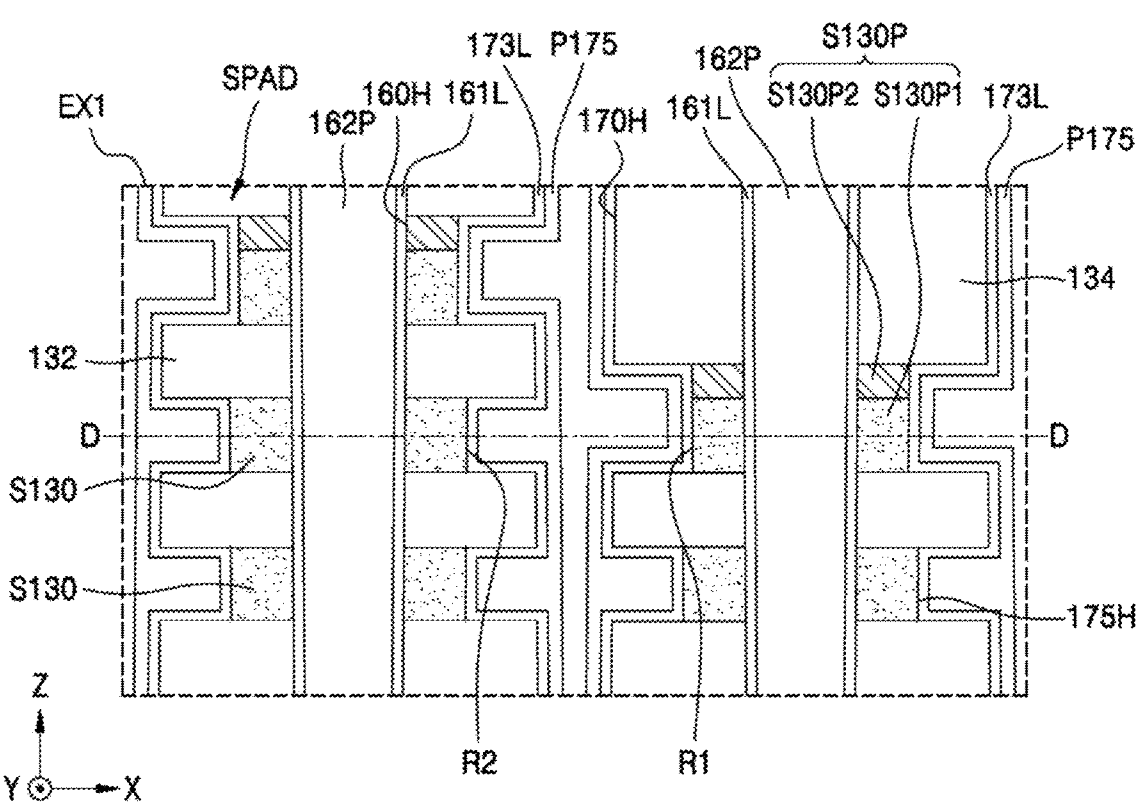
Figure 23B:
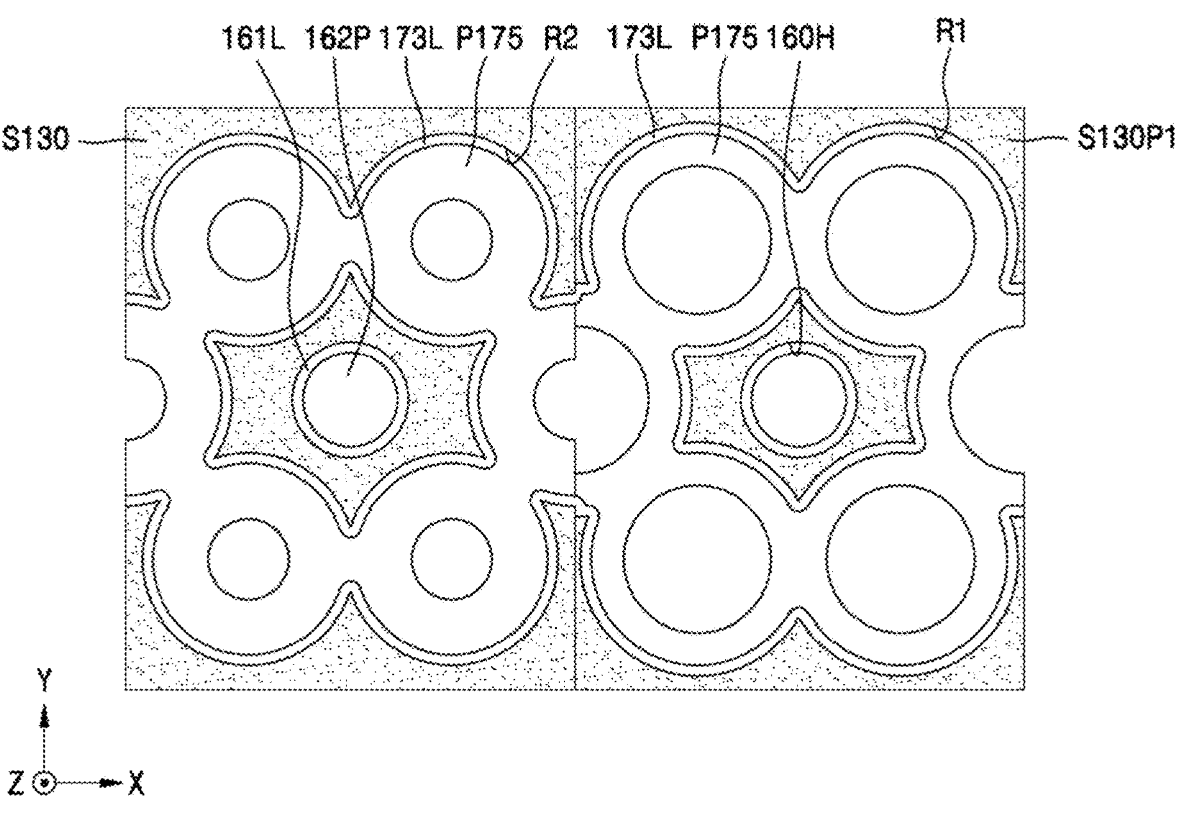

Referring to FIGS. 23A and 23B together, a pre-dam liner P175 may be formed on the third liner 173L. In example embodiments, the pre-dam liner P175 may be formed on the third liner 173L on the inner walls of the first hole 170H and the first recess portion R1. In example embodiments, the pre-dam liner P175 may fill even the second recess portion R2 on the third liner 173L. For example, because a width of the second recess portion R2 may be smaller than a width of the first recess portion R1, the pre-dam liner P175 may fill the second recess portion R2 while the pre-dam liner P175 may not fill the first recess portion R1. In some embodiments, the pre-dam liner P175 may include silicon oxide.

Figure 24A:
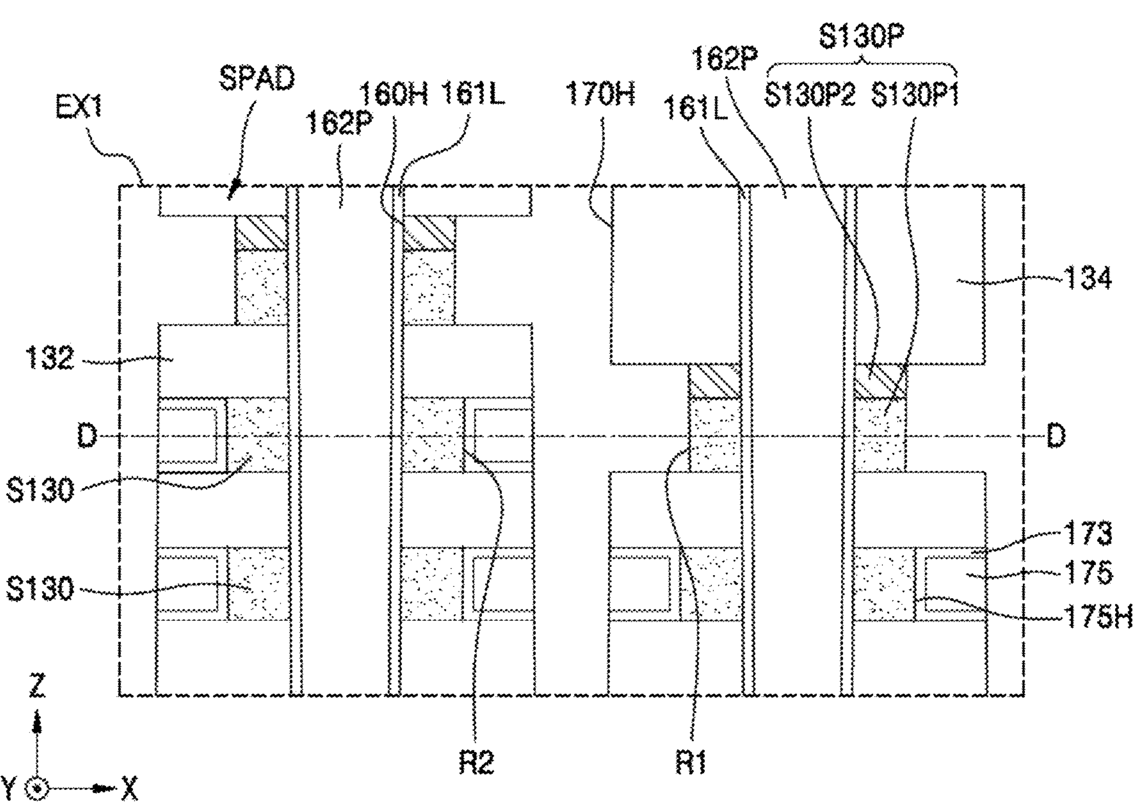
Figure 24B:
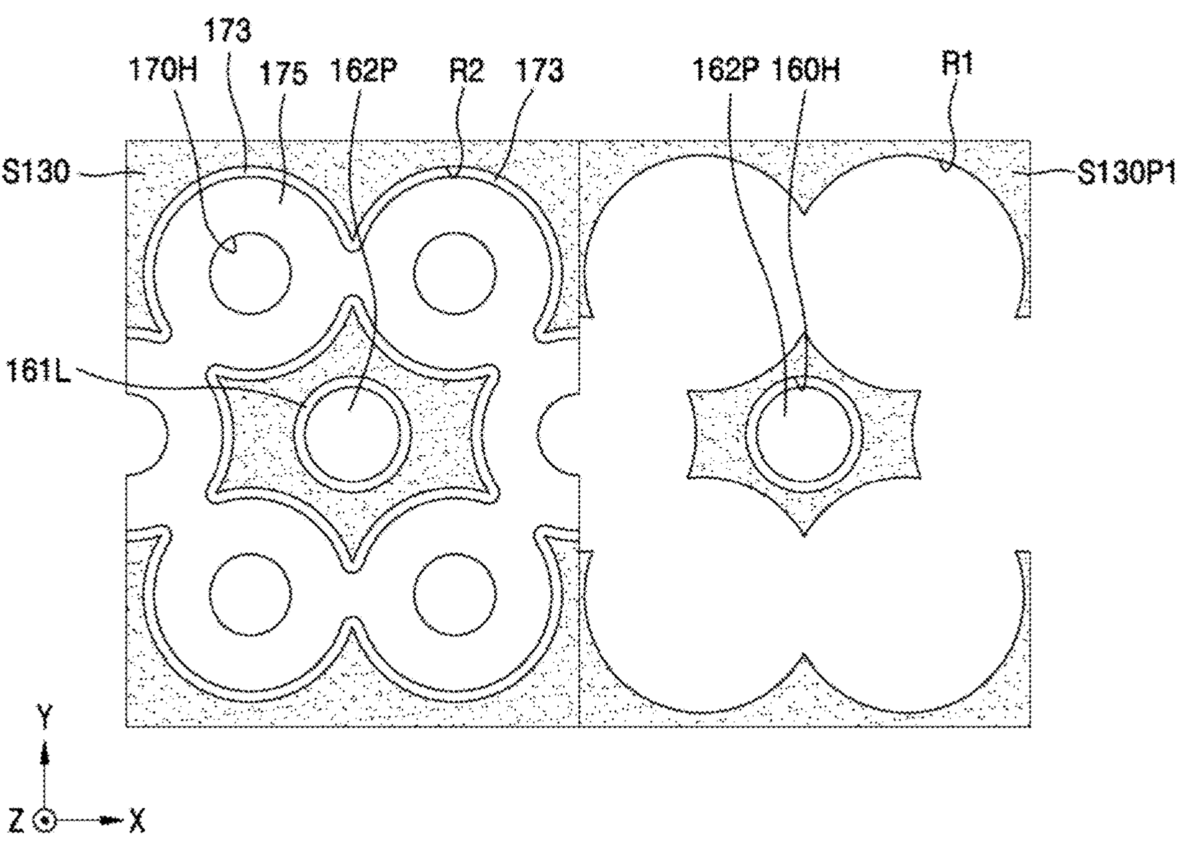

Referring to FIGS. 24A and 24B together, the dam structure 175 and the oxide liner 173 may be formed. In example embodiments, portions of the third liner 173L and the pre-dam liner P175 on the inner walls of the first hole 170H and the first recess portion R1 may be removed. Through the above process, the inner wall of the first hole 170H and the preliminary pad portion S130P may be exposed again. Through the above process, the oxide liner 173 on the inner wall of the second recess portion R2 and the dam structure 175 filling the second recess portion R2 on the oxide liner 173 may remain. The second recess portion R2 may form the second hole 175H in which the dam structure 175 is located.

Figure 25A:
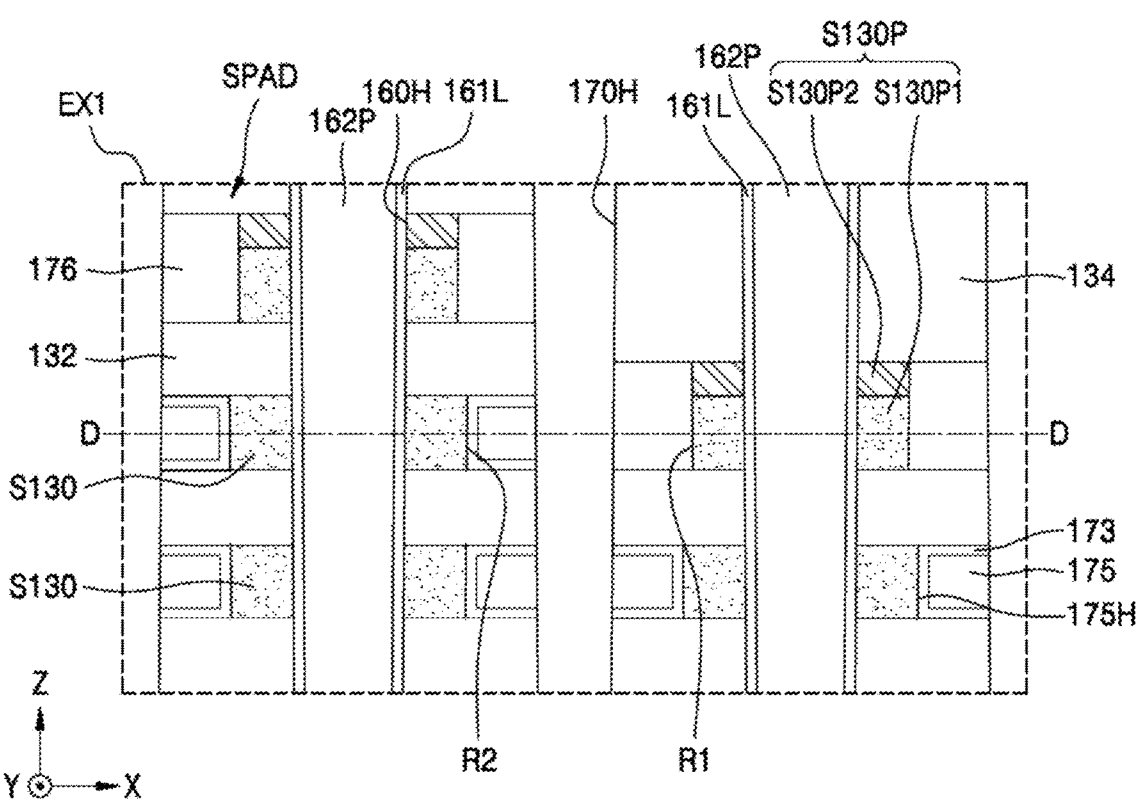
Figure 25B:
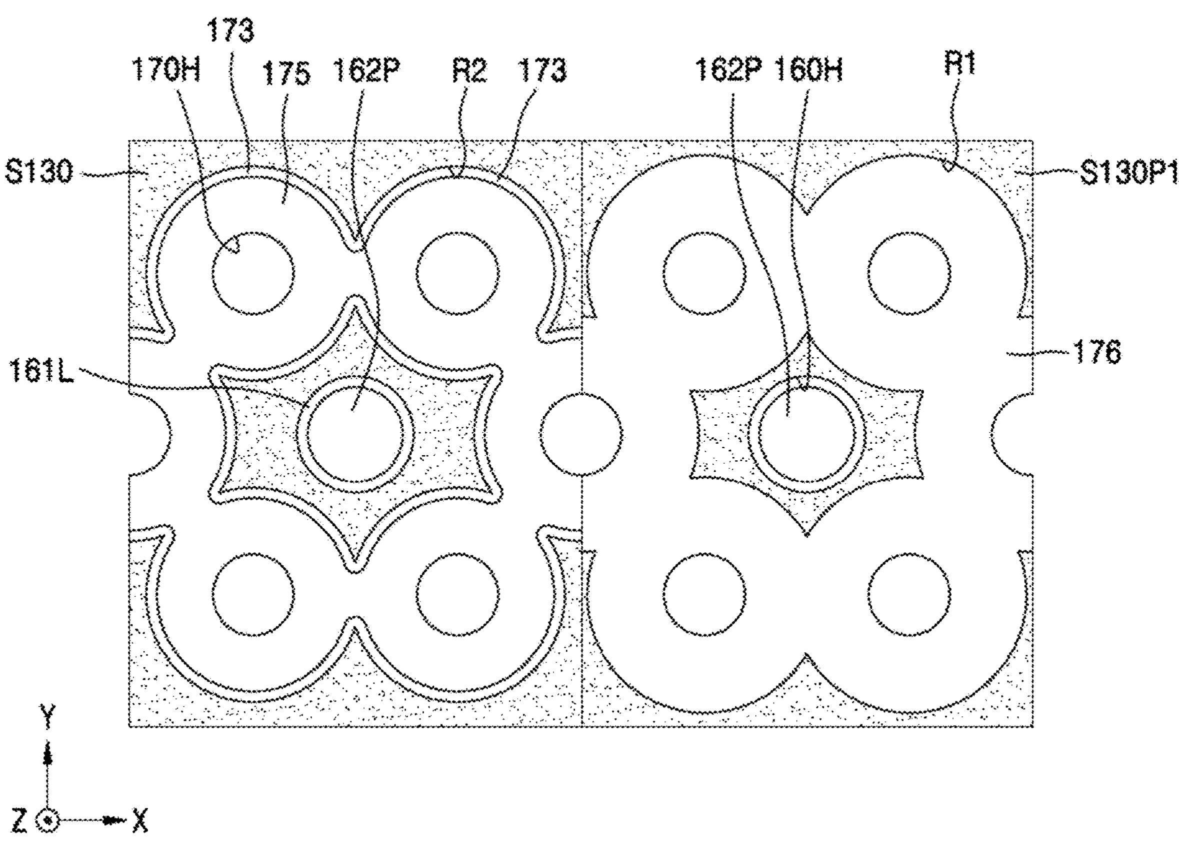

Referring to FIGS. 25A and 25B together, a sacrificial structure 176 filling the first recess portion R1 may be formed. For example, the sacrificial structure 176 may be formed on the inner walls of the first hole 170H and the first recess portion R1 and may be formed by applying a sacrificial liner (not shown) completely filling the first recess portion R1 and subsequently removing a portion of the sacrificial liner on the inner wall of the first hole 170H. The sacrificial structure 176 may include silicon nitride.

Figure 26A:
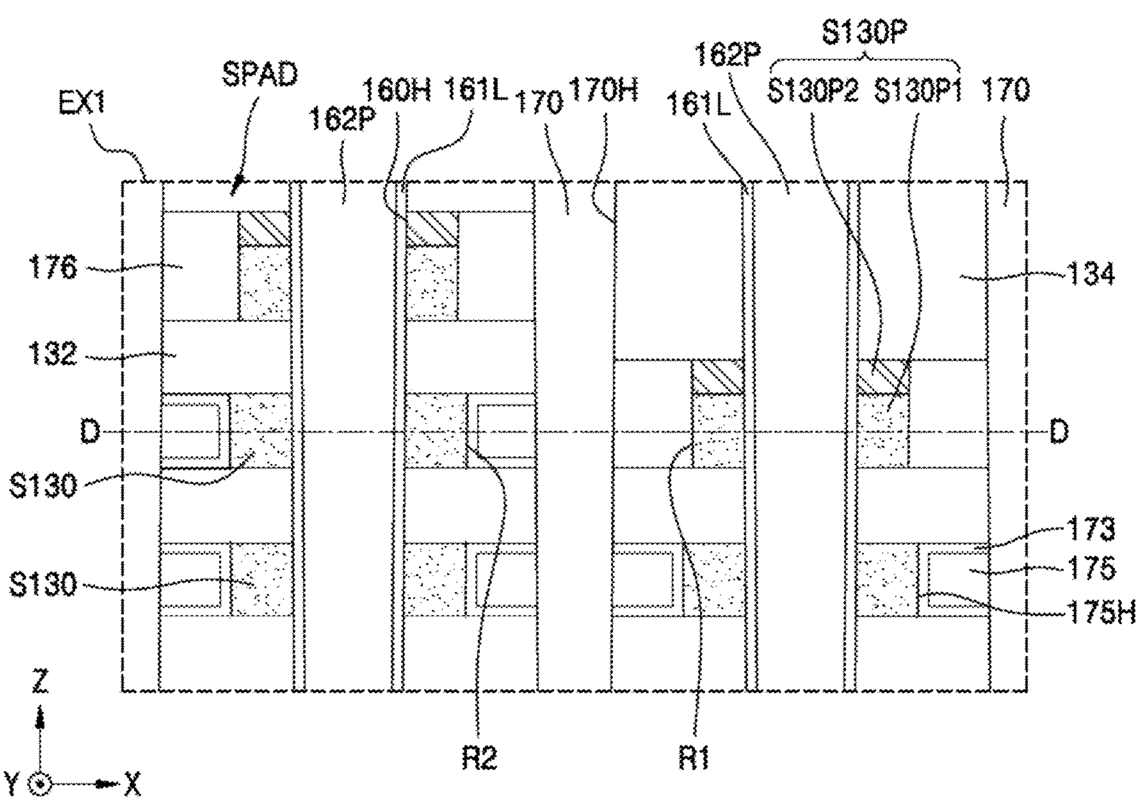
Figure 26B:
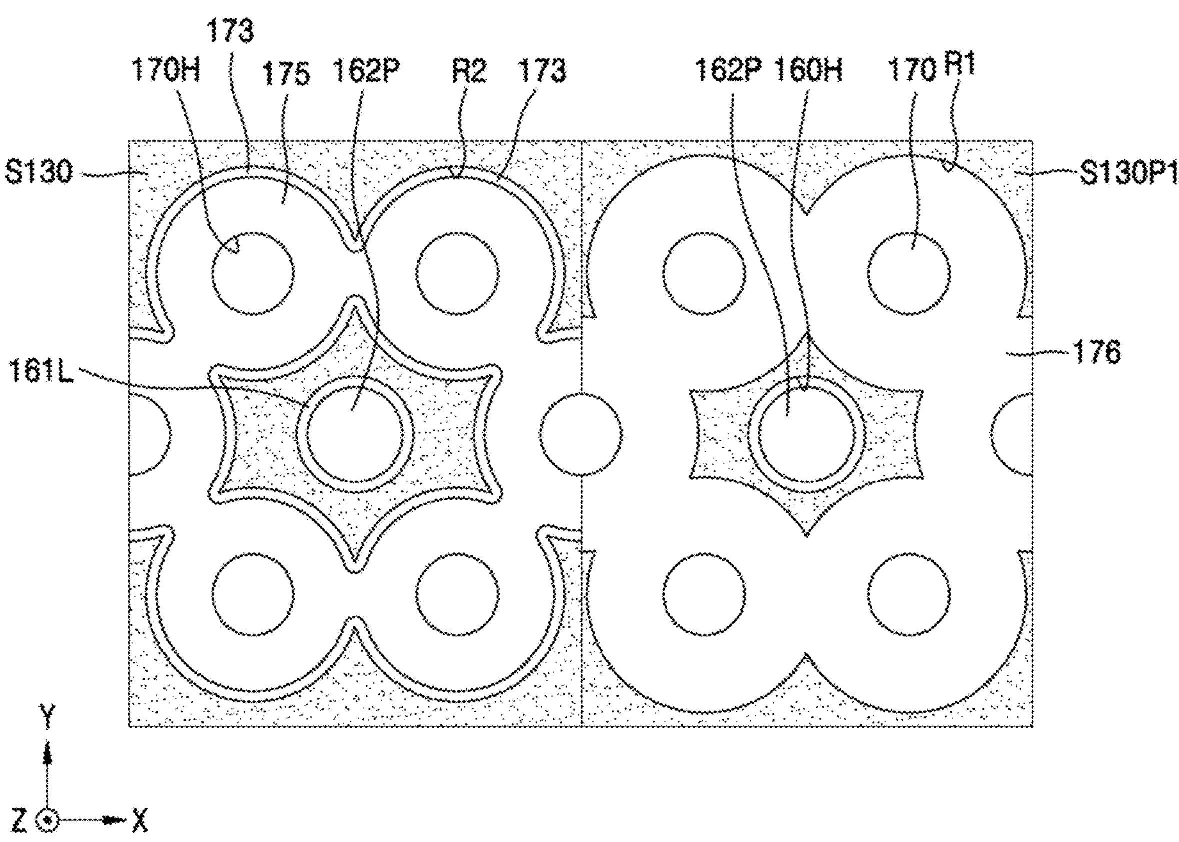

Referring to FIGS. 26A and 26B together, the support structure 170 may be formed in the first hole 170H. To form the support structure 170, the first hole 170H may be filled with silicon oxide.

Figure 27A:
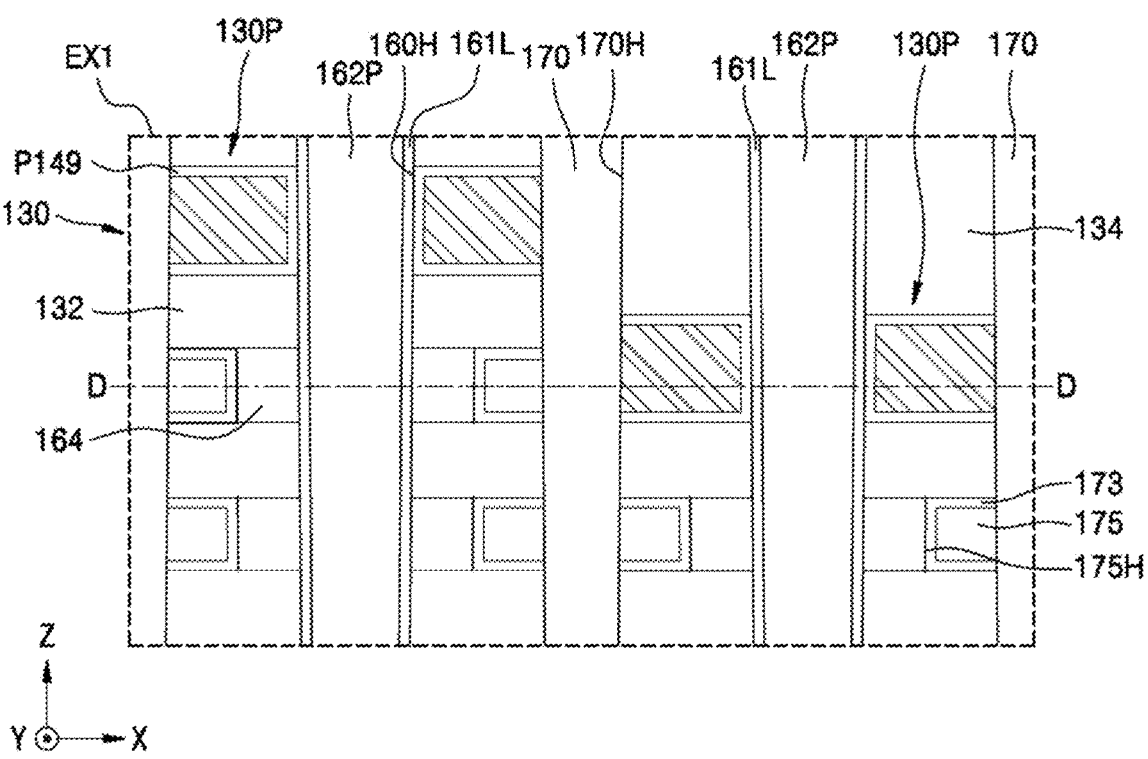
Figure 27B:
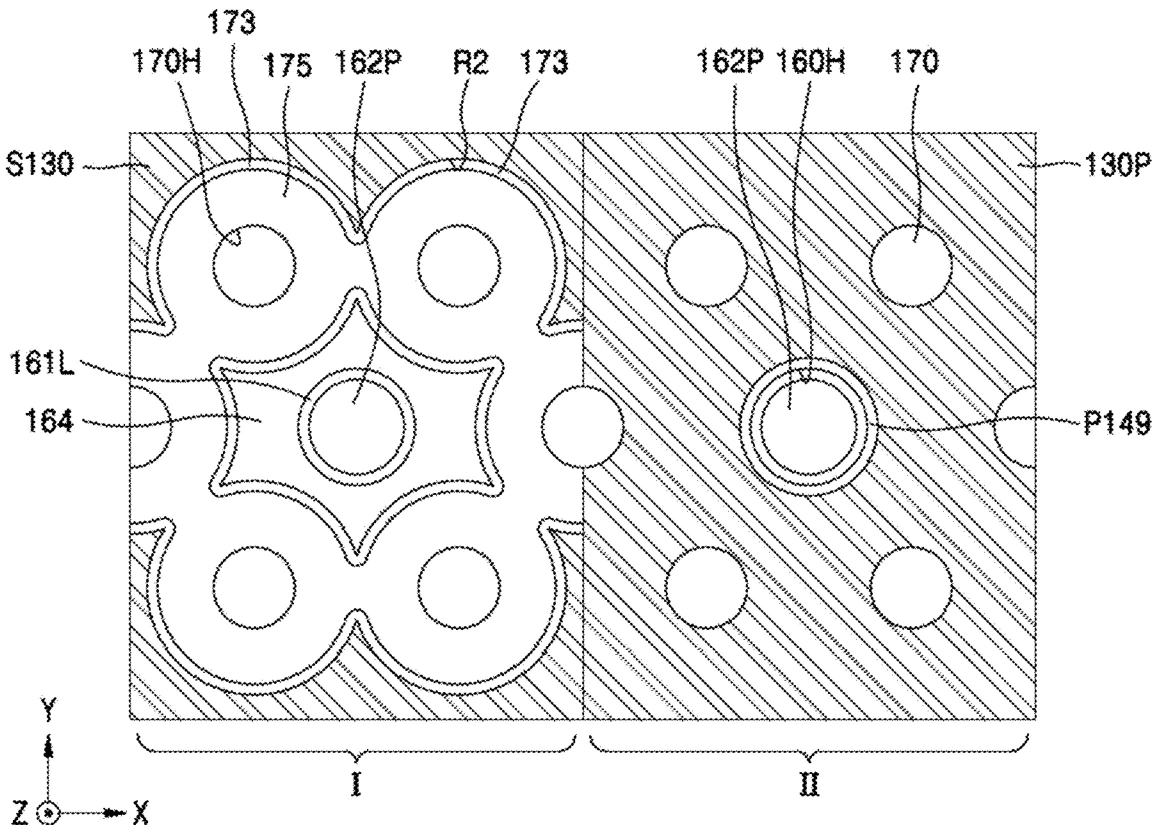

Referring to FIGS. 27A and 27B together, the preliminary pad portions S130P may be removed, and a pre-dielectric liner P149 and the gate electrode 130 may be sequentially formed.

For example, the sacrificial layer S130 passing through the vertical level taken along line D-D of FIG. 27A may be removed. In example embodiments, the dam structure 175 including silicon oxide may not be formed in a first region I of the sacrificial layer S130 passing through the vertical level taken along line D-D of FIG. 27A, and the preliminary pad portion S130P including silicon nitride and the sacrificial structure 176 may be removed. In example embodiments, the dam structure 175 including silicon oxide may be formed in a second region II of the sacrificial layer S130 and a portion of the sacrificial layer S130 surrounding the dam structure 175 may be removed, while a portion of the sacrificial layer S130 between the dam structure 175 and the cell contact hole 160H may not be removed. The portion of the sacrificial layer S130 that is not removed between the dam structure 175 and the cell contact hole 160H may constitute the insulating ring 164.

In some embodiments, the process of removing a portion of the sacrificial layer S130 and the sacrificial structure 176 may be an etching process using an etchant including phosphoric acid ($HPO_3$).

Subsequently, a pre-dielectric liner P149 may be conformally formed on the upper and lower surfaces of the mold insulating layer 132 exposed as a portion of the sacrificial layer S130 is removed and on an outer wall of the cell contact hole 160H. Next, a conductive material may be applied on the pre-dielectric liner P149 to form the gate electrode 130.

Figure 28A:
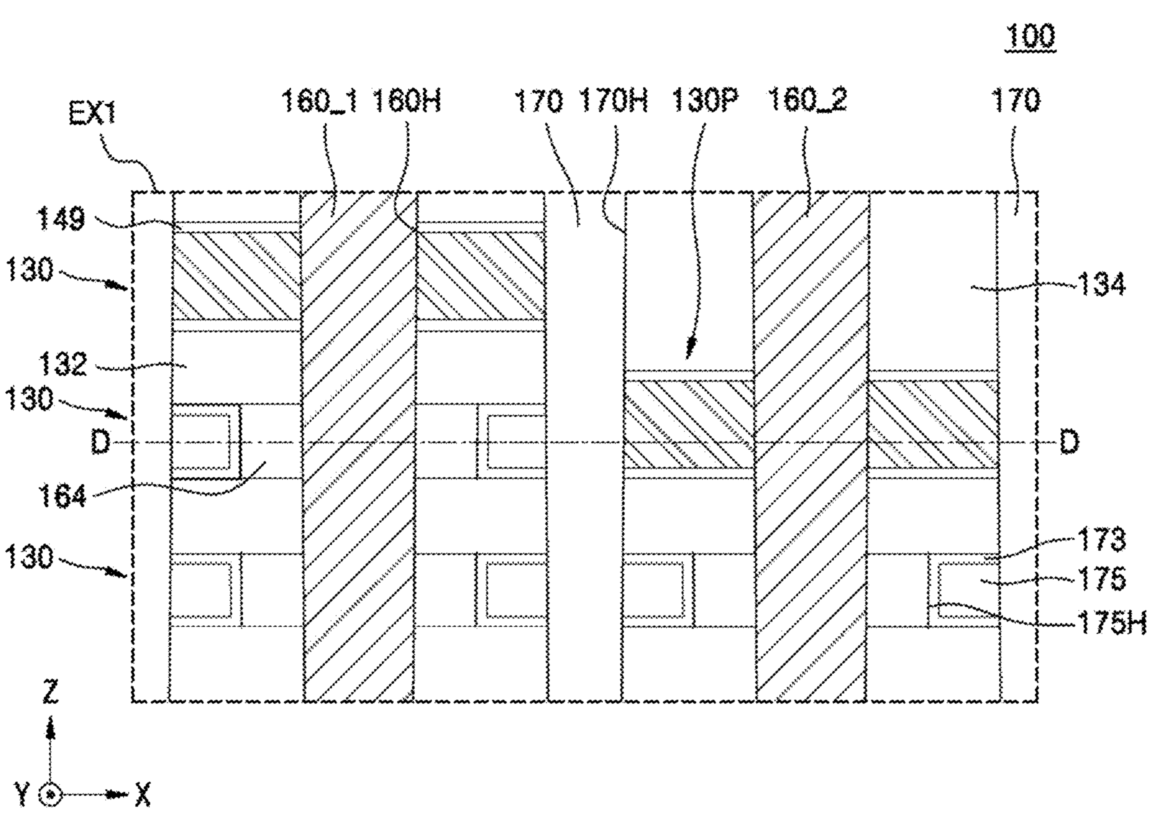
Figure 28B:
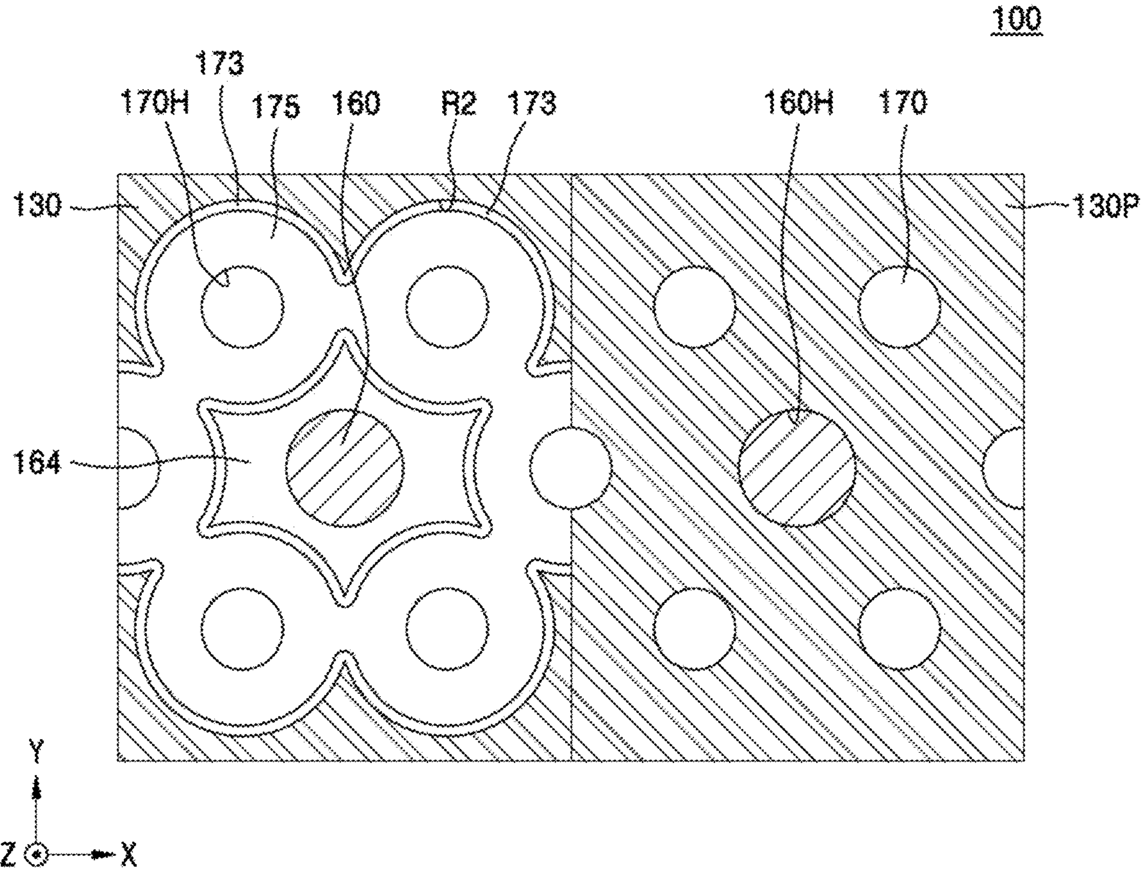

Referring to FIGS. 28A and 28B together, the cell contact 160 may be formed in the cell contact hole 160H. In example embodiments, a mask pattern (not shown) exposing the cell contact hole 160H may be formed, and the first buried sacrificial layer 162P and the first liner 161L may be sequentially removed. Subsequently, a portion of the pre-dielectric liner P149 exposed by the cell contact hole 160H may be removed to expose the gate electrode 130. Subsequently, the cell contact hole 160H may be filled with a conductive material to form the cell contact 160. The cell contact 160 may be electrically connected to the gate electrode 130 exposed by removing a portion of the pre-dielectric liner P149.

In some other embodiments, unlike that shown in FIGS. 23A and 23B, the pre-dam liner P175 may not completely fill the second recess portion R2. In this case, the other portion of the second recess portion R2 may be filled with the sacrificial liner (refer to the description of FIGS. 25A and 25B). A nonvolatile memory device 101 (refer to FIG. 10) including the subring 174 may be manufactured through the above process.

In some other embodiments, unlike that illustrated in FIGS. 25A and 25B, the sacrificial liner may not completely fill the first recess portion R1. In this case, the other portion of the first recess portion R1 may be filled by a subsequent process of filling the first hole 170H with silicon oxide. Accordingly, the nonvolatile memory device 101A including the support structure 170A having the protrusions 170P_1 and 170P_2 may be manufactured.

According to the method of manufacturing the nonvolatile memory device 100 according to embodiments described above with reference to FIGS. 13 to 16 and FIGS. 17A to 28B, the nonvolatile memory device 100 including the dam structure 175 may be manufactured. In detail, in the process of removing the preliminary pad portion S130P (refer to FIGS. 27A and 27B), removal of a portion of the sacrificial layer S130 between the dam structure 175 and the cell contact hole 160H may be limited or prevented by the dam structure 175. For example, the insulation ring 164 insulating an electrical connection between the first cell contact 160_1 and the second gate electrode 130_2 may be formed by the dam structure 175. In detail, in the process of forming the gate electrode 130 by applying a conductive material (refer to FIGS. 27A and 27B), the dam structure 175 may surround the cell contact 160. For example, the first cell contact 1601 may be limited or prevented from being electrically connected to the second gate electrode 1302 by the dam structure 175 surrounding the first cell contact 160_1.

That is, according to the method of manufacturing the nonvolatile memory device 100 according to the embodiments described above with reference to FIGS. 13 to 16 and FIGS. 17A to 28B, the method of manufacturing the nonvolatile memory device 100 having improved performance and reliability may be provided.

Figure 29:
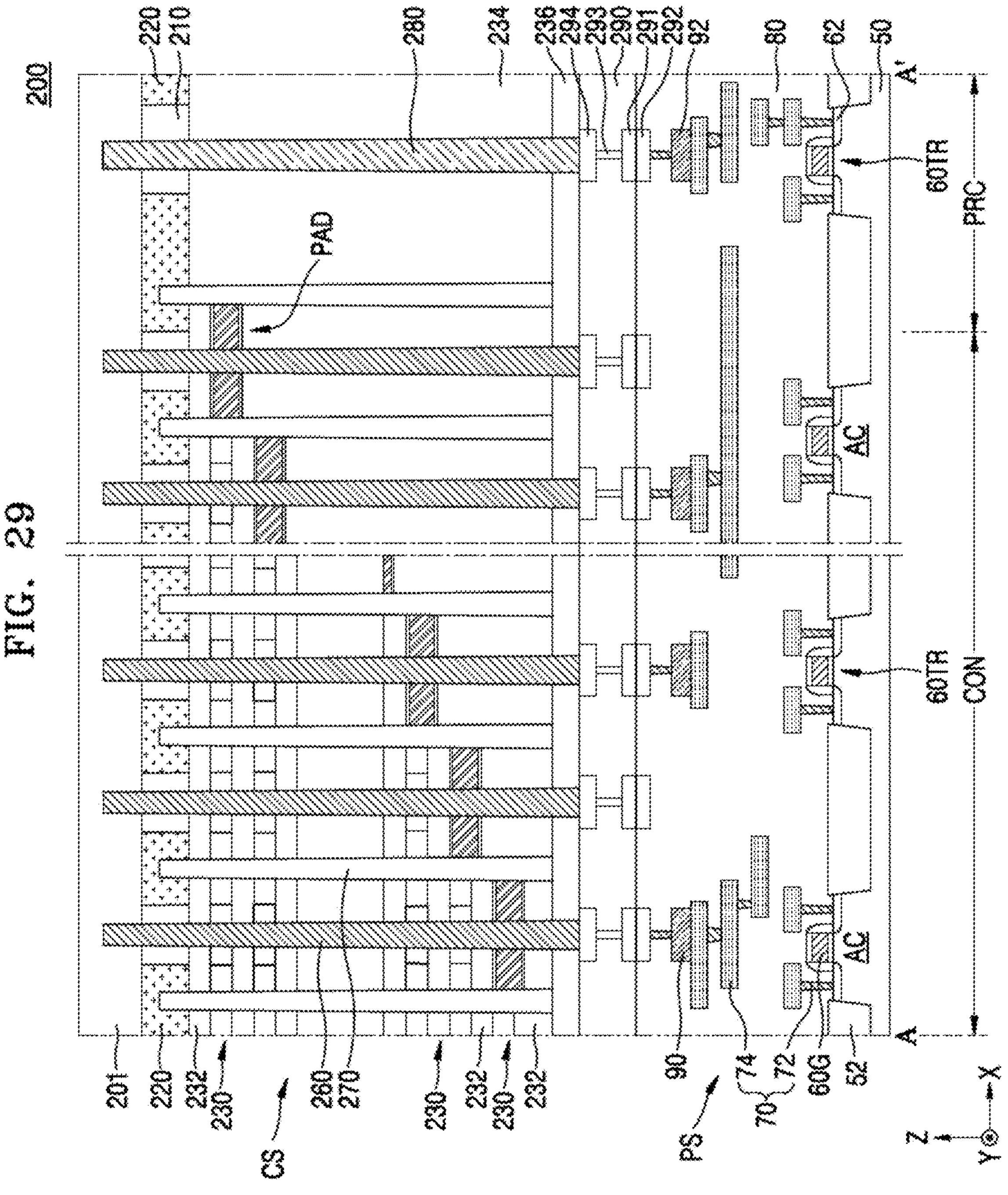
FIG. 29 is a cross-sectional view illustrating a nonvolatile memory device according to example embodiments.

FIG. 29 is a cross-sectional view illustrating a nonvolatile memory device 200 according to embodiments.

Referring to FIG. 29, the nonvolatile memory device 200 may have a chip-to-chip (C2C) structure. The C2C structure refers to a structure formed by fabricating an upper chip including a cell array structure CS on a first wafer, fabricating a lower chip including a peripheral circuit structure PS on a second wafer, different from the first wafer, and subsequently connecting the upper chip to the lower chip by a bonding method.

For example, the bonding method may refer to a method of electrically connecting a first bonding metal 291 formed on the uppermost metal layer of the upper chip to a second bonding metal 292 formed on the uppermost metal layer of the lower chip. For example, when the first bonding metal 291 and the second bonding metal 292 include copper (Cu), the bonding method may be a Cu—Cu bonding method. However, this is only an example, and the first bonding metal 291 and the second bonding metal 292 may include various other metals, such as aluminum (Al) or tungsten (W).

As the first bonding metal 291 is connected to the second bonding metal 292, a cell array interconnection structure 294 may be connected to the peripheral circuit interconnection structure 70. For example, the first bonding metal 291 may be connected to the cell array interconnection structure 294 through an interconnection contact 293. Through this, the gate electrodes 230 and the common source plate 210 may be electrically connected to the peripheral circuit structure PS.

Figure 30:
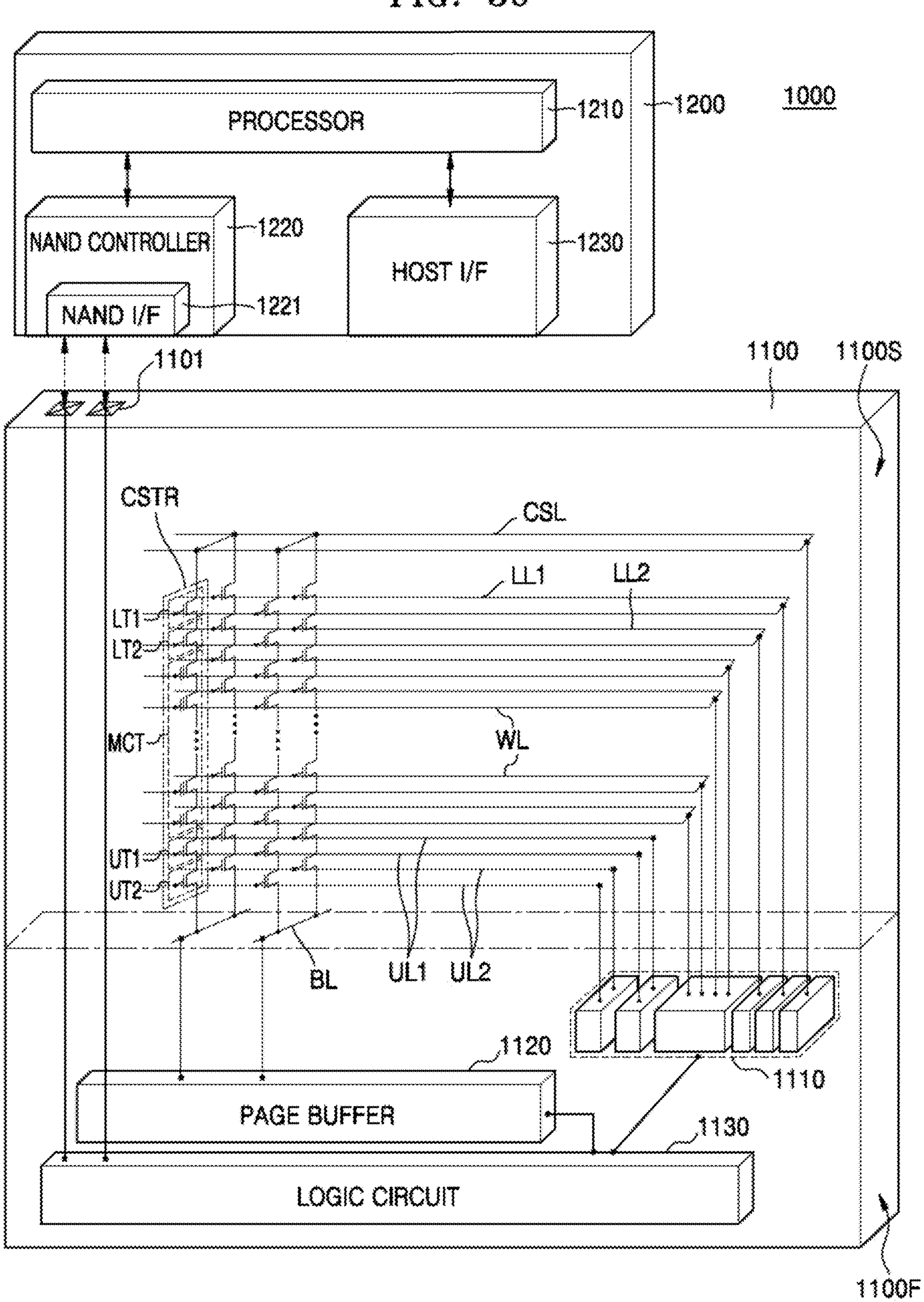
FIG. 30 is a diagram schematically illustrating a data storage system including a nonvolatile memory device according to example embodiments.

FIG. 30 is a diagram schematically illustrating a data storage system 1000 including a nonvolatile memory device according to example embodiments of the inventive concepts.

Referring to FIG. 30, the data storage system 1000 may include at least one nonvolatile memory device 1100 and a memory controller 1200 electrically connected to the nonvolatile memory device 1100. The data storage system 1000 may be, for example, a solid state drive (SSD) device including at least one nonvolatile memory device 1100, a universal serial bus (USB), a computing system, a medical device, or a communication device.

The at least one nonvolatile memory device 1100 may be a nonvolatile memory device. For example, the nonvolatile memory device 1100 may be a NAND flash nonvolatile memory device including one of the nonvolatile memory devices 100, 101, 101A, and 102 described above with reference to FIGS. 1 to 12. The at least one nonvolatile memory device 1100 may include a first structure 1100F and a second structure 1100S on the first structure 1100F. The first structure 1100F may be a peripheral circuit structure including a row decoder 1110, a page buffer 1120, and a logic circuit 1130.

The second structure 1100S may be a memory cell structure including a bit line BL, a common source line CSL, a plurality of word lines WL, first and second string select lines UL1 and UL2, first and second ground select lines LL1 and LL2, and a plurality of memory cell strings CSTR between the bit line BL and the common source line CSL.

In the second structure 1100S, the memory cell strings CSTR may each include ground select transistors LT1 and LT2 adjacent to the common source line CSL, string select transistors UT1 and UT2 adjacent to the bit line BL, and a plurality of memory cell transistors MCT located between the ground select transistors LT1 and LT2 and the string select transistors UT1 and UT2. The number of ground select transistors LT1 and LT2 and the number of string select transistors UT1 and UT2 may be variously modified according to embodiments.

In embodiments, the ground select lines LL1 and LL2 may be connected to gate electrodes of the ground select transistors LT1 and LT2, respectively. The word lines WL may be connected to respective gate electrodes of the memory cell transistor MCTs. The string select lines UL1 and UL2 may be connected to gate electrodes of the string select transistors UT1 and UT2, respectively.

The common source line CSL, the ground select lines LL1 and LL2, the word lines WL, and the string select lines UL1 and UL2 may be connected to the row decoder 1110. The bit lines BL may be electrically connected to the page buffer 1120.

The nonvolatile memory device 1100 may communicate with the memory controller 1200 through an I/O pad 1101 electrically connected to a logic circuit 1130. The I/O pad 1101 may be electrically connected to the logic circuit 1130.

The memory controller 1200 may include a processor 1210, a NAND controller 1220, and a host interface 1230. In some embodiments, the data storage system 1000 may include a plurality of nonvolatile memory devices 1100, and in this case, the memory controller 1200 may control the nonvolatile memory devices 1100.

The processor 1210 may control overall operations of the data storage system 1000 including the memory controller 1200. The processor 1210 may operate according to certain firmware and may access the nonvolatile memory device 1100 by controlling the NAND controller 1220. The NAND controller 1220 may include a NAND interface 1221 that processes communication with the nonvolatile memory device 1100. Through the NAND interface 1221, a control command for controlling the nonvolatile memory device 1100, data to be written to the memory cell transistors MCT of the nonvolatile memory device 1100, and data to be read from the memory cell transistors MCT of the nonvolatile memory device 1100 may be transmitted. The host I/F 1230 may provide a communication function between the data storage system 1000 and an external host. When a control command is received from an external host through the host I/F 1230, the processor 1210 may control the nonvolatile memory device 1100 in response to the control command.

Figure 31:
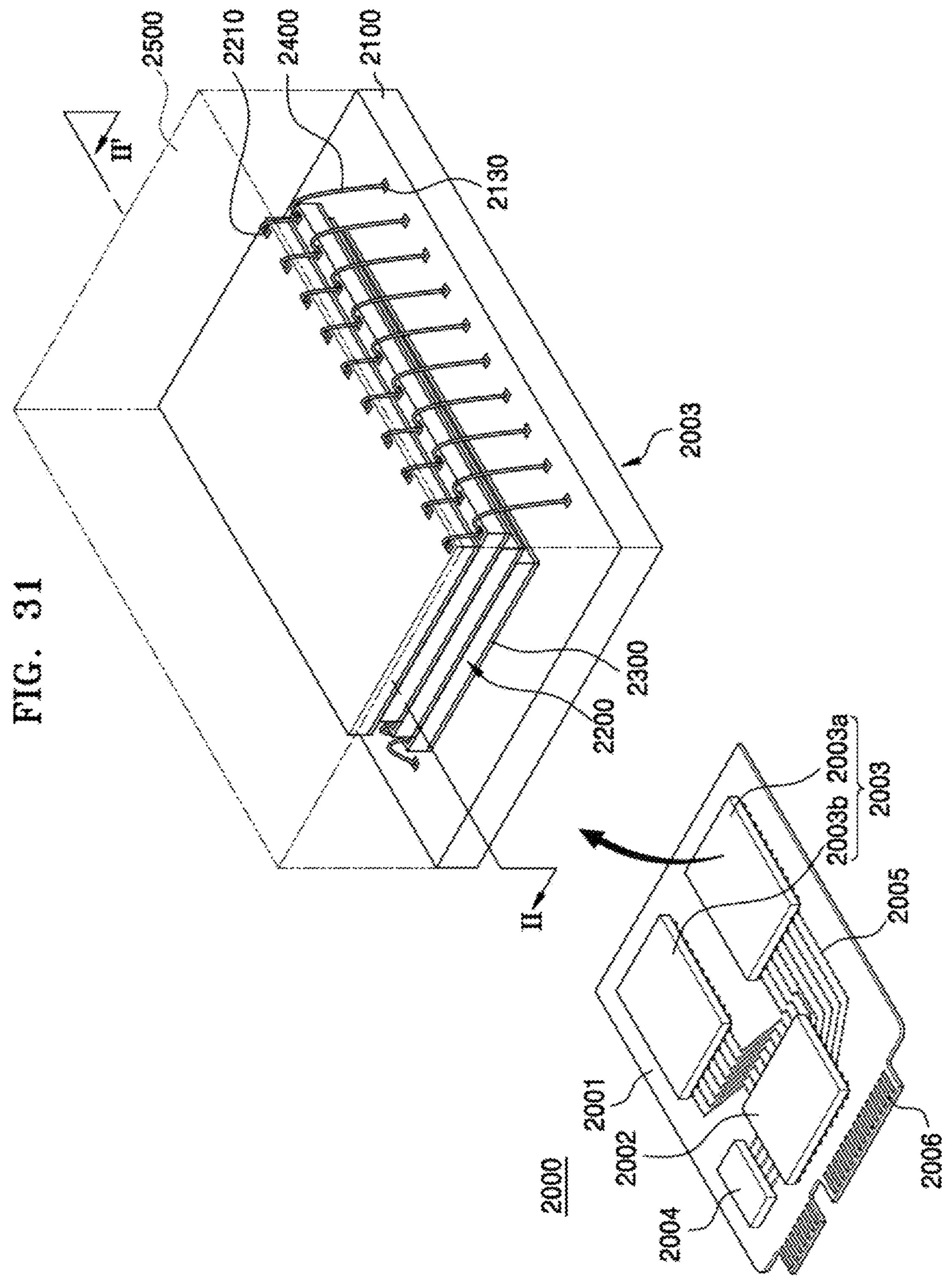
FIG. 31 is a perspective view schematically illustrating a data storage system including a nonvolatile memory device according to example embodiments.

FIG. 31 is a perspective view schematically illustrating a data storage system 2000 including a nonvolatile memory device according to example embodiments of the inventive concepts.

Referring to FIG. 31, the data storage system 2000 according to example embodiments may include a main substrate 2001, a memory controller 2002 mounted on the main substrate 2001, one or more semiconductor packages 2003, and a DRAM 2004. The semiconductor package 2003 and the DRAM 2004 may be connected to the memory controller 2002 by a plurality of interconnection patterns 2005 formed on the main substrate 2001.

The main substrate 2001 may include a connector 2006 including a plurality of pins coupled to an external host. The number and arrangement of the pins of the connector 2006 may vary depending on a communication interface between the data storage system 2000 and the external host. In embodiments, the data storage system 2000 may communicate with an external host according to any one of interfaces such as a universal serial bus (USB), a peripheral component interconnect express (PCI-Express), a serial advanced technology attachment (SATA), M-Phy for a universal flash storage (UFS), etc. In embodiments, the data storage system 2000 may operate by power supplied from an external host through the connector 2006. The data storage system 2000 may further include a power management integrated circuit (PMIC) for distributing power supplied from the external host to the memory controller 2002 and the semiconductor package 2003.

The memory controller 2002 may write data to or read data from the semiconductor package 2003, and may improve an operating speed of the data storage system 2000.

The DRAM 2004 may be a buffer memory for mitigating a speed difference between the semiconductor package 2003 as a data storage space and the external host. The DRAM 2004 included in the data storage system 2000 may also operate as a kind of cache memory, and may provide a space for temporarily storing data in a control operation for the semiconductor package 2003. When the DRAM 2004 is included in the data storage system 2000, the memory controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, a plurality of semiconductor chips 2200 on the package substrate 2100, an adhesive layer 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a PCB including a plurality of package upper pads 2130. Each of the semiconductor chips 2200 may include an I/O pad 2210. The I/O pad 2210 may correspond to the I/O pad 1101 of FIG. 29. Each of the semiconductor chips 2200 may include at least one of the nonvolatile memory devices 100, 101, 101A, and 102 described above with reference to FIGS. 1 to 12.

In embodiments, the connection structure 2400 may be a bonding wire electrically connecting the I/O pad 2210 to the package upper pad 2130. Accordingly, in the first and second semiconductor packages 2003*a* and 2003*b*, the semiconductor chips 2200 may be electrically connected to each other by a bonding wire method, and may be electrically connected to the package upper pad 2130 of the package substrate 2100. In embodiments, in the first and second semiconductor packages 2003*a* and 2003*b*, the semiconductor chips 2200 may be electrically connected to each other by a connection structure including a through-silicon via (TSV), instead of the bonding wire type connection structures 2400.

In embodiments, the memory controller 2002 and the semiconductor chips 2200 may be included in a single package. In example embodiments, the memory controller 2002 and the semiconductor chips 2200 may be mounted on a separate interposer substrate, different from the main substrate 2001, and the memory controller 2002 may be connected to the semiconductor chips 2200 by an interconnection formed on the interposer substrate.

Figure 32:
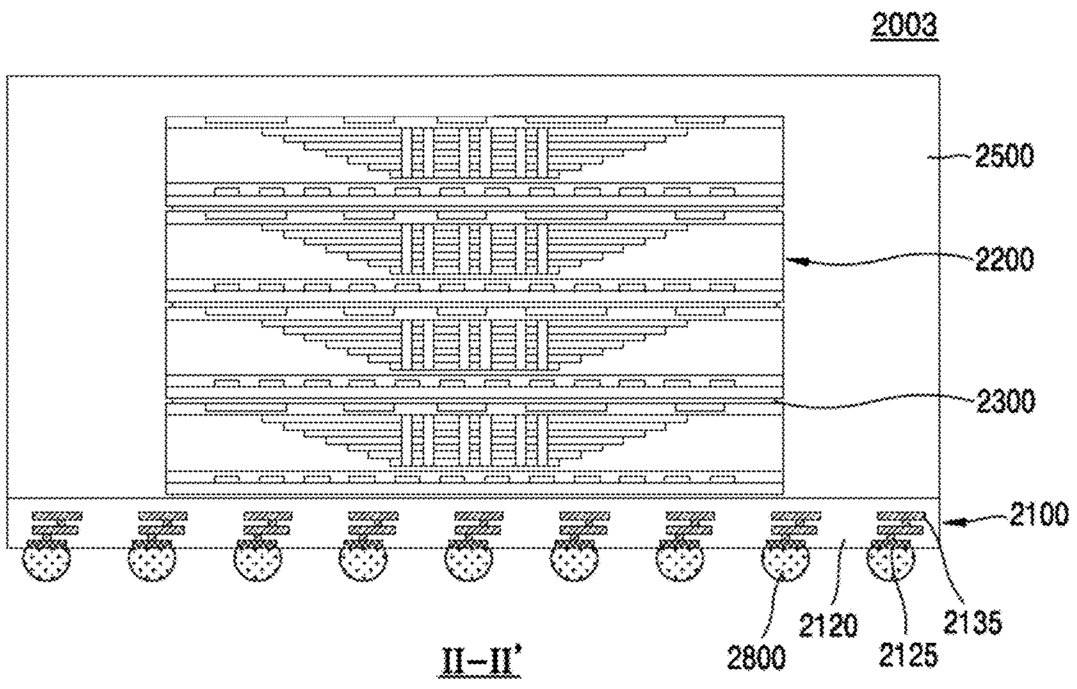
FIG. 32 is a schematic cross-sectional view of semiconductor packages according to example embodiments.

FIG. 32 is a schematic cross-sectional view of semiconductor packages according to example embodiments of the inventive concepts. In detail, FIG. 32 is a cross-sectional view taken along line II-II' of FIG. 31.

Referring to FIG. 32, in the semiconductor package 2003, the package substrate 2100 may be a printed circuit substrate. The package substrate 2100 may include a package substrate body portion 2120, a plurality of package upper pads 2130 (refer to FIG. 26) disposed on an upper surface of the package substrate body portion 2120, a plurality of lower pads 2125 disposed on a lower surface of the package substrate body portion 2120 or exposed through the lower surface of the package substrate body portion 2120, and a plurality of internal interconnections 2135 electrically connecting the package upper pads 2130 (refer to FIG. 31) to the lower pads 2125 in the package substrate body portion 2120. As shown in FIG. 31, the package upper pads 2130 may be electrically connected to the connection structures 2400. As shown in FIG. 32, the lower pads 2125 may be connected to the interconnection patterns 2005 on the main substrate 2001 of the data storage system 2000 shown in FIG. 31 through a plurality of conductive bumps 2800. Each of the semiconductor chips 2200 may include at least one of the nonvolatile memory devices 100, 101, 101A, and 102 described above with reference to FIGS. 1 to 12.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, an application-specific integrated circuit (ASIC), etc.

While the inventive concepts have been particularly shown and described with reference to example embodiments thereof, it will be understood that various changes in form and details may be made therein without departing from the spirit and scope of the following claims.

What is claimed is:

1. A nonvolatile memory device comprising:

a substrate including a memory cell region and a connection region;

a mold structure including a plurality of gate electrodes sequentially stacked in the memory cell region and stacked stepwise in the connection region, and a plurality of mold insulating layers alternately stacked with the plurality of gate electrodes;

a channel structure passing through the mold structure in the memory cell region and through the plurality of gate electrodes;

a first cell contact passing through the mold structure in the connection region, connected to a first gate electrode among the plurality of gate electrodes and electrically disconnected from a second gate electrode among the plurality of gate electrodes;

a plurality of support structures surrounding the first cell contact planarly in the connection region and respectively in a plurality of first holes passing through the mold structure; and a dam structure between the first cell contact and the second gate electrode in the connection region and apart from the first cell contact with an insulating ring therebetween, wherein the dam structure is in a plurality of second holes each having a diameter larger than a diameter of each of the plurality of first holes, and the plurality of first holes respectively pass through the plurality of second holes.

2. The nonvolatile memory device of claim 1, wherein the dam structure includes a plurality of subdams surrounding the first cell contact in a plan view and contacting each other, and the plurality of subdams are respectively in each of the plurality of second holes.

3. The nonvolatile memory device of claim 2, wherein the plurality of subdams have a shape surrounding the plurality of support structures planarly.

4. The nonvolatile memory device of claim 1, wherein the dam structure is in contact with the plurality of support structures.

5. The nonvolatile memory device of claim 1, further comprising a subring between the dam structure and the plurality of support structures and surrounding each of the plurality of support structures planarly.

6. The nonvolatile memory device of claim 1, further comprising:

a second cell contact connected to the second gate electrode and electrically disconnected from a third gate electrode among the plurality of gate electrodes, wherein the plurality of support structures include a first support structure between the first cell contact and the second cell contact, the dam structure includes a first subdam between the first support structure and the first cell contact at a same vertical level as a vertical level of the second gate electrode, and the first subdam has a shape surrounding a half of the first support structure adjacent to the first cell contact.

7. The nonvolatile memory device of claim 1, wherein the first gate electrode includes a first extension portion extending in a horizontal direction and a first pad portion connecting the first extension portion to the first cell contact, a vertical thickness of the first pad portion is greater than a vertical thickness of the first extension portion, and the vertical thickness of the first pad portion is greater than a vertical thickness of the dam structure.

8. A nonvolatile memory device comprising:

a substrate including a memory cell region and a connection region;

a peripheral circuit element on the substrate;

a mold structure including a plurality of gate electrodes sequentially stacked in the memory cell region and stacked stepwise in the connection region, and a plurality of mold insulating layers alternately stacked with the plurality of gate electrodes;

a channel structure passing through the mold structure in the memory cell region and through the plurality of gate electrodes;

a first cell contact passing through the mold structure in the connection region, connected to a first gate electrode among the plurality of gate electrodes and electrically disconnected from a second gate electrode among the plurality of gate electrodes;

a plurality of support structures surrounding the first cell contact planarly in the connection region and respectively in a plurality of first holes passing through the mold structure; and a dam structure between the first cell contact and the second gate electrode in the connection region and apart from the first cell contact with an insulating ring therebetween, wherein the dam structure is in a plurality of second holes each having diameters larger than diameters of each of the plurality of first holes, and each penetrated by respective ones of the plurality of first holes.

9. The nonvolatile memory device of claim 8, wherein the dam structure includes a plurality of subdams overlapping the second gate electrode in a horizontal direction, surrounding the first cell contact in a plan view, and contacting each other, and the plurality of subdams are located in the plurality of second holes, respectively.

10. The nonvolatile memory device of claim 9, wherein each of the plurality of subdams have a donut shape surrounding respective ones of the plurality of support structures planarly.

11. The nonvolatile memory device of claim 8, wherein the insulating ring has a shape that surrounds the first cell contact planarly, and the dam structure has a shape surrounding the insulating ring planarly.

12. The nonvolatile memory device of claim 8, wherein the dam structure is in contact with the plurality of support structures.

13. The nonvolatile memory device of claim 8, wherein a vertical thickness of the dam structure is equal to or smaller than a vertical thickness of the second gate electrode.

14. An electronic system comprising:

a main substrate;

a nonvolatile memory device on the main substrate; and a controller electrically connected to the nonvolatile memory device on the main substrate, wherein the nonvolatile memory device includes a substrate including a memory cell region and a connection region, a mold structure including a plurality of gate electrodes sequentially stacked in the memory cell region and stacked stepwise in the connection region, and a plurality of mold insulating layers alternately stacked with the plurality of gate electrodes, a channel structure passing through the mold structure in the memory cell region and through the plurality of gate electrodes, a first cell contact passing through the mold structure in the connection region, connected to a first gate electrode among the plurality of gate electrodes and electrically disconnected from a second gate electrode among the plurality of gate electrodes;

a plurality of support structures surrounding the first cell contact planarly in the connection region and respectively in a plurality of first holes passing through the mold structure, and a first dam structure between the first cell contact and the second gate electrode in the connection region and apart from the first cell contact with an insulating ring therebetween, wherein the first dam structure is in a plurality of second holes each having diameters larger than diameters of each of the plurality of first holes and respectively penetrated by the plurality of first holes.

15. The electronic system of claim 14, further comprising:

a second cell contact connected to the second gate electrode and electrically disconnected from a third gate electrode among the plurality of gate electrodes in the connection region; and a second dam structure located between the second cell contact and the third gate electrode in the connection region.

16. The electronic system of claim 15, wherein the plurality of support structures include a first support structure between the first cell contact and the second cell contact, the first dam structure includes a first subdam between the first support structure and the first cell contact at a same vertical level as a vertical level of the second gate electrode, and the first subdam has a shape surrounding a half of the first support structure adjacent to the first cell contact.

17. The electronic system of claim 15, wherein the first cell contact is electrically disconnected from the third gate electrode, the electronic system further comprising a third dam structure between the first cell contact and the third gate electrode in the connection region, and the first dam structure and the third dam structure overlap in a vertical direction.

18. The electronic system of claim 14, wherein the first dam structure includes a plurality of subdams surrounding the first cell contact in a plan view and contacting each other, the plurality of subdams are respectively in the plurality of second holes, and the plurality of subdams have donut shape respectively surrounding the plurality of support structures planarly.

19. The electronic system of claim 14, wherein the first gate electrode includes a first extension portion extending in a horizontal direction and a first pad portion connecting the first extension portion to the first cell contact, a vertical thickness of the first pad portion is greater than a vertical thickness of the first extension portion, and the vertical thickness of the first pad portion is greater than a vertical thickness of the first dam structure.

20. The electronic system of claim 19, wherein the vertical thickness of the first dam structure is equal to or less than the vertical thickness of the first extension portion.

* * * * *